(12) United States Patent
Nishi et al.

(10) Patent No.: US 8,866,719 B2
(45) Date of Patent: Oct. 21, 2014

(54) MEMORY DEVICE AND LIQUID CRYSTAL DISPLAY DEVICE EQUIPPED WITH MEMORY DEVICE

(75) Inventors: Shuji Nishi, Osaka (JP); Yuhichiroh Murakami, Osaka (JP); Shige Furuta, Osaka (JP); Yasushi Sasaki, Osaka (JP); Seijirou Gyouten, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 197 days.

(21) Appl. No.: 13/395,549

(22) PCT Filed: May 18, 2010

(86) PCT No.: PCT/JP2010/058382
§ 371 (c)(1),
(2), (4) Date: Mar. 12, 2012

(87) PCT Pub. No.: WO2011/033821
PCT Pub. Date: Mar. 24, 2011

(65) Prior Publication Data
US 2012/0169579 A1 Jul. 5, 2012

(30) Foreign Application Priority Data
Sep. 16, 2009 (JP) ................. 2009-215061

(51) Int. Cl.
*G09G 3/36* (2006.01)
*H01L 27/108* (2006.01)
*G11C 11/406* (2006.01)
*H01L 27/12* (2006.01)

(52) U.S. Cl.
CPC ............ *H01L 27/108* (2013.01); *G09G 3/3648* (2013.01); *G11C 2211/4067* (2013.01); *G09G 3/3659* (2013.01); *G09G 2330/021* (2013.01); *G09G 3/3618* (2013.01); *G09G 2300/0823* (2013.01); *G09G 3/3614* (2013.01); *G09G 2300/0852* (2013.01); *G11C 11/406* (2013.01); *H01L 27/12* (2013.01)
USPC .................. 345/98; 365/129; 345/90; 345/92

(58) Field of Classification Search
CPC ............. G09G 2300/0842; G09G 2300/0847; G09G 2300/0852; G09G 2300/0857
USPC ................... 345/87–104, 204–215
See application file for complete search history.

(56) References Cited

U.S. PATENT DOCUMENTS 7,057,596 B2 * 6/2006 Miyazawa ................ 345/90
(Continued)

FOREIGN PATENT DOCUMENTS

| JP | 2002-207453 A | 7/2002 |
| JP | 2002-229532 A | 8/2002 |
| JP | 2007-034095 A | 2/2007 |

OTHER PUBLICATIONS

International Search Report.

*Primary Examiner* — Alexander Eisen
*Assistant Examiner* — Sanjiv D Patel
(74) *Attorney, Agent, or Firm* — Harness, Dickey & Pierce, P.L.C.

(57) ABSTRACT

A transistor (N1) has a gate terminal connected to a word line (Xi(1)) and a first conduction terminal connected to a bit line (Yj). A transistor (N2) has a gate terminal connected to the word line (Xi(2)) and a first conduction terminal connected to a node (PIX). A transistor (N3) has a gate terminal connected to a node (MRY) and a first conduction terminal connected to the word line (Xi(2)). A transistor (N4) has a gate terminal connected to the word line (Xi(3)), a first conduction terminal connected to a second conduction terminal of the transistor (N3), and a second conduction terminal connected to the node (PIX). Capacitors (Ca1), (Cb1), (Cap1) are formed between the node (PIX) and a reference electric potential wire (RL1), between the node (MRY) and the reference electric potential wire (RL1), and between the first conduction terminal of the transistor (N3) and the node (MRY), respectively.

6 Claims, 26 Drawing Sheets

(56) References Cited

U.S. PATENT DOCUMENTS

| | | | |
|---|---|---|---|
| 7,230,597 B2* | 6/2007 | Edwards et al. | 345/87 |
| 2002/0075205 A1* | 6/2002 | Kimura et al. | 345/55 |
| 2002/0084967 A1 | 7/2002 | Akimoto et al. | |
| 2005/0236650 A1* | 10/2005 | Edwards et al. | 257/203 |
| 2007/0024566 A1 | 2/2007 | Miyazawa et al. | |
| 2013/0038595 A1* | 2/2013 | Yamashita et al. | 345/212 |

* cited by examiner

FIG. 9

| POL | 0 | | 1 | |
|---|---|---|---|---|
| DATA | 0 | 1 | 0 | 1 |
| ELECTRIC POTENTIAL OF BIT LINE | L | H | H | L |

MEMORY DEVICE AND LIQUID CRYSTAL DISPLAY DEVICE EQUIPPED WITH MEMORY DEVICE

TECHNICAL FIELD

The present invention relates to a memory device which is capable of retaining data.

BACKGROUND ART

Liquid crystal display devices include a memory-type liquid crystal display device which carries out a display by temporarily retaining image data written to a pixel and carrying out a refresh operation while reversing polarities of the image data (memory operation mode). Image data is rewritten to new image data in a pixel every one frame via a data signal line in a normal operation (normal operation mode, multi-color display mode) in which multi-color (multi-gradation) display is carried out, whereas image data retained in a pixel memory is used in a memory operation mode. In view of this, it is unnecessary to supply rewriting image data to a data line while the refresh operation is being carried out.

Accordingly, electric power consumption can be reduced since it is possible in the memory operation mode to stop an operation of a circuit which drives a scanning signal line and a data signal line. Electric power consumption can also be reduced by a reduction in number of times of charge and discharge of the data signal line having a large capacity and without the need of transmitting, to a controller, image data corresponding to a memory operation period.

Accordingly, the memory operation mode is frequently used for an image display such as a standby display of a mobile phone, the image display being strongly required to be carried out with lower electric power consumption.

FIG. 24 illustrates only a memory circuit part of each pixel structure of such a memory-type liquid crystal display device. In order to cause the each pixel structure to function also as a pixel of the liquid crystal display device, it is only necessary to assume that a liquid crystal capacitor Clc is added to the each pixel structure (see a broken line in FIG. 24). Such a pixel structure is equivalent to, for example, a pixel structure disclosed in Patent Literature 1.

A memory circuit MR100 serving as the memory circuit part includes a switching circuit SW100, a first data retaining section DS101, a data transfer section TS100, a second data retaining section DS102, and a refresh output control section RS100.

The switching circuit SW100 includes a transistor N100 which is an N-channel TFT. The first data retaining section DS101 includes a capacitor Ca100. The data transfer section TS100 includes a transistor N101 which is an N-channel TFT. The second data retaining section DS102 includes a capacitor Cb100. The refresh output control section RS100 includes an inverter INV100 and a transistor N103 which is an N-channel TFT. The inverter INV100 includes a transistor P100 which is a P-channel TFT and a transistor N102 which is an N-channel TFT.

As signal lines for driving each memory circuit MR100, a data transfer control line DT100, a switch control line SC100, a High voltage supply line PH100, a Low voltage supply line PL100, a refresh output control line RC100, and a capacitor wire CL100 are provided for each row of a pixel matrix, and a data input line IN100 is provided for each column of the pixel matrix.

One and the other of drain/source terminals of a field-effect transistor such as a TFT mentioned above are referred to as a first drain/source terminal and a second drain/source terminal, respectively. Note, however, that the first drain/source terminal and the second drain/source terminal between which a drain terminal and a source terminal are constantly fixed in accordance with a direction in which a current flows are referred to as the drain terminal and the source terminal, respectively. The transistor N100 has a gate terminal which is connected to the switch control line SC100, the first drain/source terminal which is connected to the data input line IN100, and the second drain/source terminal which is connected to a node PIX that is one end of the capacitor Ca100. The other end of the capacitor Ca100 is connected to the capacitor wire CL100.

The transistor N101 has a gate terminal which is connected to the data transfer control line DT100, a first drain/source terminal which is connected to the node PIX, and a second drain/source terminal which is connected to a node MRY that is one end of the capacitor Cb100. The other end of the capacitor Cb100 is connected to the capacitor wire CL100.

An input terminal IP of the inverter INV100 is connected to the node MRY. The transistor P100 has a gate terminal which is connected to the input terminal IP of the inverter INV100, a source terminal which is connected to the High voltage supply line PH100, and a drain terminal which is connected to an output terminal OP of the inverter INV100. The transistor N102 has a gate terminal which is connected to the input terminal IP of the inverter INV100, a drain terminal which is connected to the output terminal OP of the inverter INV100, and a source terminal which is connected to the Low voltage supply line PL100. The transistor N103 has a gate terminal which is connected to the refresh output control line RC100, a first drain/source terminal which is connected to the output terminal OP of the inverter INV100, and a second drain/source terminal which is connected to the node PIX.

Note that, in a case where a pixel structure is constituted as a pixel by adding the liquid crystal capacitor Clc to the memory circuit MR100, the liquid crystal capacitor Clc is connected between the node PIX and a common electrode COM.

Next, operation of the memory circuit MR100 is described below with reference to FIG. 25.

It is assumed in FIG. 25 that the memory circuit MR100 is in a memory operation mode such as a standby state of a mobile phone. An electric potential of binary levels which are High (an active level) and Low (a non-active level) is applied from a driving circuit (not illustrated) to each of the data transfer control line DT100, the switch control line SC100, and the refresh output control line RC100. The High and Low binary levels of a voltage may be individually set for each of these lines. The High and Low binary logic levels are supplied from the driving circuit (not illustrated) to the data input line IN100. An electric potential to be supplied from the High voltage supply line PH100 is equivalent to the High binary logic level, and an electric potential to be supplied from the Low voltage supply line PL100 is equivalent to the Low binary logic level. An electric potential to be supplied from the capacitor wire CL100 may be constant or may change at a given timing. For convenience of explanation, it is assumed here that the electric potential to be supplied from the capacitor wire CL100 is constant.

A writing period T101 and a refresh period T102 are set in the memory operation mode. The writing period T101 is a period in which data to be retained in the memory circuit MR100 is written to the memory circuit MR100 and which has a period t101 and a period t102 that are successive in this order. Since line-sequential writing is carried out with respect to the memory circuit MR100 in the writing period T101, an end timing of the period t101 is set for each row within a period in which corresponding writing data is outputted. An end timing of the period t102, i.e., an end timing of the writing period T101 is identical in all the rows. The refresh period T102 is a period in which the data written to the memory circuit MR100 in the writing period T101 is retained while being refreshed and which has a period t103 through a period t110 that start concurrently in all the rows and are successive in this order.

The switch control line SC100 has a High electric potential in the period t101 of the writing period T101. Each of the data transfer control line DT100 and the refresh output control line RC100 has a Low electric potential. This causes the transistor N100 to turn on. Therefore, a data electric potential (High here) supplied to the data input line IN100 is written to the node PIX. The switch control line SC100 has a Low electric potential in the period t102. This causes the transistor N100 to turn off. Therefore, an electric charge corresponding to the written data electric potential is retained in the capacitor Ca100.

Note here that, in a case where the memory circuit MR100 is constituted only by the capacitor Ca100 and the transistor N100, the node PIX is floating while the transistor N100 is off. In this case, ideally, the electric charge is retained in the capacitor Ca100 so that an electric potential of the node PIX is maintained at High. However, in reality, an off-leakage current occurs in the transistor N100. This causes the electric charge of the capacitor Ca100 to gradually leak to an outside of the memory circuit MR100. The leak of the electric charge of the capacitor Ca100 causes the electric potential of the node PIX to change. Therefore, in a case where the electric charge leaks for a long time, the electric potential of the node PIX changes to an extent that the written data electric potential loses its original function.

In view of the circumstances, the data transfer section TS100, the second data retaining section DS102, and the refresh output control section RS100 are arranged to function to refresh the electric potential of the node PIX, so as to prevent the written data from being lost.

Therefore, the refresh period T102 comes next. The data transfer control line DT100 has a High electric potential in the period t103. This causes the transistor N101 to turn on. Therefore, the capacitor Ca100 and the capacitor Cb100 are connected in parallel with each other via the transistor N101. The capacitor Ca100 is set to have a larger capacitance than the capacitor Cb100. Accordingly, movement of the electric charge between the capacitor Ca100 and the capacitor Cb100 causes an electric potential of the node MRY to be High. A positive electric charge moves from the capacitor Ca100 via the transistor N101 to the capacitor Cb100 until the electric potential of the node PIX becomes equivalent to the electric potential of the node MRY. This causes the electric potential of the node PIX to be lower by a slight amount of voltage of ΔV1 than that obtained in the period t102. However, the electric potential of the node PIX falls within a range of a High electric potential.

The data transfer control line DT100 has a Low electric potential in the period t104. This causes the transistor N101 to turn off. Therefore, the electric charge is retained in the capacitor Ca100 so that the electric potential of the node PIX is maintained at High, and the electric charge is retained in the capacitor Cb100 so that the electric potential of the node MRY is maintained at High.

The refresh output control line RC100 has a High electric potential in the period t105. This causes the transistor N103 to turn on. Therefore, the output terminal OP of the inverter INV100 is connected to the node PIX. Since a reverse electric potential (Low here) to the electric potential of the node MRY is supplied to the output terminal OP, the node PIX is charged at the reverse electric potential. The refresh output control line RC100 has a Low electric potential in the period t106. This causes the transistor N103 to turn off. Therefore, the electric charge is retained in the capacitor Ca100 so that the electric potential of the node PIX is maintained at the reverse electric potential.

The data transfer control line DT100 has a High electric potential in the period t107. This causes the transistor N101 to turn on. Therefore, the capacitor Ca100 and the capacitor Cb100 are connected in parallel with each other via the transistor N101. Accordingly, movement of the electric charge between the capacitor Ca100 and the capacitor Cb100 causes the electric potential of the node MRY to be Low. A positive electric charge moves from the capacitor Cb100 via the transistor N101 to the capacitor Ca100 until the electric potential of the node MRY becomes equivalent to the electric potential of the node PIX. This causes the electric potential of the node PIX to be higher by a slight amount of voltage of ΔV2 than that obtained in the period t106. However, the electric potential of the node PIX falls within a range of a Low electric potential.

The data transfer control line DT100 has a Low electric potential in the period t108. This causes the transistor N101 to turn off. Therefore, the electric charge is retained in the capacitor Ca100 so that the electric potential of the node PIX is maintained at Low, and the electric charge is retained in the capacitor Cb100 so that the electric potential of the node MRY is maintained at Low.

The refresh output control line RC100 has a High electric potential in the period t109. This causes the transistor N103 to turn on. Therefore, the output terminal OP of the inverter INV100 is connected to the node PIX. Since a reverse electric potential (High here) to the electric potential of the node MRY is supplied to the output terminal OP, the node PIX is charged at the reverse electric potential. The refresh output control line RC100 has a Low electric potential in the period t110. This causes the transistor N103 to turn off. Therefore, the electric charge is retained in the capacitor Ca100 so that the electric potential of the node PIX is maintained at the reverse electric potential.

Thereafter, the period t103 through the period t110 are repeated in the refresh period T102 until the next writing period T101 comes. In the period t105, the electric potential of the node PIX is refreshed to the reverse electric potential. In the period t109, the electric potential of the node PIX is refreshed to the electric potential obtained during writing. Note that, in a case where the data electric potential of Low is written to the node PIX in the period t101 of the writing period T101, an electric potential waveform of the node PIX is obtained by reversing an electric potential waveform of FIG. 25.

As described earlier, the memory circuit MR100 is arranged such that in accordance with a data inversion method, written data is retained while being refreshed. Assume that the liquid crystal capacitor Clc is added to the memory circuit MR100. In a case where an electric potential of the common electrode COM is reversed between High and Low at a timing at which data is refreshed, black display data or white display data can be refreshed while its polarities are being reversed.

CITATION LIST

Patent Literature 1

Japanese Patent Application Publication, Tokukai, No. 2002-229532 A (Publication Date: Aug. 16, 2002)

SUMMARY OF INVENTION

Technical Problem

However, according to the conventional memory circuit MR100, the data transfer section TS100 including the transistor N101 is provided in a circuit in which data is refreshed. Therefore, in the period t104 through the period t106 and the period t108 through the period t110 of the refresh period T102 in each of which periods the data transfer control line DT100 has an electric potential of a non-active level (Low here), the node MRY has been cut off from the node PIX and is floating. Especially in the period t105 through the period t106, the node MRY has an electric potential equivalent to High in a case where the node PIX has an electric potential equivalent to Low. In the period t109 through the period t110, the node MRY has an electric potential equivalent to Low in a case where the node PIX has an electric potential equivalent to High. Though the transistor N101 of the data transfer section TS100 is off in this period, the off-leakage current occurring in the transistor N100 causes the electric potential of the node MRY to gradually change as time passes.

Note that each of the nodes which are floating is influenced by an electric potential change due to a parasitic capacitor of a transistor, a wire, or the like. However, for simplification of explanation, no consideration is herein given to the electric potential change due to the parasitic capacitor.

Assume that an amount of electric potential change in the node MRY due to the off-leakage current is α. The node MRY has an electric potential of (High electric potential−ΔV1−α) in the period t103 through the period t104. This causes a further electric potential change in addition to the electric potential change of ΔV1 due to electric charge partitioning and further causes an electric potential change of (ΔV1+α). The node MRY has an electric potential of (Low electric potential+ΔV2+α) in the period t107 through the period t108. This causes a further electric potential change in addition to the electric potential change of ΔV2 due to electric charge partitioning and further causes an electric potential change of (ΔV2+α).

Assume that a threshold voltage of each of the transistor P100 and the transistor N102 of the inverter INV100 is Vth. In a case where the electric potential (High electric potential−ΔV1−α) of the node MRY is lower than (High electric potential−Vth), the transistor P100 gradually turns on. In this case, the transistor N102 is on. This causes a problem such that a breakthrough current flows from the High voltage supply line PH100 via the transistor P100 and the transistor N102 to the Low voltage supply line L100 and a large consumption current occurs.

In a state in which such a breakthrough current flows, an output of the inverter INV100 gradually has an electric potential between High and Low. In this case, the node PIX also has an electric potential between High and Low. In a case where the node PIX has an electric potential which cannot be discriminated between High and Low, an operation error occurs in the memory circuit MR100.

Similarly, in a case where the electric potential (Low electric potential+ΔV2+α) of the node MRY is higher than (Low electric potential+Vth), the transistor N102 gradually turns on. In this case, the transistor P100 is on. This causes a problem such that a breakthrough current flows from the High voltage supply line PH100 via the transistor P100 and the transistor N102 to the Low voltage supply line L100 and a large consumption current occurs. In a state in which such a breakthrough current flows, an output of the inverter INV100 gradually has an electric potential between High and Low. In this case, the node PIX also has an electric potential between High and Low. In a case where the node PIX has an electric potential which cannot be discriminated between High and Low, an operation error occurs in the memory circuit MR100.

As described earlier, a conventional memory device has the following problem. According to a memory circuit including (i) a first node (the node PIX in the above example) to which a data electric potential is written, (ii) a second node (the node MRY in the above example) to which data of the first node is transferred from the first node so as to be refreshed, and (iii) a data transfer element provided between the first node and the second node, a circuit which carries out a refresh operation in accordance with an electric potential of the second node cannot appropriately carry out its original operation due to an off-leakage current occurring in the data transfer element.

In view of the above problems, the present invention proposes an arrangement in which power consumption can be reduced and a refresh operation can be properly carried out in a memory device which carries out the refresh operation in a data retention period following writing of a data signal electric potential.

Solution to Problem

In order to attain the above object, a memory device of the present invention which carries out a refresh operation in a data retention period following writing of a data signal electric potential, includes:

first through fourth transistors;

a first signal line for turning the first transistor on/off;

a second signal line for turning the second transistor on/off;

a third signal line for turning the fourth transistor on/off;

a fourth signal line for supplying the data signal electric potential; and a fifth signal line for forming a capacitor in which the data signal electric potential is retained, the first transistor having (i) a control terminal which is connected to the first signal line and (ii) a first conduction terminal which is connected to the fourth signal line, the second transistor having (i) a control terminal which is connected to the second signal line and (ii) a first conduction terminal which is connected to a second conduction terminal of the first transistor at a first connection point, the third transistor having (i) a control terminal which is connected to a second conduction terminal of the second transistor at a second connection point and (ii) a first conduction terminal which is connected to the second signal line, the fourth transistor having (i) a control terminal which is connected to the third signal line, (ii) a first conduction terminal which is connected to a second conduction terminal of the third transistor, and (iii) a second conduction terminal which is connected to the first connection point, a first capacitor being formed between the first connection point and the fifth signal line, a second capacitor being formed between the second connection point and the fifth signal line, and a third capacitor being formed between the first conduction terminal of the third transistor and the second connection point.

According to the arrangement, in the data retention period, a constant electric potential which turns the third transistor on is supplied to the fourth signal line, and the refresh operation is properly carried out by making the third signal line active after making the first signal line active once while the second signal line is being kept non-active. This eliminates the need for an inverter (FIG. 24) for carrying out a refresh operation, thereby greatly reducing power consumption as compared with a conventional art.

According to the arrangement, a third capacitor is formed between the first conduction terminal of the third transistor and the second connection point. This can stabilize electric potentials of the first connection point and the second connection point, thereby making it possible to properly carry out a refresh operation of a memory device. This is described later in detail (see FIG. 13).

In order to attain the above object, a memory device of the present invention which carries out a refresh operation in a data retention period following writing of a data signal electric potential, includes:

first through fourth transistors;
a first signal line for turning the first transistor on/off;
a second signal line for turning the second transistor on/off;
a third signal line for turning the fourth transistor on/off;
a fourth signal line for supplying the data signal electric potential;
a fifth signal line for forming a capacitor in which the data signal electric potential is retained; and
a sixth signal line,
the first transistor having (i) a control terminal which is connected to the first signal line and (ii) a first conduction terminal which is connected to the fourth signal line,
the second transistor having (i) a control terminal which is connected to the second signal line and (ii) a first conduction terminal which is connected to a second conduction terminal of the first transistor at a first connection point,
the third transistor having (i) a control terminal which is connected to a second conduction terminal of the second transistor at a second connection point and (ii) a first conduction terminal which is connected to the second signal line,
the fourth transistor having (i) a control terminal which is connected to the third signal line, (ii) a first conduction terminal which is connected to a second conduction terminal of the third transistor, and (iii) a second conduction terminal which is connected to the first connection point,
a first capacitor being formed between the first connection point and the fifth signal line, a second capacitor being formed between the second connection point and the fifth signal line, and a third capacitor being formed between the second connection point and the sixth signal line.

According to the arrangement, in the data retention period, a constant electric potential which turns the third transistor on is supplied to the fourth signal line, and the refresh operation is properly carried out by making the third signal line active after making the first signal line active once while the second signal line is being kept non-active. This eliminates the need for an inverter (FIG. 24) for carrying out a refresh operation, thereby greatly reducing power consumption as compared with a conventional art.

According to the arrangement, a third capacitor is formed between the second connection point and the sixth signal line. This can stabilize electric potentials of the first connection point and the second connection point, thereby making it possible to properly carry out a refresh operation of a memory device. This is described later in detail (see FIG. 20).

In order to attain the above object, a liquid crystal display device of the present invention includes:

any of the memory devices;
a pixel electrode; and
a counter electrode,
the pixel electrode being connected to the first connection point,
the first signal line functioning also as a scanning signal line, and
the fourth signal line functioning also as a data signal line.

In order to attain the above object, a liquid crystal display device of the present invention is a memory-type liquid crystal display device which carries out a refresh operation in a data retention period following writing of a data signal electric potential, including:

data signal lines;
scanning signal lines;
retention capacitor wires;
data transfer lines;
refresh lines;
pixel electrodes;
a counter electrode;
first transistors;
second transistors;
third transistors;
fourth transistors;
first capacitors;
second capacitors; and
third capacitors,
wherein each pixel electrode is associated with the first transistors, the second transistors, the third transistors, the fourth transistors, the first capacitors, the second capacitors, and the third capacitors in such a manner that (i) a first transistor associated with the pixel electrode has a control terminal which is connected to a scanning signal line associated with the pixel electrode, (ii) a second transistor associated with the pixel electrode has a control terminal which is connected to a data transfer line associated with the pixel electrode, (iii) a third transistor associated with the pixel electrode has a control terminal which is connected to the pixel electrode via the second transistor, (iv) a fourth transistor associated with the pixel electrode has a control terminal which is connected to a refresh line associated with the pixel electrode, (v) a first capacitor associated with the pixel electrode is connected to the pixel electrode, (vi) a second capacitor associated with the pixel electrode is connected to the pixel electrode via the second transistor, (vii) a third capacitor associated with the pixel electrode is formed between (a) a conduction terminal of the third transistor which conduction terminal is connected to the data transfer line and (b) the control terminal of the third transistor, and (viii) the pixel electrode is connected to a data signal line associated with the pixel electrode via the first transistor and is connected to the data transfer line via the fourth transistor and the third transistor.

Advantageous Effects of Invention

As described above, the memory device and the liquid crystal display device of the present invention include:

first through fourth transistors;
a first signal line for turning the first transistor on/off;
a second signal line for turning the second transistor on/off;
a third signal line for turning the fourth transistor on/off;
a fourth signal line for supplying the data signal electric potential; and a fifth signal line for forming a capacitor in which the data signal electric potential is retained, the first transistor having (i) a control terminal which is connected to the first signal line and (ii) a first conduction terminal which is connected to the fourth signal line, the second transistor having (i) a control terminal which is connected to the second signal line and (ii) a first conduction terminal which is connected to a second conduction terminal of the first transistor at a first connection point, the third transistor having (i) a control terminal which is connected to a second conduction terminal of the second transistor at a second connection point and (ii) a first conduction terminal which is connected to the second signal line, the fourth transistor having (i) a control terminal which is connected to the third signal line, (ii) a first conduction terminal which is connected to a second conduction terminal of the third transistor, and (iii) a second conduction terminal which is connected to the first connection point, a first capacitor being formed between the first connection point and the fifth signal line, a second capacitor being formed between the second connection point and the fifth signal line, and a third capacitor being formed between the first conduction terminal of the third transistor and the second connection point.

This makes it possible to reduce power consumption and properly carry out a refresh operation in a memory device which carries out a refresh operation in a data retention period following writing of a data signal electric potential.

BRIEF DESCRIPTION OF DRAWINGS

FIG. 9, which shows the embodiment of the present invention, illustrates polarities of data.

DESCRIPTION OF EMBODIMENTS

An embodiment of the present invention is described below with reference to FIG. 1 through FIG. 23 and FIG. 26.

The present embodiment discusses a memory device which is capable of writing and reading data.

Figure 1:
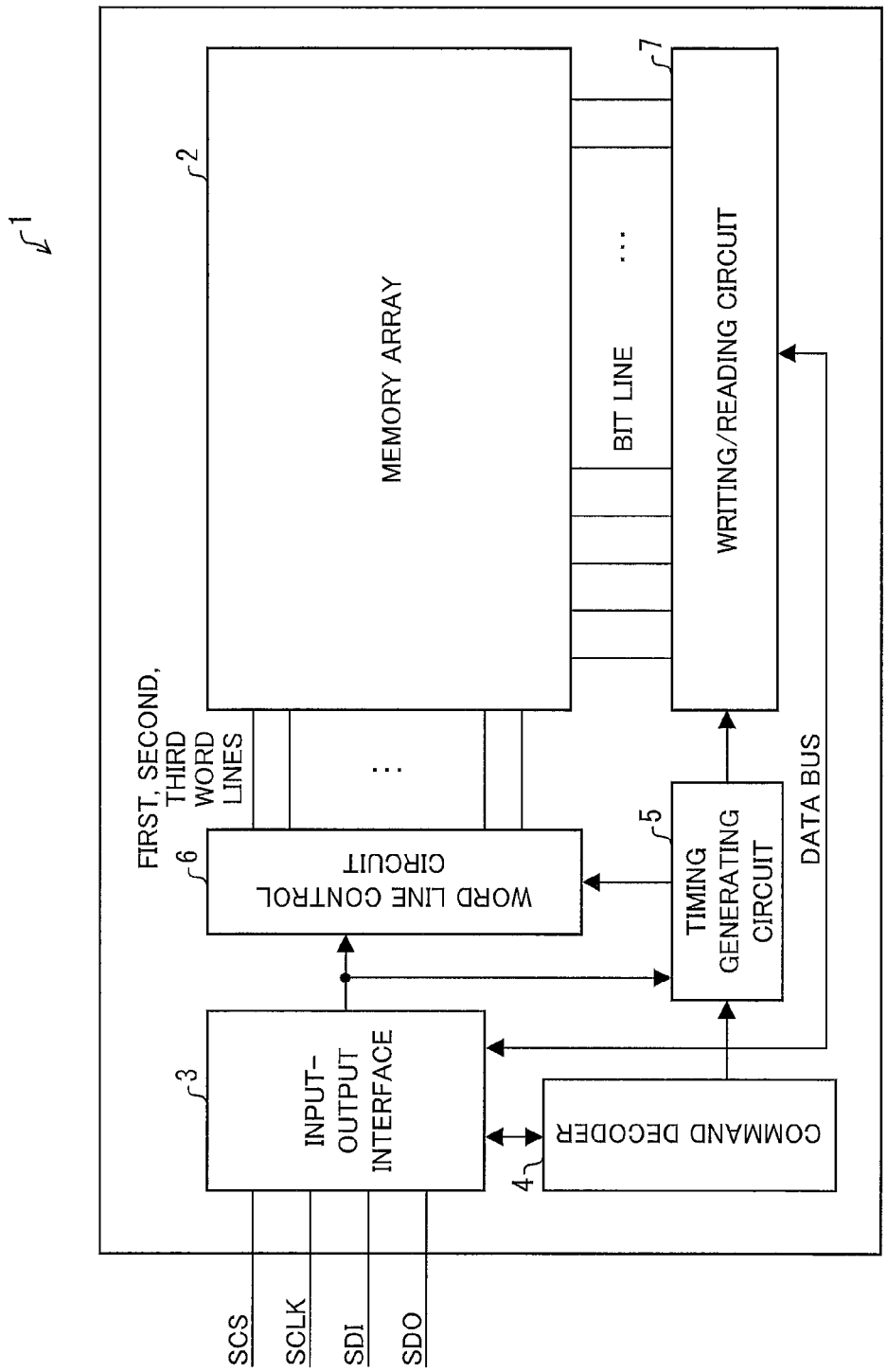
FIG. 1, which shows an embodiment of the present invention, is a block diagram illustrating an arrangement of a memory device.

FIG. 1 illustrates an arrangement of a memory device 1 of the present embodiment.

The memory device 1 includes a memory array 2, an input-output interface 3, a command decoder 4, a timing generating circuit 5, a word line control circuit 6, and a writing/reading circuit 7.

Figure 2:
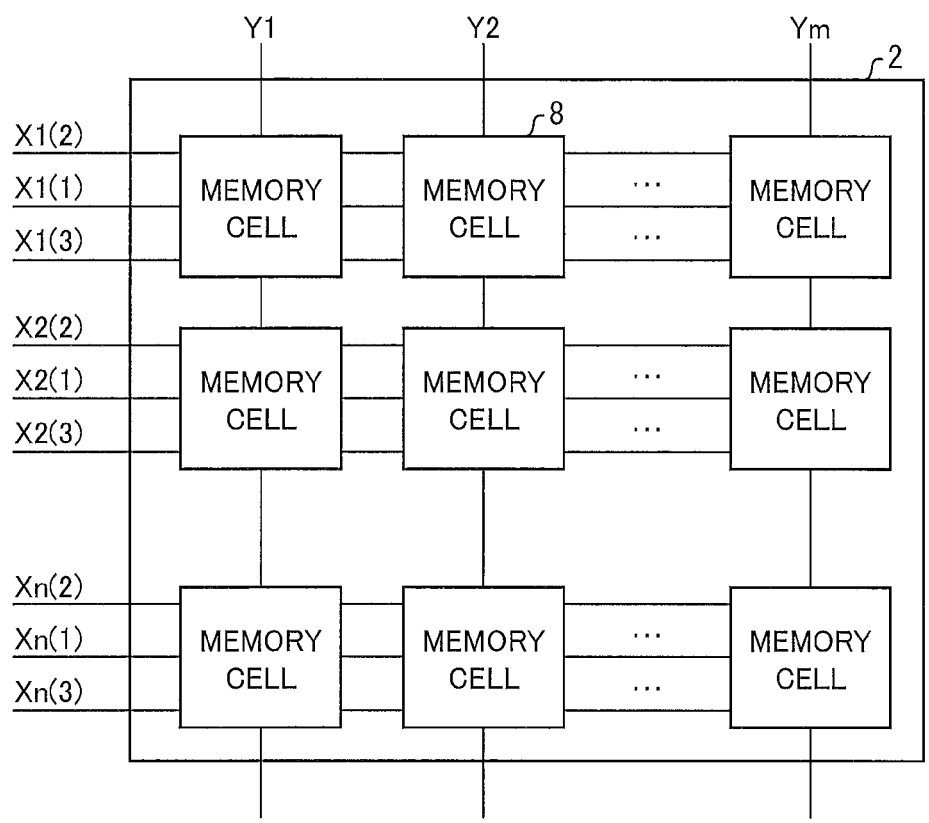
FIG. 2 is a block diagram illustrating how memory cells and wires of the memory cell of FIG. 1 are arranged.

The memory array 2 is arranged such that memory cells 8 are provided in a matrix with n rows and m columns (see FIG. 2). Each of the memory cells 8 independently retains data. The first word line Xi(1), the second word line Xi(2), and the third word line Xi(3) which are connected to the ith (i is an integer, 1≤i≤n) row, and a bit line Yj which is connected to the jth (j is an integer, 1≤j≤m) column control writing and reading of data with respect to a memory cell 8 located at an intersection of the ith row and the jth column.

The input-output interface 3 controls an input-output of data between the memory device 1 and an outside of the memory device 1. For example, a four-wire serial interface used as the input-output interface 11 controls a transmission of a serial chip select signal SCS, a serial clock signal SCLK, a serial data input signal SDI, and a serial data output signal SDO (see FIG. 1). According to this, the input-output interface 3 receives a writing/reading command and/or an address/data from outside and supplies, to the outside, data read out from the memory array 2. The input-output interface 3 is not limited to the four-wire serial interface but may be a parallel interface.

The command decoder 4 is connected to each of the input-output interface 3 and the timing generating circuit 5. The command decoder 4 is a circuit which interprets the command received from the input-output interface 3 and selects an operation mode in accordance with the interpretation, so as to transmit the operation mode thus selected to the timing generating circuit 5.

The timing generating circuit 5 is connected to each of the input-output interface 3, the command decoder 4, the word line control circuit 6, and the writing/reading circuit 7. In accordance with the operation mode determined by the command decoder 4, the timing generating circuit 5 generates an internal timing signal which is necessary for each operation. A clock signal which serves as a basis for a timing may be supplied from an external system via the input-output interface 3 or may be generated inside the memory device 1 or inside the timing generating circuit 5 by an oscillator or the like.

The word line control circuit (row driver) 6 is connected to each of the memory array 2, the input-output interface 3, and the timing generating circuit 5. In accordance with the internal timing signal generated by the timing generating circuit 5, the word line control circuit 6 controls a word line which is appropriately selected, in accordance with a writing/reading address to be supplied from the input-output interface 3, from among a plurality of kinds of word lines of the first word line Xi(1), the second word line Xi(2), and the third word line Xi(3) (i is the row number) which are connected to each row of the memory array 2.

Figure 3:
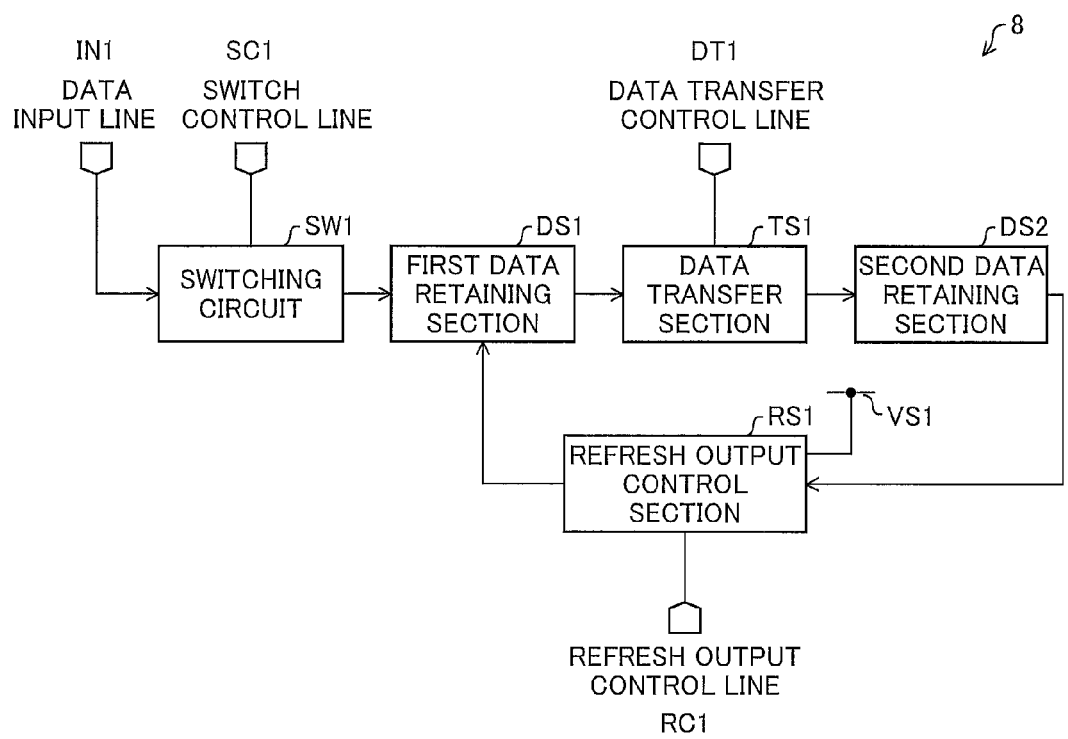
FIG. 3 is a block diagram illustrating an arrangement of a memory cell of FIG. 2.

The writing/reading circuit (column driver) 7 is connected to each of the memory array 2, the input-output interface 3, and the timing generating circuit 5. In accordance with the internal timing signal generated by the timing generating circuit 5, the writing/reading circuit 7 controls the bit line Yj (j is the column number) which is connected to each column of the memory array 2. During writing of data, the writing/reading circuit 7 applies, to a bit line, a binary logic level in accordance with written data to be supplied from the input-output interface 3. During reading of data, the writing/reading circuit 7 senses an electric potential of each bit line and supplies data in accordance with a sensed value to the input-output interface 3. Binary logic levels are indicated by a first electric potential level and a second electric potential level. For example, one and the other of the first electric potential level and the second electric potential level are indicated by a High electric potential and a Low electric potential, respectively. The first electric potential level and the second electric potential level, which are logic levels, may have respective values falling within a given range. FIG. 3 shows a concept of an arrangement of each of the memory cells 8.

A memory cell 8 includes a switching circuit SW1, a first data retaining section DS1, a data transfer section TS1, a second data retaining section DS2, a refresh output control section RS1, and a voltage supply VS1.

The memory array 2 includes a data input line IN1, a switch control line SC1, a data transfer control line DT1, and a refresh output control line RC1 (refresh line). In FIG. 2, the bit line Yj corresponds to the data input line IN1, the first word line Xi(1) corresponds to the switch control line SC1, the second word line Xi(2) corresponds to the data transfer control line DT1, and the third word line Xi(3) corresponds to the refresh output control line RC1.

The switching circuit SW1 is driven by the word line control circuit 6 via the switch control line SC1 (a first signal line), so as to selectively turn on or off the data input line IN1 (a fourth signal line) and the first data retaining section DS1.

The first data retaining section DS1 retains a binary logic level to be supplied thereto.

The data transfer section TS1 is driven by the word line control circuit 6 via the data transfer control line DT1 (a data transfer line, a second signal line), so as to selectively carry out (i) a transfer operation in which the binary logic level retained in the first data retaining section DS1 is transferred to the second data retaining section DS2 while being retained in the first data retaining section DS1 and (ii) a non-transfer operation in which no transfer operation is carried out. Note that, since a signal to be supplied to the data transfer control line DT1 is shared by all the memory cells 8, the data transfer control line DT1 is not necessarily required to be provided for each row to be driven by the word line control circuit 6. The data transfer control line DT1 may be driven by the writing/reading circuit 7 or the like.

The second data retaining section DS2 retains the binary logic level to be supplied thereto.

The refresh output control section RS1 (first control section) is driven by the word line control circuit 6 via the refresh output control line RC1 (a refresh line, a third signal line), so as to be selectively controlled to be in a state in which the refresh output control section RS1 carries out a first operation or a second operation. Note that, since a signal to be supplied to the refresh output control line RC1 is shared by all the memory cells 8, the refresh output control line RC1 is not necessarily required to be provided for each row to be driven by the word line control circuit 6. The refresh output control line RC1 may be driven by the writing/reading circuit 7 or the like.

In the first operation, an active state or a non-active state is selected in accordance with control information indicative of which of the first electric potential level and the second electric potential level is retained in the second data retaining section DS2 as the binary logic level. In the active state, the refresh output control section RS1 receives an input thereto and supplies the input as an output thereof to the first data retaining section DS1. In the non-active state, the refresh output control section RS1 stops carrying out an output.

In the second operation, the refresh output control section RS1 stops carrying out the output regardless of the control information.

The voltage supply VS1 supplies a set electric potential to an input of the refresh output control section RS1.

Figure 4:
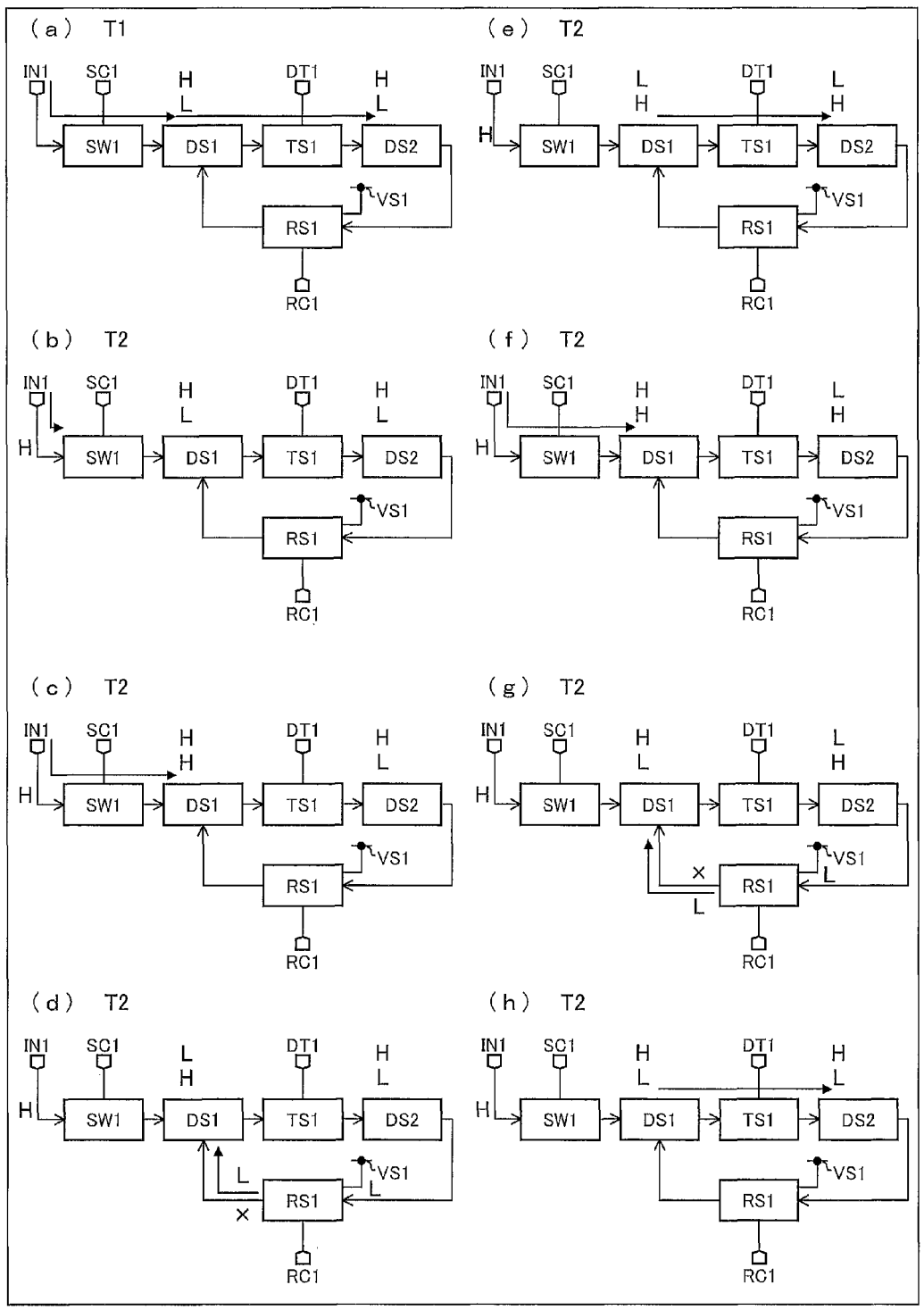
FIG. 4 illustrates operations of the memory cell of FIG. 3. (a) through (h) of FIG. 4 illustrate the operations.

Next, a transition of a state of the memory cell 8 is described below with reference to (a) through (h) of FIG. 4. Each of (a) through (h) of FIG. 4 illustrates "H" assuming that the first electric potential level is High and illustrates "L" assuming that the second electric potential level is Low. As for parts of FIG. 4 in each of which "H" and "L" are vertically juxtaposed to each other, the upper "H" or "L" shows a transition state of an electric potential level obtained during writing of "H" to the memory cell 8, and the lower "H" or "L" shows a transition state of an electric potential level obtained during writing of "L" to the memory cell 8.

First, a writing period T1 for writing data is set in a data writing mode.

In the writing period T1, the switch control line SC1 causes the switching circuit SW1 to turn on, and a binary logic level to be retained is supplied from the data input line IN1 via the switching circuit SW1 to the first data retaining section DS1, the binary logic level being indicated by the first electric potential level or the second electric potential level corresponding to data (see (a) of FIG. 4).

In response to the supply of the binary logic level to the first data retaining section DS1, the switch control line SC1 causes the switching circuit SW1 to turn off. In this case, the data transfer control line DT1 causes the data transfer section TS1 to turn on, i.e., to be in a state in which the data transfer section TS1 carries out the transfer operation, and the binary logic level having been supplied to the first data retaining section DS1 is transferred from the first data retaining section DS1 via the data transfer section TS1 to the second data retaining section DS2 while being retained in the first data retaining section DS1. In a case where the binary logic level has been transferred to the second data retaining section DS2, the data transfer section TS1 turns off, i.e., is in a state in which the data transfer section TS1 carries out the non-transfer operation.

A refresh period T2 (data retaining period) is set following the writing period T1.

In the refresh period T2, the first electric potential level (data signal electric potential) is first supplied from the writing/reading circuit 7 to the data input line IN1 (see (b) of FIG. 4).

Then, the switch control line SC1 causes the switching circuit SW1 to turn on, and the first electric potential level is supplied from the data input line IN1 via the switching circuit SW1 to the first data retaining section DS1 (see (c) of FIG. 4). In response to the supply of the first electric potential level to the first data retaining section DS1, the switch control line SC1 causes the switching circuit SW1 to turn off.

Next, the refresh output control line RC1 controls the refresh output control section RS1 to be in a state in which the refresh output control section RS1 carries out the first operation (see (d) of FIG. 4). The refresh output control section RS1 carries out the first operation differently in accordance with the control information indicative of which of the first electric potential level and the second electric potential level (data signal electric potential) is retained in the second data retaining section DS2 as the binary logic level.

Namely, in a case where the first electric potential level is retained in the second data retaining section DS2 and first control information indicating that the first electric potential level is retained in the second data retaining section DS2 is transmitted from the second data retaining section DS2 to the refresh output control section RS1, the refresh output control section RS1 is in the active state, in which the refresh output control section RS1 receives the input thereto and supplies the input as the output thereof to the first data retaining section DS1. In a case where the refresh output control section RS1 carries out the first operation, the electric potential of the voltage supply VS1 is set so that the second electric potential level can be at least finally supplied to the input of the refresh output control section RS1 in a period during which the first control information is being transmitted to the refresh output control section RS1. In this case, the first data retaining section DS1 retains the second electric potential level in a state in which the binary logic level having been retained therein until then is overwritten with the second electric potential level having been supplied from the refresh output control section RS1.

In contrast, in a case where the second electric potential level is retained in the second data retaining section DS2, the refresh output control section RS1 is in the non-active state. In a case where second control information indicating that the second electric potential level is retained in the second data retaining section DS2 is transmitted from the second data retaining section DS2 to the refresh output control section RS1, the refresh output control section RS1 is in a state in which the refresh output control section RS1 stops carrying out the output (an "X" in FIG. 4). In this case, the first data retaining section DS1 continues retaining the first electric potential level having been retained therein until then.

Thereafter, the refresh output control line RC1 controls the refresh output control section RS1 to be in a state in which the refresh output control section RS1 carries out the second operation.

Subsequently, in the refresh period T2, the data transfer control line DT1 causes the data transfer section TS1 to be in the state in which the data transfer section TS1 carries out the transfer operation, and binary logic data having been retained in the first data retaining section DS1 until then is transferred from the first data retaining section DS1 via the data transfer section TS1 to the second data retaining section DS2 while being retained in the first data retaining section DS1 (see (e) of FIG. 4). In a case where the binary logic data has been transferred from the first data retaining section DS1 to the second data retaining section DS2, the data transfer section TS1 turns off, i.e., is in a state in which the data transfer section TS1 carries out the non-transfer operation.

Then, the switch control line SC1 causes the switching circuit SW1 to turn on, and the first electric potential level is supplied from the data input line IN1 via the switching circuit SW1 to the first data retaining section DS1 (see (f) of FIG. 4). In response to the supply of the first electric potential level to the first data retaining section DS1, the switch control line SC1 causes the switching circuit SW1 to turn off.

Next, the refresh output control line RC1 controls the refresh output control section RS1 to be in a state in which the refresh output control section RS1 carries out the first operation (see (g) of FIG. 4). In a case where the first electric potential level is retained in the second data retaining section DS2, the refresh output control section RS1 is in the active state, in which the refresh output control section RS1 supplies, to the first data retaining section DS1, the second electric potential level to be supplied from the voltage supply VS1. In this case, the first data retaining section DS1 retains the second electric potential level in a state in which the binary logic level having been retained therein until then is overwritten with the second electric potential level having been supplied from the refresh output control section RS1. In contrast, in a case where the second electric potential level is retained in the second data retaining section DS2, the refresh output control section RS1 is in the non-active state, in which the refresh output control section RS1 stops carrying out the output. In this case, the first data retaining section DS1 continues retaining the first electric potential level having been retained therein until then. Thereafter, the refresh output control line RC1 controls the refresh output control section RS1 to be in a state in which the refresh output control section RS1 carries out the second operation, so that the refresh output control section RS1 is in a state in which the refresh output control section RS1 stops carrying out the output.

Subsequently, the data transfer control line DT1 causes the data transfer section TS1 to be in the state in which the data transfer section TS1 carries out the transfer operation, and the binary logic level having been retained in the first data retaining section DS1 until then is transferred from the first data retaining section DS1 via the data transfer section TS1 to the second data retaining section DS2 while being retained in the first data retaining section DS1 (see (h) of FIG. 4). In a case where the binary logic level has been transferred from the first data retaining section DS1 to the second data retaining section DS2, the data transfer section TS1 turns off, i.e., is in a state in which the data transfer section TS1 carries out the non-transfer operation.

In (h) of FIG. 4, the above series of operations allows the binary logic level having been written in the writing period T1 of (a) of FIG. 4 to be restored in each of the first data retaining section DS1 and the second data retaining section DS2. Accordingly, data having been written in the writing period T1 is similarly restored even if the operations from (b) to (h) of FIG. 4 are repeated any number of times after the operation (h) of FIG. 4.

Note here that, in a case where the first electric potential level (High here) has been written in the writing period T1, the binary logic level is refreshed by being subjected to a level reversal carried out one time in each of (d) of FIG. 4 and (f) of FIG. 4, so that the binary logic level thus refreshed is restored to the first electric potential level. In a case where the second electric potential level (Low here) has been written in the writing period T1, the binary logic level is refreshed by being subjected to a level reversal carried out one time in each of (c) of FIG. 4 and (g) of FIG. 4, so that the binary logic level thus refreshed is restored to the second electric potential level.

Note that, in a case where the first electric potential level is Low and the second electric potential is High, it is only necessary that the above operation logic be reversed.

In the refresh period T2, the first electric potential level is supplied from the data input line IN1 to the first data retaining section DS1 (see (c) and (f) of FIG. 4), and the refresh output control section RS1 supplies the second electric potential level from the voltage supply VS1 to the first data retaining section DS1 (see (d) and (g) of FIG. 4). Therefore, it is unnecessary to provide an inverter so as to carry out a refresh operation, unlike a conventional art.

As described earlier, according to the memory device 1, in a case where one and the other of the first electric potential level and the second electric potential level are supplied from the data input line IN1 and the voltage supply VS1, respectively to each of the memory cells 8 by no use of an inverter after binary logic data has been written to the first data retaining section DS1, a binary logic level corresponding to the binary logic data having been written to a memory cell 8 can be refreshed while being subjected to a level reversal. Since a binary logic level which has been refreshed and is retained in the first data retaining section DS1 and a binary logic level which has been refreshed and is retained in the second data retaining section DS2 are equal to each other, the first data retaining section DS1 and the second data retaining section DS2 do not change in electric potential even if the data transfer section TS1 carries out the transfer operation. This allows both the first data retaining section DS1 and the second data retaining section DS2 to retain the binary logic levels thus refreshed for a long time while the data transfer section TS1 is in a state in which the data transfer section TS1 carries out the transfer operation. In this case, since the first data retaining section DS1 and the second data retaining section DS2 are connected via the data transfer section TS1, occurrence of an off-leakage current in a transfer element of the data transfer section TS1 is irrelevant to retention of the binary logic levels. The binary logic levels, which are retained in a mass by a large electric capacitance represented by a sum of the first data retaining section DS1 and the second data retaining section DS2, are less likely to change in electric potential even by an influence of a noise from outside.

Figure 25:
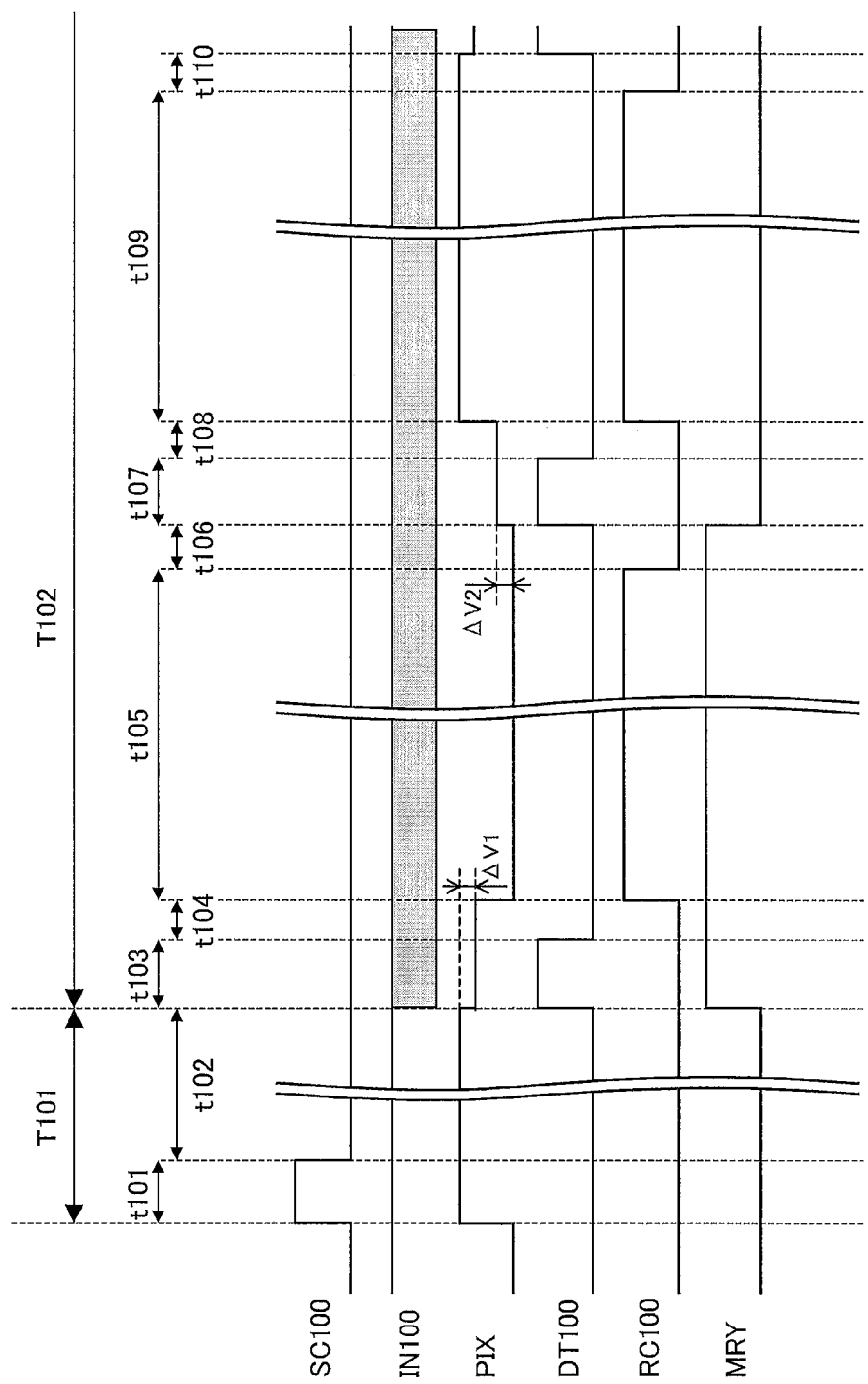
FIG. 25 is a signal diagram illustrating a writing operation of the memory circuit of FIG. 24.

Accordingly, even if the off-leakage current occurs in the transfer element used in the data transfer section TS1, an electric potential of a retaining node which retains the binary logic level of the second data retaining section DS2 is less likely to change since the electric potential is retained for a long time together with an electric potential of a retaining node of the first data retaining section DS1. According to a conventional memory cell, the binary logic levels which have been refreshed and are different from each other are retained for a long time in a state in which the first data retaining section DS1 and the second data retaining section DS2 are electrically separated from each other by the transfer element (transistor N101) of the data transfer section TS100 (see the period t105 and the period t109 which are illustrated in FIG. 25). Therefore, the off-leakage current of the transfer element has a great influence on the electric potential of the second data retaining section DS102.

Further, even if the electric potential of the retaining node of the second data retaining section DS2 changes, a time for the change is not long enough for the control information for the refresh control section RS1 carrying out the first operation to change between the active level and the non-active level.

In a case where it is assumed that an inverter exists in the refresh control section RS1, there exist two complementary levels of a High level and a Low level as active levels at each of which the inverter operates. Therefore, a range is narrow in which the electric potential of the second data retaining section DS2 can exist as a level at which the inverter stably maintains an identical operation. For example, assume that the electric potential of the second data retaining section DS2 is at the Low level. While the inverter is being operated so that a p-channel transistor turns on and an n-channel transistor turns off, it is feared that a slight increase in gate electric potential of the p-channel transistor may cause the n-channel transistor to turn on. However, in a case where the n-channel transistor is designed to have a large threshold voltage so as to avoid such a fear and the inverter is desired to operate so that the p-channel transistor turns off and the n-channel transistor turns on, a range becomes narrow in which the High level functions as the active level.

In contrast, according to the present embodiment, the active level of the refresh control section RS1 is one of the first electric potential level and the second electric potential level. Therefore, in a case where a broad range is secured in which the control information for the refresh control section RS1 exists as the non-active level, it is less feared that the non-active level may change to the active level. In contrast, in a case where the active level functions at an early stage of the active state of the first operation of the refresh control section RS1, an object of the active level to be supplied from the voltage supply section VS1 to the first data retaining section DS1 is easily attained. Therefore, even in a case where the active level finally changes to the non-active level, the change is less likely to cause an operation error in the refresh control section RS1. Accordingly, even if the electric potential of the retaining node of the second data retaining section DS2 changes, it is possible to carry out designing with such a large margin as to prevent the operation error in the refresh control section RS1. For example, assume that the control information for the refresh control section RS1 is supplied to a gate of a transistor. Such designing corresponds to designing such that an increase in threshold voltage of the transistor causes a gate-source voltage to be less likely to exceed the threshold voltage of the transistor even if the electric potential of the second data retaining section DS2 which electric potential should be at the non-active level changes.

Further, in a case where the electric potential of the retaining node of the second data retaining section DS2 changes but the refresh output control section RS1 carries out the second operation, no operation error occurs.

Accordingly, it is possible to provide a memory device such that, even if an off-leakage current occurs in a transfer element used in a transfer section which transfers binary logic data between two retaining sections, a circuit which carries out a refresh operation in accordance with a binary logic level retained in one of the two retaining sections can suitably carry out its original operation with no increase in consumption current and no operation error.

Next, the following description specifically discusses an arrangement and an operation of the memory cell 8.

Figure 5:
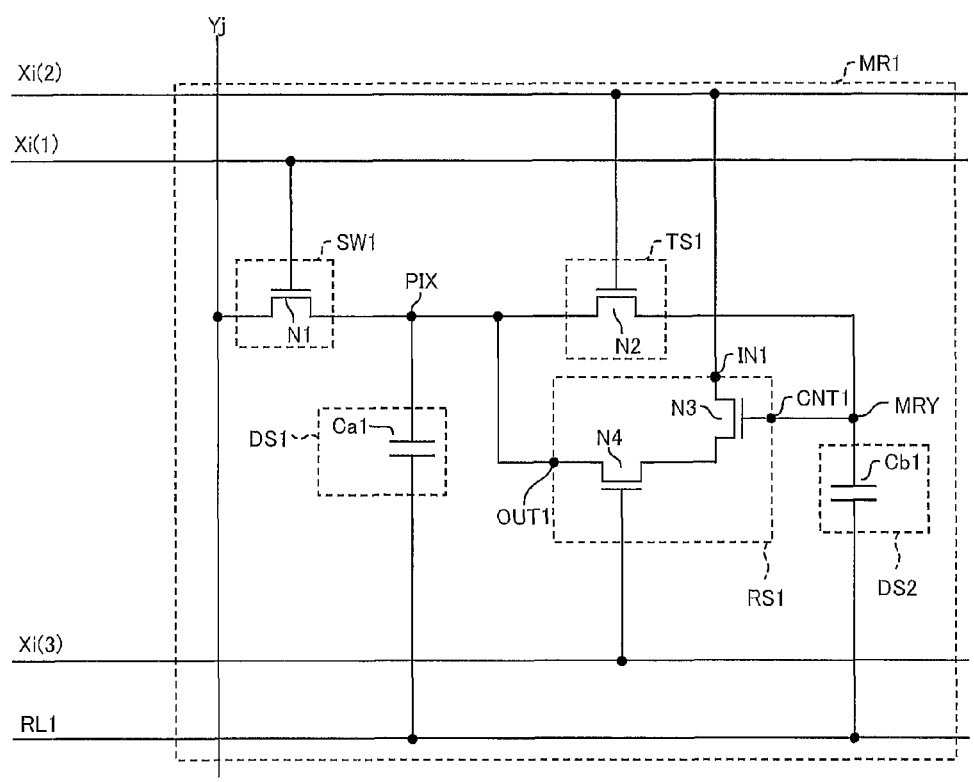
FIG. 5, which shows the embodiment of the present invention, is a circuit diagram illustrating an arrangement of a memory circuit.

FIG. 5 illustrates an arrangement of the memory cell 8 in the form of a memory circuit MR1 which is an equivalent circuit.

As described above, the memory circuit MR1 includes a switching circuit SW1, a first data retaining section DS1, a data transfer section TS1, a second data retaining section DS2, and a refresh output control section RS1.

The switching circuit SW1 includes a transistor N1 which is an N-channel TFT. The first data retaining section DS1 includes a capacitor (first capacitor) Ca1. The data transfer section TS1 includes a transistor N2 which is an N-channel TFT serving as a transfer element. The second data retaining section DS2 includes a capacitor (second capacitor) Cb1. The refresh output control section RS1 includes a transistor N3 which is an N-channel TFT and a transistor N4 which is an N-channel TFT. The capacitor Ca1 is larger than the capacitor Cb1 in capacitance value.

That is, in FIG. 5, all the transistors constituting the memory circuit are N-channel TFTs (field-effect transistors). Accordingly, the memory circuit MR1 can be easily built into amorphous silicon.

As wires for driving each memory circuit MR1, the memory device 1 includes a reference electric potential wire RL1 (fifth signal line) in addition to the first word line Xi(1) (first signal line), the second word line Xi(2) (second signal line), the third word line Xi(3) (third signal line), and the bit line Yj (fourth signal line).

One and the other of drain/source terminals of a field-effect transistor such as a TFT mentioned above are hereinafter referred to as a first drain/source terminal (first conduction terminal) and a second drain/source terminal (second conduction terminal), respectively. The same applies to the other Examples.

The transistor N1 has a gate terminal (control terminal) which is connected to the first word line Xi(1), a first drain/source terminal which is connected to the bit line Yj, and a second drain/source terminal which is connected to a node (retention node) PIX (first connection point) which is one end of the capacitor Ca1. The other end of the capacitor Ca1 is connected to the reference electric potential wire RL1. In a state in which the transistor N1 is on, the switching circuit SW1 is in a conductive state. Meanwhile, in a case where the transistor N1 is off, the switching circuit SW1 is in a non-conductive state.

The transistor N2 has a gate terminal which is connected to the second word line Xi(2), a first drain/source terminal which is connected to the node PIX (first connection point), and a second drain/source terminal which is connected to a node (retention node) MRY (second connection point) which is one end of the capacitor Cb1. The other end of the capacitor Cb1 is connected to the reference electric potential wire RL1. In a state in which the transistor N2 is on, the data transfer section TS1 is in a state in which the data transfer section TS1 carries out the transfer operation. Meanwhile, in a state in which the transistor N2 is off, the data transfer section TS1 is in a state in which the data transfer section TS1 carries out the non-transfer operation.

The transistor N3 has a gate terminal which is connected, as a control terminal CNT1 of the refresh output control section RS1, to the node MRY, a first drain/source terminal which is connected, as an input terminal IN1 of the refresh output control section RS1, to the second word line Xi(2), and a second drain/source terminal which is connected to a first drain/source terminal of the transistor N4. The transistor N4 has a gate terminal which is connected to the third word line Xi(3), and a second drain/source terminal which is connected, as an output terminal OUT1 of the refresh output control section RS1, to the node PIX. That is, the transistor N3 and the transistor N4 are serially connected to each other between an input of the refresh output control section RS1 and an output of the refresh output control section RS1 so that the transistor N3 is located on the input side of the refresh output control section RS1. Note that the position of the transistor N3 and the position of the transistor N4 in the above example may be exchanged with each other. Namely, it is only necessary that the transistor N3 and the transistor N4 be serially connected to each other between the input of the refresh output control section RS1 and the output of the refresh output control section RS1.

In a state in which the transistor N4 is on, the refresh output control section RS1 is controlled to be a state in which the refresh output control section RS1 carries out the first operation. Meanwhile, in a state in which the transistor N4 is off, the refresh output control section RS1 is controlled to be a state in which the refresh output control section RS1 carries out the second operation. Since the transistor N3 is an N-channel TFT, control information which causes the refresh output control section RS1 to be in an active state during the first operation, i.e., an active level is High, and control information which causes the refresh output control section RS1 to be in a non-active state during the first operation, i.e., a non-active level is Low. The following describes operation of the memory circuit MR1 arranged as above.

First, writing operation of the memory circuit MR1 is described.

The writing operation is carried out as follows. Specifically, the input-output interface 3 receives a writing command and a writing address from an outside of the memory device 1 via a transmission line, and the command decoder 4 interprets the command and shifts into a writing mode. In accordance with a signal indicative of the writing mode of the command decoder 4, the timing generating circuit 5 generates an internal timing signal for the writing operation. The word line control circuit 6 controls a first word line Xi(1), a second word line Xi(2), and a third word line Xi(3) that are selected by the writing address supplied from the input-output interface 3. The writing/reading circuit 7 controls all the bit lines Yj. In the following description, the first word line Xi(1), the second word line Xi(2), and the third word line Xi(3) that are selected by the writing address are referred to as a first word line Xiw(1), a second word line Xiw(2), and a third word line Xiw(3), respectively.

Figure 6:
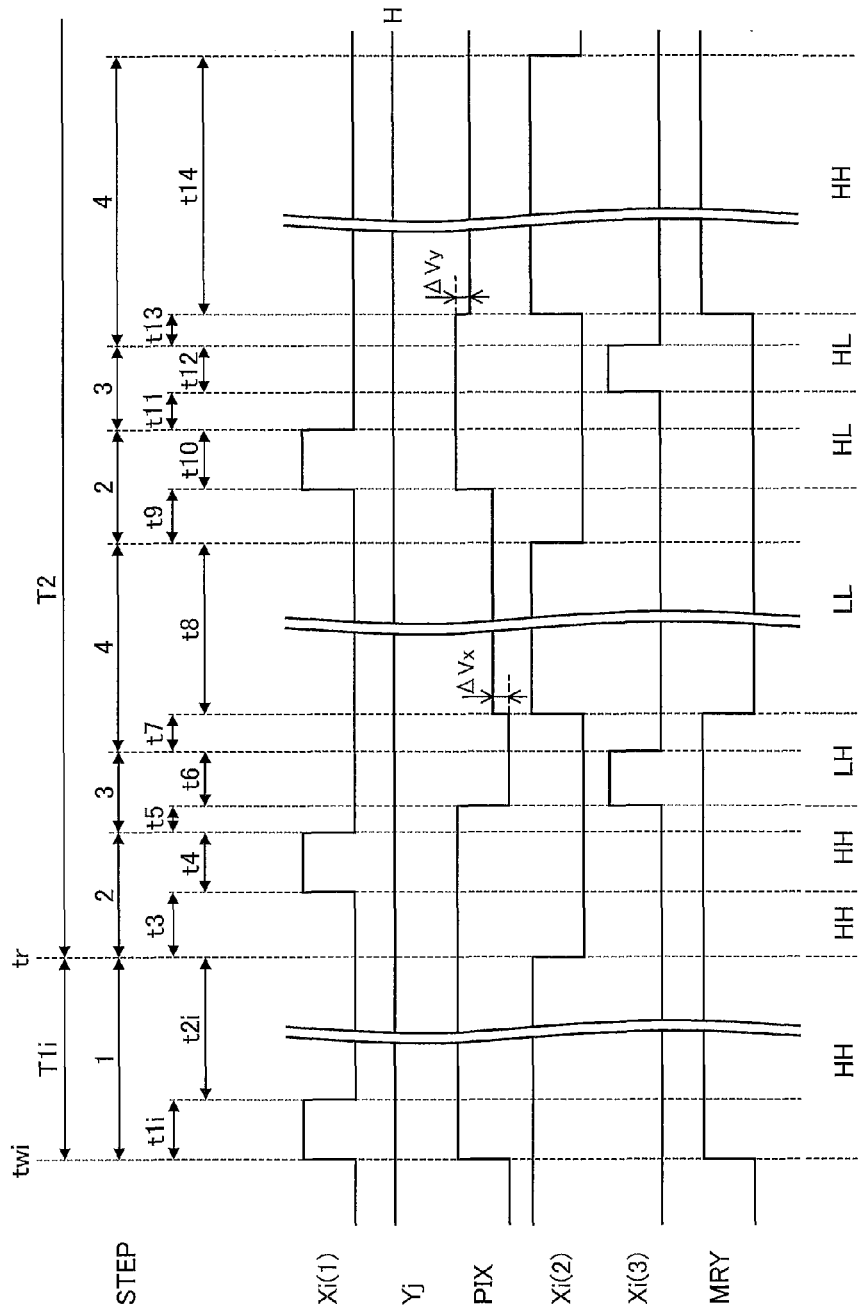
FIG. 6 is a timing chart illustrating a writing operation of the memory circuit of FIG. 5.
Figure 7:
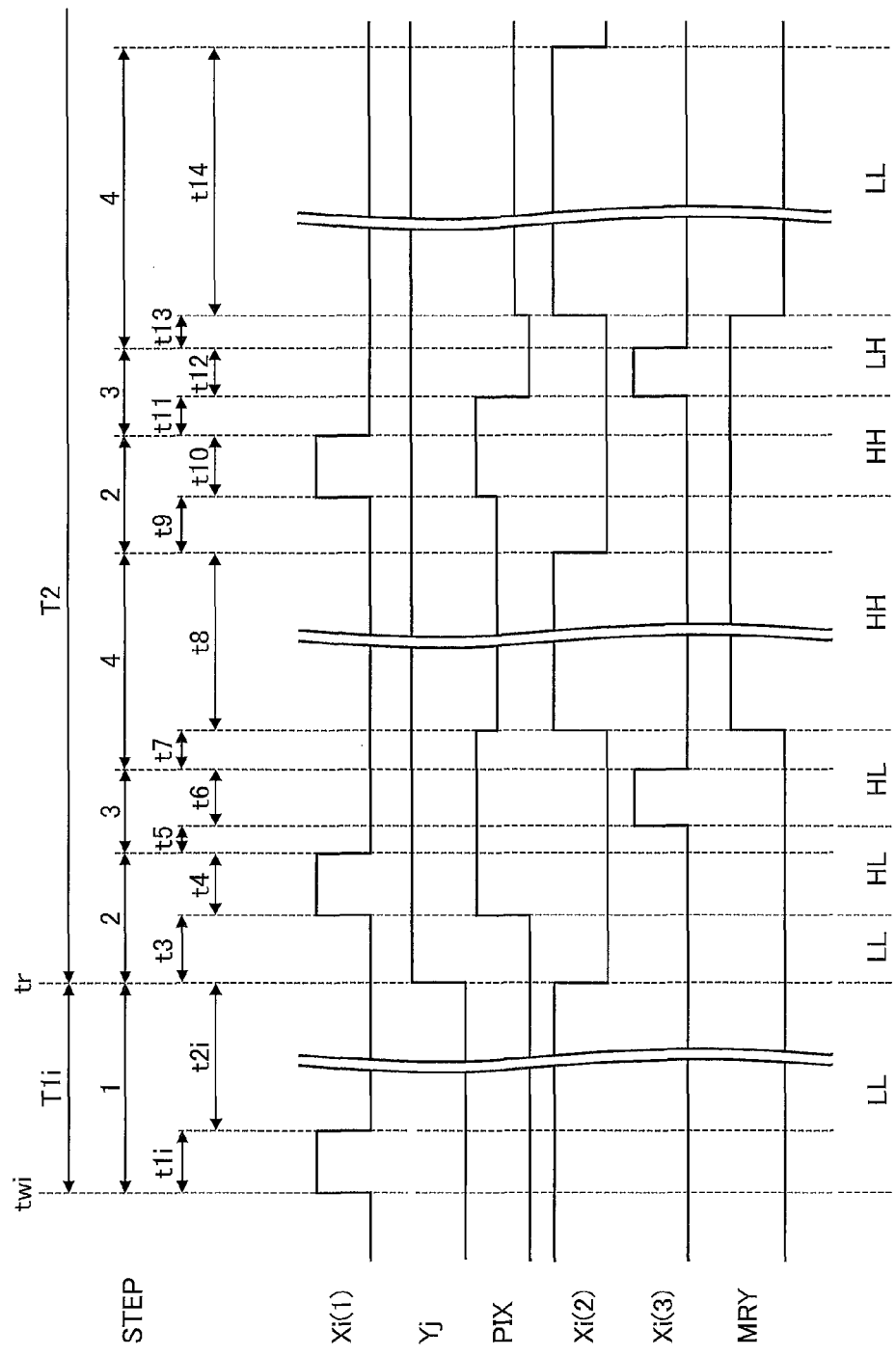
FIG. 7 is a timing chart illustrating another writing operation of the memory circuit of FIG. 5.

FIG. 6 and FIG. 7 illustrate the data writing operation of the memory circuit MR1. In the present Example, in a case where any data is written into memory circuits MR1 of respective different rows, the rows of the memory array 2 which correspond to the writing address are line-sequentially driven. Accordingly, a writing period T1 is determined for each row, and a writing period T1 of an i-th row is referred to as T1$i$. FIG. 6 illustrates a case where High as the first electric potential level is written in the writing period T1$i$, and FIG. 7 illustrates a case where Low as the second electric potential level is written in the writing period T1$i$. In addition, lower portions of FIG. 6 and FIG. 7 illustrate an electric potential of the node PIX (left side) and an electric potential of the node MRY (right side) in periods corresponding to (a) through (h) of FIG. 4.

In FIG. 6, an electric potential of binary levels which are High (active level) and Low (non-active level) is applied from the word line control circuit 6 to the first word line Xiw(1), the second word line Xiw(2), and the third word line Xiw(3). The electric potential of the binary levels, i.e., the High electric potential and the Low electric potential may be set individually for each of the lines. To the bit line Yj, binary logic levels which are High lower than the High electric potential of the first word line Xiw(1) and Low are supplied from the writing/reading circuit 7. The High electric potential of the second word line Xiw(2) is equal to the High electric potential of the bit line Yj or the High electric potential of the first word line Xi(1), and the Low electric potential of the second word line Xiw(2) is equal to the Low electric potential of the binary logic levels. The reference electric potential wire RL1 supplies a constant electric potential.

For the data writing operation, the writing period T1$i$ and the refresh period T2 are provided. The writing period T1$i$ starts at a time twi which is determined for each row. The refresh period T2 starts at a time tr simultaneously for all the rows including rows which do not correspond to the writing address, after the writing of data into the memory circuits MR1 of the rows corresponding to the writing address is finished. The writing period T1$i$ is a period in which a binary logic level corresponding to data to be retained in the memory circuit MR1 is written and which is made up of successive periods t1$i$ and t2$i$. The refresh period T2 is a period in which the binary logic level written into the memory circuit MR1 is retained while being refreshed and which has successive periods t3 through t14.

In the period t1$i$ of the writing period T1$i$, both of the electric potential of the first word line Xiw(1) and the electric potential of the second word line Xiw(2) are High. The electric potential of the third word line Xiw(3) is Low. This causes the transistors N1 and N2 to turn on, which causes the switching circuit SW1 to be in a conductive state and causes the data transfer section TS1 to be in a state in which the data transfer section TS1 carries out the transfer operation. Thus, the first electric potential level (here High) supplied to the bit line Yj is written into the node PIX. In the period t2$i$, the electric potential of the first word line Xiw(1) becomes Low, whereas the electric potential of the second word line Xiw(2) maintains High. The electric potential of the third word line Xiw(3) is Low. This causes the transistor N1 to turn off, which causes the switching circuit SW1 to be in a non-conductive state. Since the transistor N2 maintains the ON state, the data transfer section TS1 maintains the state in which the data transfer section TS1 carries out the transfer operation. Accordingly, the first electric potential level is transferred from the node PIX to the node MRY, and the nodes PIX and MRY are disconnected from the bit line Yj. The above process corresponds to the state in (a) of FIG. 4.

Next, the refresh period T2 starts. In the refresh period T2, the electric potential of the bit line Yj is High which is the first electric potential level. As for the first word line Xi(1), the second word line Xi(2), and the third word line Xi(3), driving described below is carried out for all the values of i (1≤i≤n). That is, the refresh operation is carried out simultaneously for all the memory cells 8 (this may be hereinafter referred to as "entire refresh operation").

In the period t3 of the refresh period T2, the electric potential of the first word line Xi(1) is Low, the electric potential of the second word line Xi(2) is Low, and the electric potential of the third word line Xi(3) is Low. This causes the transistor N2 to turn off, which causes the data transfer section TS1 to be in a state in which the data transfer section TS1 carries out the non-transfer operation. Thus, the node PIX and the node MRY are disconnected from each other. Both of the node PIX and the node MRY maintain High. The above process corresponds to the state in (b) of FIG. 4.

In the period t4, the electric potential of the first word line Xi(1) becomes High, the electric potential of the second word line Xi(2) maintains Low, and the electric potential of the third word line Xi(3) maintains Low. This causes the transistor N1 to turn on, which causes the switching circuit SW1 to be in a conductive state. Thus, the High electric potential is written into the node PIX from the bit line Yj again.

In the period t5, the electric potential of the first word line Xi(1) becomes Low, the electric potential of the second word line Xi(2) maintains Low, and the electric potential of the third word line Xi(3) maintains Low. This causes the transistor N1 to turn off, which causes the switching circuit SW1 to be in a non-conductive state. Thus, the node PIX is disconnected from the bit line Yj, and maintains High.

The process in the period t4 through the period t5 corresponds to the state in (c) of FIG. 4.

In the period t6, the electric potential of the first word line Xi(1) maintains Low, the electric potential of the second word line Xi(2) maintains Low, and the electric potential of the third word line Xi(3) becomes High. This causes the transistor N4 to turn on, which causes the refresh output control section RS1 to carry out the first operation. Since the electric potential of the node MRY is High, the transistor N3 is in an ON state. Accordingly, the refresh output control section RS1 is in an active state, and a Low electric potential is supplied from the second word line Xi(2) via the transistors N3 and N4 to the node PIX. The second word line Xi(2) also functions as the voltage supply VS1 in FIG. 3.

In the period t7, the electric potential of the first word line Xi(1) maintains Low, the electric potential of the second word line Xi(2) maintains Low, and the electric potential of the third word line Xi(3) becomes Low. This causes the transistor N4 to turn off, which causes the refresh output control section RS1 to carry out the second operation. The node PIX is disconnected from the second word line Xi(2), and maintains Low.

The process in the period t6 through the period t7 corresponds to the state in (d) of FIG. 4.

In the period t8, the electric potential of the first word line Xi(1) maintains Low, the electric potential of the second word line Xi(2) becomes High, and the electric potential of the third word line Xi(3) maintains Low. This causes the transistor N2 to turn on, which causes the data transfer section TS1 to be in a state in which the data transfer section TS1 carries out the transfer operation. Here, movement of an electric charge occurs between the capacitor Ca1 and the capacitor Cb1. This causes both of the electric potential of the node PIX and the electric potential of the node MRY to be Low. The electric potential of the node PIX rises by a slight voltage ΔVx due to movement of a positive electric charge from the capacitor Cb1 to the capacitor Ca1 via the transistor N2, but falls within a range of a Low electric potential.

The period t8 is a period in which refreshed binary logic data is retained in both of the first data retaining section DS1 and the second data retaining section DS2 which are connected to each other via the data transfer section TS1, and the period t8 can be set long. The same is true for the Examples and Embodiments below.

In the period t9, the electric potential of the first word line Xi(1) maintains Low, the electric potential of the second word line Xi(2) becomes Low, and the electric potential of the third word line Xi(3) maintains Low. This causes the transistor N2 to turn off, which causes the data transfer section TS1 to be in a state in which the data transfer section TS1 carries out the non-transfer operation. The node PIX and the node MRY are disconnected from each other. Both of the node PIX and the node MRY maintain Low. The process in the period t8 through the period t9 corresponds to the state in (e) of FIG. 4.

In the period t10, the electric potential of the first word line Xi(1) becomes High, the electric potential of the second word line Xi(2) maintains Low, and the electric potential of the third word line Xi(3) maintains Low. This causes the transistor N1 to turn on, which causes the switching circuit SW1 to be in a conductive state. Thus, the High electric potential is written to the node PIX from the bit line Yj again.

In the period t11, the electric potential of the first word line Xi(1) becomes Low, the electric potential of the second word line Xi(2) maintains Low, and the electric potential of the third word line Xi(3) maintains Low. This causes the transistor N1 to turn off, which causes the switching circuit SW1 to be in a non-conductive state. Thus, the node PIX is disconnected from the bit line Yj, and maintains High.

The process in the period t10 through the period t11 corresponds to the state in (f) of FIG. 4.

In the period t12, the electric potential of the first word line Xi(1) maintains Low, the electric potential of the second word line Xi(2) maintains Low, and the electric potential of the third word line Xi(3) becomes High. This causes the transistor N4 to turn on, which causes the refresh output control section RS1 to be in a state in which the refresh output control section RS1 carries out the first operation. Since the electric potential of the node MRY is Low, the transistor N3 is in an OFF state. This causes the refresh output control section RS1 to be in a non-active state, in which the refresh output control section RS1 stops carrying out the output. Accordingly, the node PIX maintains High.

In the period t13, the electric potential of the first word line Xi(1) maintains Low, the electric potential of the second word line Xi(2) maintains Low, and the electric potential of the third word line Xi(3) becomes Low. This causes the transistor N4 to turn off, which causes the refresh output control section RS1 to be in a state in which the refresh output control section RS1 carries out the second operation. The node PIX maintains High.

The process in the period t12 through the period t13 corresponds to the state in (g) of FIG. 4.

In the period t14, the electric potential of the first word line Xi(1) maintains Low, the electric potential of the second word line Xi(2) becomes High, and the electric potential of the third word line Xi(3) maintains Low. This causes the transistor N2 to turn on, which causes the data transfer section TS1 to be in a state in which the data transfer section TS1 carries out the transfer operation. Here, movement of an electric charge occurs between the capacitor Ca1 and the capacitor Cb1. This causes both of the electric potential of the node PIX and the electric potential of the node MRY to be High. The electric potential of the node PIX declines by a slight voltage ΔVy due to movement of a positive electric charge from the capacitor Ca1 to the capacitor Cb1 via the transistor N2, but falls within a range of a High electric potential. The above process corresponds to the state in (h) of FIG. 4.

The period t14 is a period in which refreshed binary logic data is retained in both of the first data retaining section DS1 and the second data retaining section DS2 which are connected to each other via the data transfer section TS1, and the period t14 can be set long. The same is true for the Examples below.

As a result of the above operation, the electric potential of the node PIX is High in the period t1i through the period t5 and the period t10 through the period t14 and is Low in the period t6 through the period t9, and the electric potential of the node MRY is High in the period t1i through the period t7 and the period t14 and is Low in the period t8 through the period t13.

Thereafter, in a case where the refresh period T2 is continued, the command decoder 4 repeats the operation in the period t3 through the period t14. In a case where new data is written or the data is read out, the command decoder 4 finishes the refresh period T2 so as to terminate the entire refresh operation mode.

The above description has discussed the case of FIG. 6.

Note that it is also possible that the command for the entire refresh operation is generated not from an externally supplied signal but from a clock which is internally generated by an oscillator or the like. This makes it unnecessary for an external system to supply a refresh command at regular time intervals, thereby producing an advantage of allowing flexible system construction. In a dynamic memory circuit using the memory cell 8 according to the present Example, it is unnecessary to carry out the entire refresh operation by performing scan for each word line, and the entire refresh operation can be carried out simultaneously for an entire array. This eliminates the need for a peripheral circuit which is necessary, in a general conventional dynamic memory circuit, for refreshing an electric potential of a bit line Yj while performing destructive read.

Next, the following discusses the case of FIG. 7.

In FIG. 7, Low as the second electric potential level is written into the memory cell 8 in the writing period T1i. However, in FIG. 7, the electric potentials of the first word line Xi(1), the second word line Xi(2), and the third word line Xi(3) are changed in the periods in a similar manner to FIG. 6 except for that the electric potential of the bit line Yj is Low in the writing period T1i.

Accordingly, the electric potential of the node PIX is Low in the period t1i through the period t3 and the period t12 through the period t14 and is High in the period t4 through the period t11, and the electric potential of the node MRY is Low in the period t1i through the period t7 and the period t14 and is High in the period t8 through the period t13.

Although (a) through (h) of FIG. 4 illustrate transition of the state of the memory cell 8, the operation of the memory circuit MR1 in FIG. 6 and FIG. 7 can be classified into the following operation steps.

(1) First Step (the Period t1i Through the Period t2i (the Writing Period T1i))

In the first step, a state is achieved in which (i) a binary logic level corresponding to data is being supplied from the writing/reading circuit 7 to the bit line Yj and (ii) the refresh output control section RS1 is carrying out the second operation. In the state, the switching circuit SW1 is made conductive, which allows the binary logic level to be written into the memory cell 8. Then, in a state in which (i) the binary logic level is being written into the memory cell 8 and (ii) the refresh output control section RS1 is carrying out the second operation, the data transfer section TS1 carries out the transfer operation.

(2) Second Step (Each of the Period t3 Through the Period t4 and the Period t9 Through the Period t10)

In the second step following the first step, a state is achieved in which (i) the refresh output control section RS1 is carrying out the second operation and (ii) the data transfer section TS1 is carrying out the non-transfer operation. In the state, the switching circuit SW1 is made conductive. This causes a binary logic level same as a level equivalent to control information which causes the refresh output control section RS1 to be in an active state to be supplied to the first data retaining section DS1 via the bit line Yj.

(3) Third Step (Each of the Period t5 Through the Period t6 and the Period t11 Through the Period t12)

In the third step following the second step, a state is achieved in which (i) the switching circuit SW1 is being made non-conductive and (ii) the data transfer section TS1 is carrying out the non-transfer operation. In the state, the refresh output control section RS1 carries out the first operation. At the end of the first operation, a state is achieved in which a binary logic level reverse to a level equivalent to control information which causes the refresh output control section RS1 to be in an active state is supplied from the voltage supply VS1 to the input of the refresh output control section RS1.

(4) Fourth Step (Each of the Period t7 Through the Period t8 and the Period t13 Through the Period t14)

In the fourth step following the third step, a state is achieved in which (i) the switching circuit SW1 is being made non-conductive and (ii) the refresh output control section RS1 is carrying out the second operation. In the state, the data transfer section TS1 carries out the transfer operation.

As for the whole writing operation, the first step is executed first and, subsequently to the first step, the series of the operations from the start of the second step to the end of the fourth step (the period t3 through the period t8) is executed at least once.

Next, the reading operation of the memory circuit MR1 is described.

The reading operation is carried out as follows. Specifically, the input-output interface 3 receives a reading command and a reading address from an outside of the memory device 1 via a transmission line, and the command decoder 4 interprets the command and shifts into a reading mode. In accordance with a signal indicative of the reading mode of the command decoder 4, the timing generating circuit 5 generates an internal timing signal for the reading operation. The word line control circuit 6 controls a first word line Xi(1), a second word line Xi(2), and a third word line Xi(3) that are selected by the reading address supplied from the input-output interface 3. The writing/reading circuit 7 controls all the bit lines Yj. In the following description, the first word line Xi(1), the second word line Xi(2), and the third word line Xi(3) that are selected by the reading address are referred to as a first word line Xir(1), a second word line Xir(2), and a third word line Xir(3), respectively.

The operation of the memory cell 8 is described with reference to FIG. 8.

Figure 8:
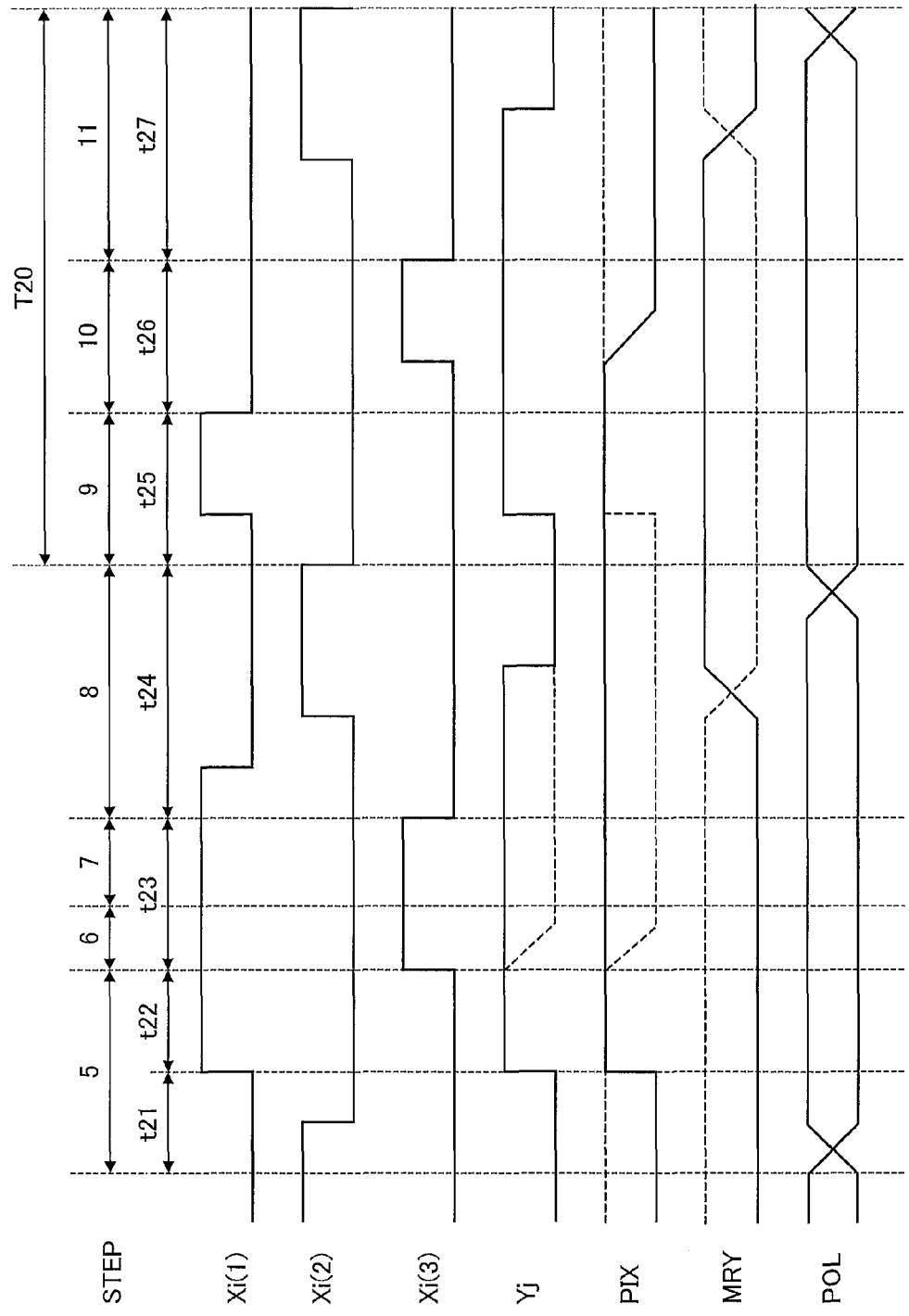
FIG. 8 is a timing chart illustrating a reading operation of the memory circuit of FIG. 5.

FIG. 8 illustrates electric potential waveforms of the first word line Xir(1), the second word line Xir(2), the third word line Xir(3), each bit line Yj, the node PIX, and the node MRY, and a waveform of a polarity signal POL.

The polarity signal POL is an internal signal indicative of a polarity of data retained in the node PIX. In the memory cell 8 of the present embodiment, the electric potential of the node PIX is level-reversed from High to Low or Low to High every time the refresh operation is carried out. Accordingly, a polarity of current data of the memory cell 8 is retained with the use of the polarity signal POL. That is, a polarity of the polarity signal POL is reversed every refresh operation. Thus, even in a case where a data polarity is reversed every refresh, it is possible to correctly read whether data written at a certain timing is "0" or "1". The polarity signal POL may be controlled by the writing/reading circuit 7 or may be controlled by the timing generating circuit 5.

FIG. 9 shows one example of how the polarity signal POL, data, and the electric potential of the bit line Yj are related with each other. The polarity signal POL is switched between "0" and "1" every time the data is retained in the memory cell 8 and refreshed. For example, it is assumed that data written into the memory cell 8 in a case where the polarity signal POL is 0 is "0" and a binary logic level supplied corresponding to the data is "L". In this case, a binary logic level of "L" is retained in the memory cell 8 in a case where the polarity signal POL is "0", whereas a binary logic level of "H" is retained in the memory cell 8 in a case where the polarity signal POL is "1".

In the reading mode, a first set period t21, a pre-charge period t22, a sense period t23, a second set period t24, and a refresh period T20 are provided in this order. The refresh period T20 may be executed simultaneously for all the rows corresponding to the reading address after successive operations in the first set period t21, the pre-charge period t22, the sense period t23, and the second set period t24 are carried out sequentially for each of the rows corresponding to the reading address. Alternatively, successive operations in the first set period t21, the pre-charge period t22, the sense period t23, the second set period t24, and the refresh period T20 may be carried out sequentially for each of the rows corresponding to the reading address.

When the reading mode starts, the first set period t21 starts first in which the polarity of the polarity signal POL is reversed, and then the electric potential of the second word line Xir(2) is made Low.

Next, the pre-charge period t22 starts in which the electric potential of the first word line Xir(1) is made High, and electric potentials of all the bit lines Yj are made High (binary logic level same as a level equivalent to control information which causes the refresh control section RS1 to be in an active state during the first operation). Further, the writing/reading circuit 7 causes all the bit lines Yj to be in a high impedance state.

Next, the sense period t23 starts in which the electric potential of the third word line Xir(3) is made High. This causes the transistor N4 to turn on, which causes the refresh output control section RS1 to be in a state in which the refresh output control section RS1 carries out the first operation. Here, in a case where an electric potential retained in the node MRY is High, the refresh output control section RS1 is in an active state, and the transistor N3 is turned on. This causes a positive electric charge of the bit line Yj to be discharged into the second word line Xir(2), thereby making the bit line Yj Low (see the broken line in FIG. 8). Meanwhile, in a case where the electric potential retained in the node MRY is Low, the refresh output control section RS1 is in a non-active state, and the transistor N3 is turned off. Accordingly, the bit line Yj maintains the High electric potential (see the solid line in FIG. 8).

Accordingly, data of a selected address can be read by causing the writing/reading circuit 7 to sense an electric potential of each bit line Yj and by determining output data in accordance with the polarity signal POL as shown in FIG. 9. The data thus read is supplied to an outside by the input-output interface 3. At the end of the sense period t23, the electric potential of the third word line Xir(3) is made Low, and the transistor N4 is turned off, thereby causing the refresh output control section RS1 to be in a state in which the refresh output control section RS1 carries out the second operation.

Next, the second set period t24 starts. In the second set period t24, first, the electric potential of the first word line Xir(1) is made Low. This causes the transistor N1 to turn off, i.e., causes the switching circuit SW1 to be in a non-conductive state. Subsequently, in this state, the electric potential of the second word line Xir(2) is made High, so that the transistor N2 is turned on. This causes the data transfer section TS1 to be in a state in which the data transfer section TS1 carries out the transfer operation, and causes the node PIX and the node MRY to be connected to each other. Thus, a binary logic level is transferred from the node PIX to the node MRY. Accordingly, a data polarity of the node MRY becomes identical to a data polarity of the node PIX. As a result, a state in achieved in which the data polarities retained in the nodes PIX and MRY before the reading are reversed. Subsequently, the electric potential of each bit line Yj is made Low by the writing/reading circuit 7. Before the end of the second set period t24, the polarity of the polarity signal POL is reversed.

Next, the refresh period T20 starts. In the refresh period T20, only a word line corresponding to a selected address is controlled so that refresh operation of only 1 address is carried out. Thus, the polarities of the nodes PIX and MRY which have been reversed by the reading operation are returned to the original polarities. In the refresh period T20, similar operation to the refresh operation in the writing mode described with reference to FIG. 6 and FIG. 7 is carried out.

First, the period t25 starts in which the electric potential of the second word line Xir(2) becomes Low. This causes the transistor N2 to turn off, which causes the data transfer section TS1 to be in a state in which the data transfer section TS1 carries out the non-transfer operation. Next, the electric potential of the first word line Xir(1) becomes High, and an electric potential of each bit line Yj is made High by the writing/reading circuit 7. This change in electric potential of the bit line Yj may be made from the start of the refresh period t25, as in FIG. 6 and FIG. 7. This causes the transistor N1 to turn on, i.e., causes the switching circuit SW1 to be in a conductive state. Thus, the electric potential of the node PIX becomes High.

Next, the period t26 starts in which the electric potential of the third word line Xir(3) becomes High. This causes the transistor N4 to turn on, i.e., causes the refresh output control section RS1 to be in a state in which the refresh output control section RS1 carries out the first operation. Here, in a case where the electric potential of the node MRY is High, the transistor N3 is in an ON state. This causes the refresh output control section RS1 to be in an active state. Accordingly, the node PIX is charged to Low which is the electric potential of the second word line Xir(2).

Meanwhile, in a case where the electric potential of the node MRY is Low, the transistor N3 is in an OFF state. This causes the refresh output control section RS1 to be in a non-active state. Accordingly, the node PIX maintains the High electric potential.

Next, the period t27 starts in which the electric potential of the third word line Xir(3) becomes Low. This causes the transistor N4 to turn off, i.e., causes the refresh output control section RS1 to be in a state in which the refresh output control section RS1 carries out the second operation. Subsequently, the electric potential of the second word line Xir(2) becomes High. This causes the transistor N2 to turn on, i.e., causes the data transfer section TS1 to be in a state in which the data transfer section TS1 carries out the transfer operation. Thus, data of the node PIX is transferred to the node MRY, thereby causing the nodes PIX and MRY to be refreshed to identical polarities to the electric potentials obtained immediately before the reading. An electric potential of each bit line Yj is returned to Low. Before the end of the period t27, the polarity of the polarity signal POL is reversed.

This period in which the electric potential of the second word line Xir(2) is High out of the period t27 is a period in which refreshed binary logic data is retained in both of the first data retaining section DS1 and the second data retaining section DS2 that are connected to each other via the data transfer section TS1, and this period can be set long as in the case of the writing operation. This stabilizes the electric potentials of the nodes PIX and MRY. Consequently, an operation error is less likely to occur in the memory cell 8.

The refresh operation of the memory cell 8 corresponding to the reading address may end after the operation in the period T20 is executed once or subsequently the same operation as that executed in the period T20 may be repeated. In a case where the same refresh operation is repeated, the electric potential polarities of the nodes PIX and MRY are reversed once every time the refresh operation is carried out once.

In the reading mode, data is read in a state in which the capacitor of the bit line Yj is sufficiently charged. Accordingly, in restoring data after the reading, it is unnecessary to provide a peripheral circuit which is necessary, in a general conventional dynamic memory circuit, for refreshing an electric potential of a bit line while performing destructive read.

The operation of the memory circuit MR1 in FIG. 8 can be classified into the following operation steps.

(1) Fifth Step (The Period t21 Through the Period t22)

In the fifth step, a state in achieved in which (i) a binary logic level that is same as a level equivalent to the control information which causes the refresh output control section RS1 to be in an active state is being supplied from the writing/reading circuit 7 to the bit line Yj, (ii) the data transfer section TS1 is carrying out the non-transfer operation, and (iii) the refresh output control section RS1 is carrying out the second operation. In the state, the switching circuit SW1 is made conductive. Thus, the binary logic level is written into the memory cell 8.

(2) Sixth Step (The Period t23)

In the sixth step following the fifth step, a state is achieved in which (i) the switching circuit SW1 is being made conductive and (ii) the data transfer section TS1 is carrying out the non-transfer operation. In the state, the refresh output control section RS1 carries out the first operation.

(3) Seventh Step (The Period t23)

In the seventh step following the sixth step, a state is achieved in which (i) the switching circuit SW1 is being made conductive and (ii) the data transfer section TS1 is carrying out the non-transfer operation. In the state, the writing/reading circuit 7 senses the electric potential of the bit line Yj. Thus, data retained in the memory cell 8 is determined.

(4) Eighth Step (The Period t24)

In the eighth step following the seventh step, a state is achieved in which (i) the switching circuit SW1 is being made non-conductive and (ii) the refresh output control section RS1 is carrying out the second operation. In the state, the data transfer section TS1 carries out the transfer operation.

(5) Ninth Step (The Period t25)

In the ninth step following the eighth step, a state is achieved in which (i) the data transfer section TS1 is carrying out the non-transfer operation, (ii) a binary logic level that is same as a level equivalent to the control information which causes the refresh output control section RS1 to be in an active state is being supplied from the writing/reading circuit 7 to the bit line Yj, and (iii) the refresh output control section RS1 is carrying out the second operation. In the state, the switching circuit SW1 is made conductive.

(6) Tenth Step (The Period t26)

In the tenth step following the ninth step, a state is achieved in which (i) the switching circuit SW1 is being made non-conductive and (ii) the data transfer section TS1 is carrying out the non-transfer operation. In the state, the refresh output control section RS1 carries out the first operation.

(7) Eleventh Step (The Period t27)

In the eleventh step following the tenth step, a state is achieved in which (i) the switching circuit SW1 is being made non-conductive and (ii) the refresh output control section RS1 is carrying out the second operation. In the state, the data transfer section TS1 carries out the transfer operation.

As for the whole reading operation, the fifth step through the eighth step are executed first and, subsequently to the eighth step, the series of the operations from the start of the ninth step to the end of the eleventh step (the period t25 through the period t27 (the refresh period T20)) is executed at least once.

In the arrangement of the memory circuit MR1, it is ideal that the electric potentials of the node PIX and the node MRY are stably switched between High and Low as shown in FIG.

Figure 10:
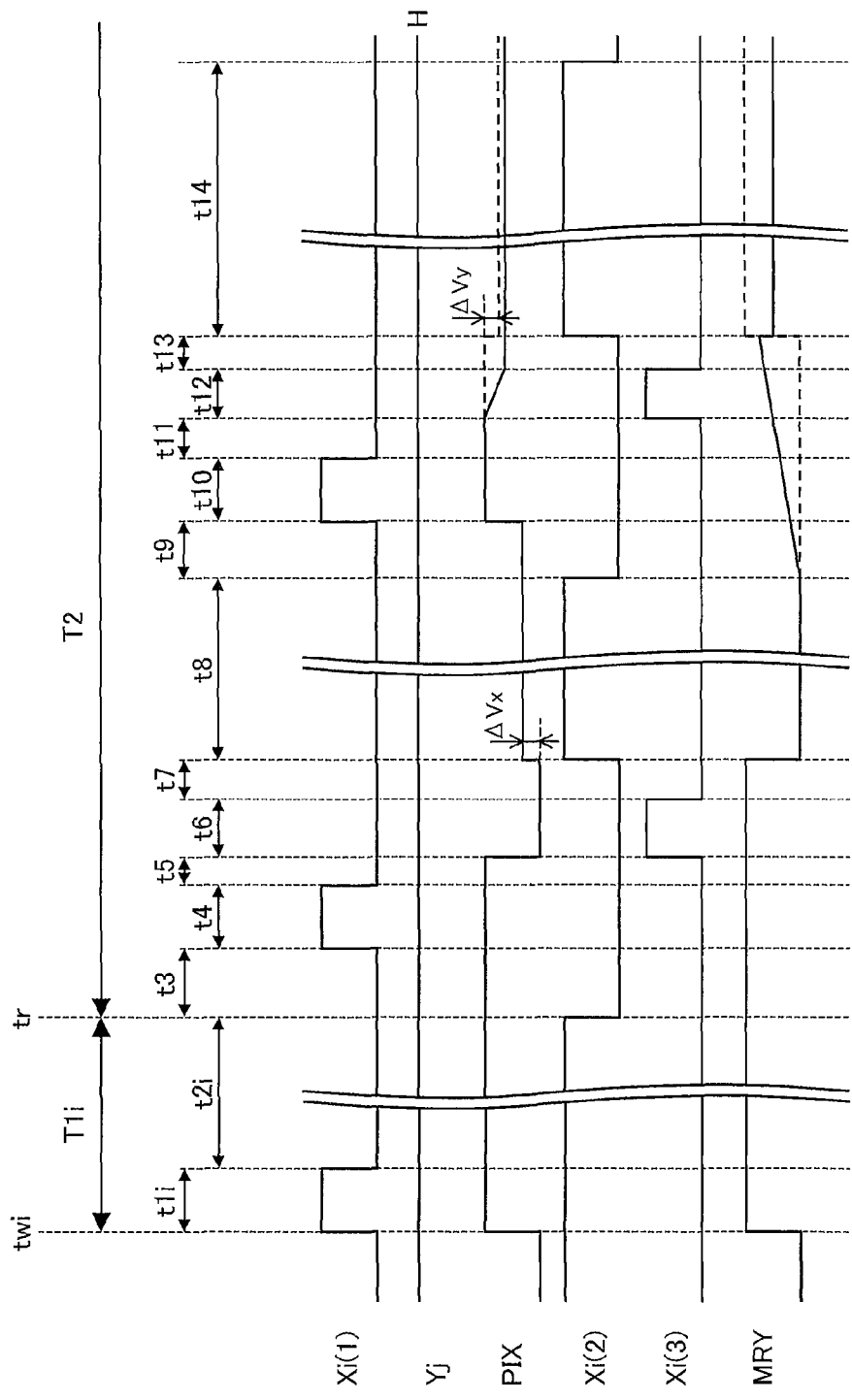
FIG. 10 is a timing chart illustrating how the memory circuit of FIG. 5 operates in a case where an operation error occurs in the memory circuit due to an electric potential change of a node MRY.

6 etc., but actually an operation error may occur due to an electric potential change caused by noise and leakage current. FIG. 10 illustrates operation waveforms obtained in a case where an operation error occurs due to an electric potential change of the node PIX and the node MRY in FIG. 5. Note that the dotted lines of the node PIX and the node MRY in FIG. 10 indicate ideal waveforms of FIG. 6.

In the period (t8) in which the electric potential of the second word line Xi(2) is High, the transistor N2 is on. This causes the node PIX and the node MRY to be connected to each other. Thus, movement of an electric charge occurs between the capacitor Ca1 and the capacitor Cb1. Accordingly, the electric potential of the node MRY becomes Low (see FIG. 10). Subsequently, in a case where the electric potential of the second word line Xi(2) becomes Low (the period t9), the transistor N2 is turned off. This causes the node PIX and the node MRY to be disconnected from each other, which causes the node MRY to be in a floating state. Since an electric potential change is likely to occur in a floating state, the electric potential of the node MRY rises in a case where leakage and/or noise from the reference electric potential wire RL1 occurs.

Subsequently, when the electric potential of the first word line Xi(1) becomes High (the period t10), the transistor N1 is turned on. This causes the switch circuit SW1 to be in a conductive state. Accordingly, the High electric potential is written to the node PIX from the bit line Yj again.

Next, when the electric potential of the third word line Xi(3) becomes High (the period t12), the transistor N4 is turned on. At this point, the node MRY is still in a floating state, and therefore keeps the increased electric potential. Accordingly, the transistor N3, which should be off, turns on. This causes the node PIX to be connected to the second word line Xi(2) via the transistors N4 and N3, thereby causing the electric potential of the node PIX to decline from High to Low.

Subsequently, when the electric potential of the second word line Xi(2) becomes High (the period t14), the transistor N2 is turned on. This causes the node PIX and the node MRY to be connected to each other via the transistor N2. Accordingly, movement of an electric charge occurs between the capacitor Ca1 and the capacitor Cb1. Here, because of the decline of the electric potential of the node PIX from High in the period t12, a High electric potential (see the dotted lines in FIG. 10), which should be transferred to the node MRY, is not transferred to the node MRY. Accordingly, both of the node PIX and the node MRY have an electric potential which cannot be discriminated between High and Low. Consequently, an operation error occurs in the memory circuit MR1. Applying a memory device including such a memory circuit MR1 to a liquid crystal display device causes a deterioration in display quality.

Figure 11:
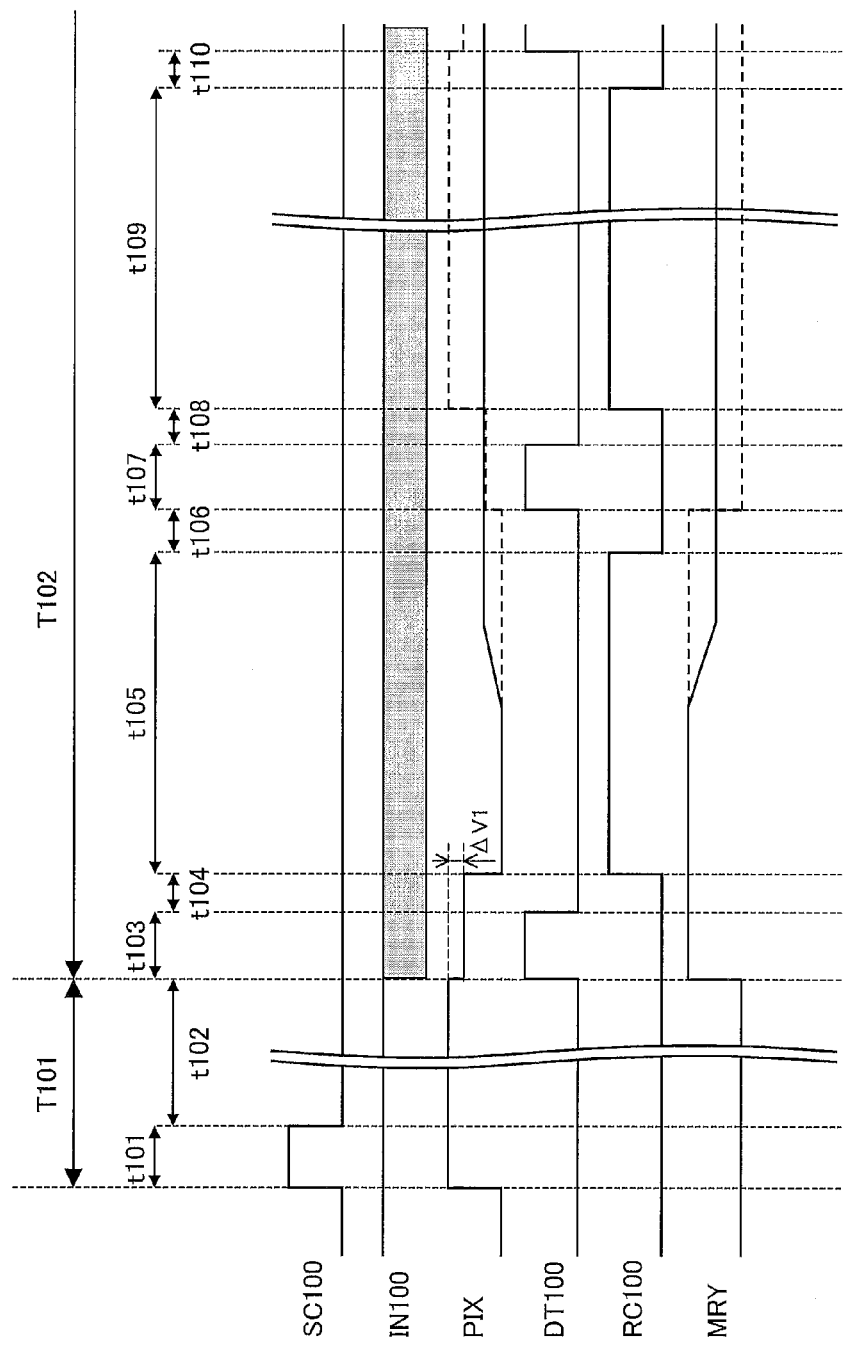
FIG. 11 is a timing chart illustrating how a conventional memory circuit of FIG. 25 operates in a case where an operation error occurs in the conventional memory circuit due to an electric potential change of a node MRY.
Figure 24:
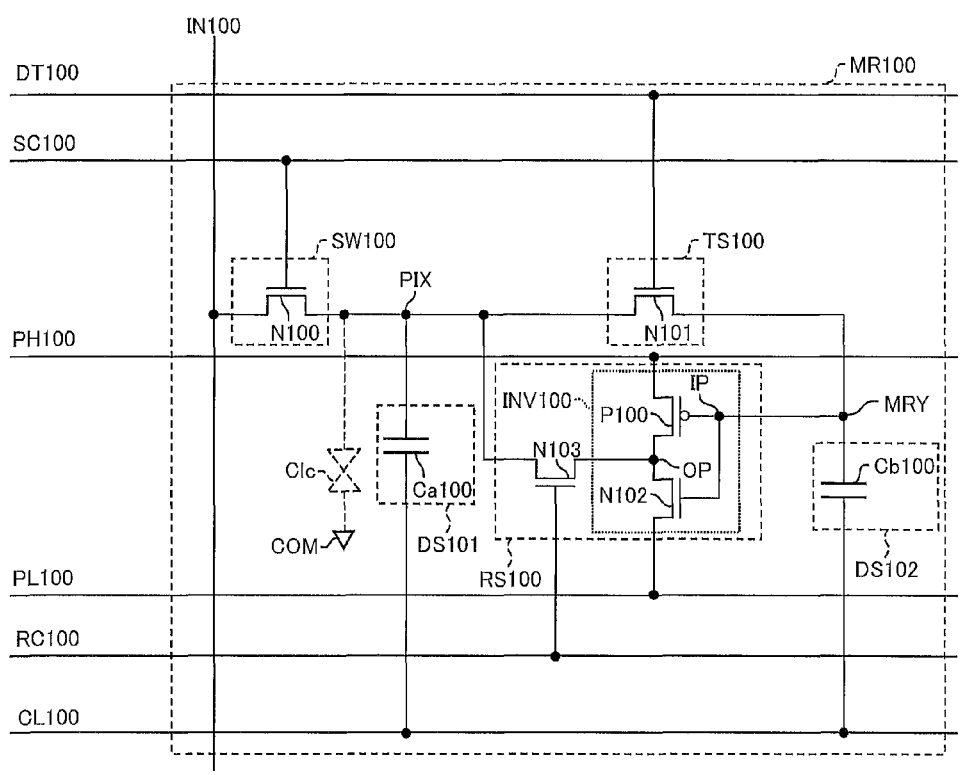
FIG. 24, which shows a conventional art, is a circuit diagram illustrating an arrangement of a memory circuit.

Such an operation error can occur also in a conventional memory circuit MR100. FIG. 11 illustrates operation waveforms obtained in a case where an operation error occurs due to an electric potential change of the node MRY in FIG. 25. As illustrated in FIG. 11, in a case where, in the period t105, leakage and/or noise from the capacitor wire CL100 occur in a state in which the node MRY maintains a High electric potential due to the capacitor Cb100, the electric potential of the node MRY declines. This causes the transistor N102 to shift from an ON state to an OFF state, and causes the transistor P100 to shift from an OFF state to an ON state (see FIG. 24). In accordance with this, the electric potential of the node PIX connected to the output terminal OP rises from Low. Here, both of the node MRY and the node PIX have a midpoint electric potential between a High electric potential and a Low electric potential, i.e., have an electric potential which cannot be discriminated between High and Low. Accordingly, an operation error occurs in the memory circuit MR100. Moreover, once the electric potential is maintained at the midpoint electric potential, a normal operation cannot be regained unless the transistor N100 is turned on again so that an electric potential is written from the data input line IN100 to the capacitor Ca100

In order to avoid the operation error as shown in FIG. 10 and FIG. 11, the present memory circuit MR1 has, in addition to the above arrangement, an arrangement in which the electric potential of the node MRY which is in a floating state is stabilized at Low so that a rise of the electric potential of the node MRY is prevented, and thereby an electric potential change of the node PIX is prevented. This is described below with reference to Examples.

Example 1

Figure 12:
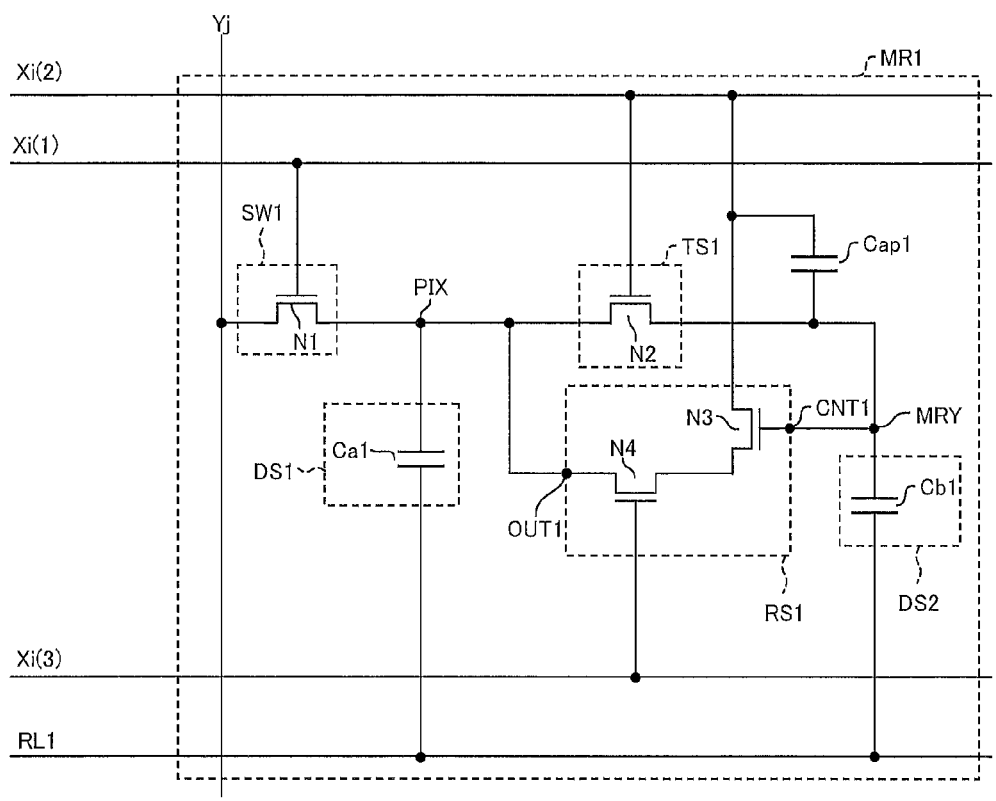
FIG. 12, which shows the embodiment of the present invention, is a circuit diagram illustrating an arrangement of a memory circuit of Example 1.
Figure 13:
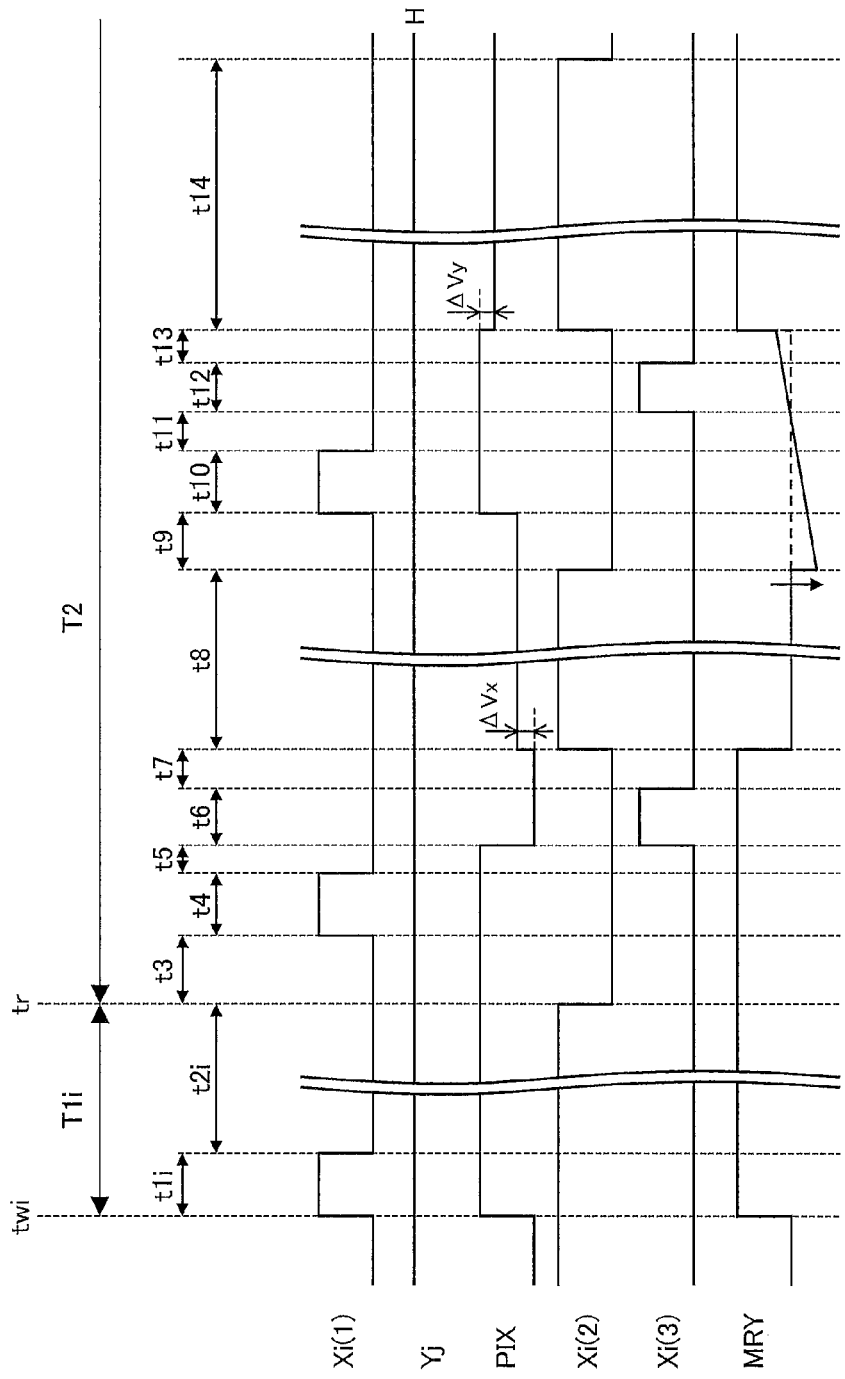
FIG. 13 is a timing chart illustrating a writing operation of the memory circuit of FIG. 12.

The present memory circuit MR1 includes a capacitor Cap1 between a gate electrode (control terminal) of the transistor N3 and a source electrode (first conduction terminal) of the transistor N3 which source electrode is connected to the second word line Xi(2). FIG. 12 is a circuit diagram of a memory circuit MR1 which includes the capacitor Cap1, and FIG. 13 is a timing chart illustrating operation of the memory circuit MR1. As illustrated in FIG. 13, when the electric potential of the second word line Xi(2) is changed from High to Low, an electric potential change occurs due to a feedthrough voltage generated due to the capacitor Cap1. This reduces the electric potential of the node MRY (the arrow in FIG. 13). Since the degree of the reduction of the electric potential varies depending on a size of the capacitor Cap1, the capacitor Cap1 is set so that the electric potential of the node MRY does not reach an electric potential which causes the transistor N3 to turn on in a period (the period t12) in which the electric potential of the third word line Xi(3) is High.

In a case where the electric potential of the node MRY is reduced due to the capacitor Cap1 thus set, the electric potential of the node MRY is not increased to such an extent as to turn the transistor N3 on, in the period t12 in which the electric potential of the third word line Xi(3) becomes High and the transistor N4 turns on. Accordingly, the transistor N3 maintains an OFF state. Since the node PIX is not conductive with the second word line Xi(2) via the transistor N3, the node PIX can maintain a High electric potential. Accordingly, in the period t14 in which the electric potential of the second word line Xi(2) becomes High and the transistor N2 turns on, proper movement of an electric charge occurs between the capacitor Ca1 and the capacitor Cb1. Consequently, both of the electric potential of the node PIX and the electric potential of the node MRY become High. It is therefore possible to prevent an operation error in the memory circuit MR1.

The following describes a liquid crystal display device including the memory device 1.

Figure 14:
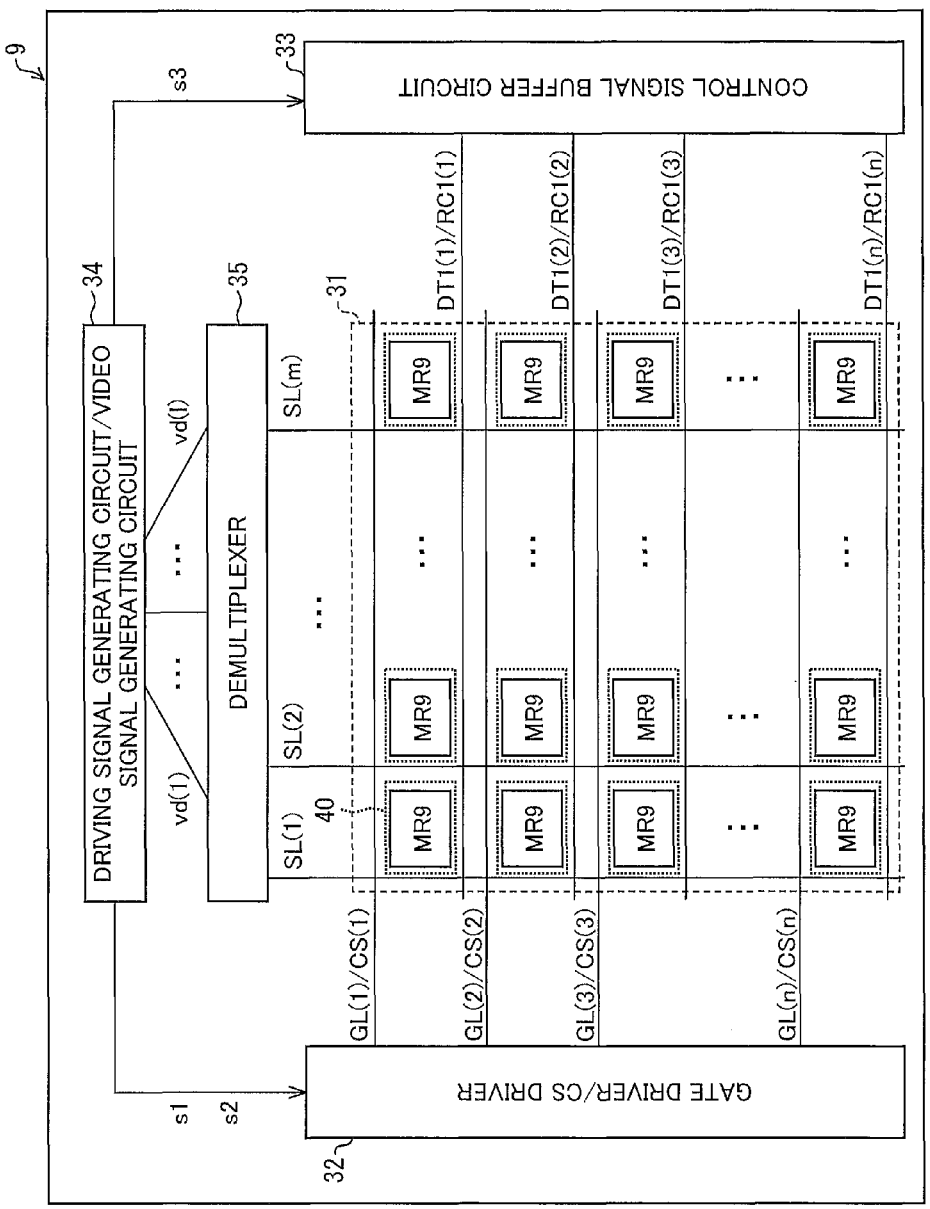
FIG. 14, which shows the embodiment of the present invention, is a block diagram illustrating an arrangement of a liquid crystal display device.

FIG. 14 illustrates an arrangement of a liquid crystal display device 9 of the present embodiment. The liquid crystal display device 9 is switched between (i) a multi-color display mode, which is for example used for screen display during an operation mode of a mobile phone, and (ii) a memory circuit operation mode, which is for example used for screen display during a standby mode of the mobile phone.

The liquid crystal display device 9 includes a pixel array 31, a gate driver/CS driver 32, a control signal buffer circuit 33, a driving signal generating circuit/video signal generating circuit 34, a demultiplexer 35, a gate line (scanning signal line) GL(i), a CS line (auxiliary capacitor wire) CSL(i), a data transfer control line DT1(i), a refresh output control line RC1(i), a source line (data signal line) SL(j), and an output signal line vd(k). Note that i is an integer (1≤i≤n), j is an integer (1≤j≤m), and k is an integer (1≤k≤l<m).

The pixel array 31 is arranged such that pixels 40 each including a pixel circuit MR9 are provided in a matrix with n rows and m columns. In the pixel array 31, an image is displayed. Each of the pixels 40 includes the memory cell 8 (see FIG. 2). Accordingly, the pixel array 31 includes the memory array 2.

The gate driver/CS driver 32 is a driving circuit which drives pixels 40 corresponding to the n rows via the gate line GL(i) and the auxiliary capacitor wire CSL(i). The gate line GL(i) and the auxiliary capacitor wire CSL(i) are connected to each pixel 40 of an i-th row. The gate line GL(i) functions also as the switch control line SC1 (FIG. 3), i.e., the first word line Xi(1), and the auxiliary capacitor wire CSL(i) functions also as the reference electric potential wire RL1.

The control signal buffer circuit 33 is a driving circuit which drives the pixels 40 corresponding to the n rows via the data transfer control line DT1(i) and the refresh output control line RC1(i). The data transfer control line DT1(i) is the data transfer control line DT1 (FIG. 3), i.e., the second word line Xi(2), and the refresh output control line RC1(i) is the refresh output control line RC1, i.e., the third word line Xi(3).

The driving signal generating circuit/video signal generating circuit 34 is a control driving circuit for performing image display and memory operation. The driving signal generating circuit/video signal generating circuit 34 includes the input-output interface 3, the command decoder 4, the timing control circuit 13, and the writing/reading circuit 7 in FIG. 1 in addition to a display data processing circuit. The timing control circuit 13 is capable of functioning also as a circuit which generates not only a timing used for the memory operation, but also timings such as a gate start pulse, a gate clock, a source start pulse, and a source clock which are used for display operation.

During the multi-color display mode (memory circuit non-operation mode), the driving signal generating circuit/video signal generating circuit 34 outputs a multi-gradation video signal from a video output terminal so as to drive the source line SL(j) via the output signal line vd(k) and the demultiplexer 35. Concurrently with this, the driving signal generating circuit/video signal generating circuit 34 outputs a signal s1 for driving/controlling the gate driver/CS driver 32. This allows display data to be written into each of the pixels 40 and allows a multi-gradation moving image/still image to be displayed.

During the memory circuit operation mode, the driving signal generating circuit/video signal generating circuit 34 supplies data to be retained in the pixels 40 from the video output terminal to the source line SL(j) via the output signal line vd(k) and the demultiplexer 35. In addition, the driving signal generating circuit/video signal generating circuit 34 supplies a signal s2 for driving/controlling the gate driver/CS driver 32 and a signal s3 for driving/controlling the control signal buffer circuit 33. This allows data to be written into the pixels 40 so that the data is displayed or retained and allows the data retained in the pixels 40 to be read.

Note, however, that the reading operation from the pixels 40 need not necessarily be carried out since the data which has been written into the pixels 40 and is retained in a memory circuit may be used only for display. The data supplied from the video output terminal to the output signal line vd(k) by the driving signal generating circuit/video signal generating circuit 34 during the memory circuit operation mode is a binary logic level indicated by a first electric potential level and a second electric potential level. In a case where a pixel 40 corresponds to each picture element for color display, an image can be displayed with colors as many as 2 to the power of the number of colors of the picture elements. For example, in a case where picture elements of three colors (R, G, and B) exist, display can be carried out in display modes of 8 colors (2 to the power of 3). The demultiplexer 35 distributes, to corresponding source lines SL(j), the data supplied to the output signal line vd(k).

As is clear from the above description, the gate driver/CS driver 32 and the control signal buffer circuit 33 constitute a row driver. Meanwhile, the driving signal generating circuit/video signal generating circuit 34 and the demultiplexer 35 constitute a column driver.

Figure 15:
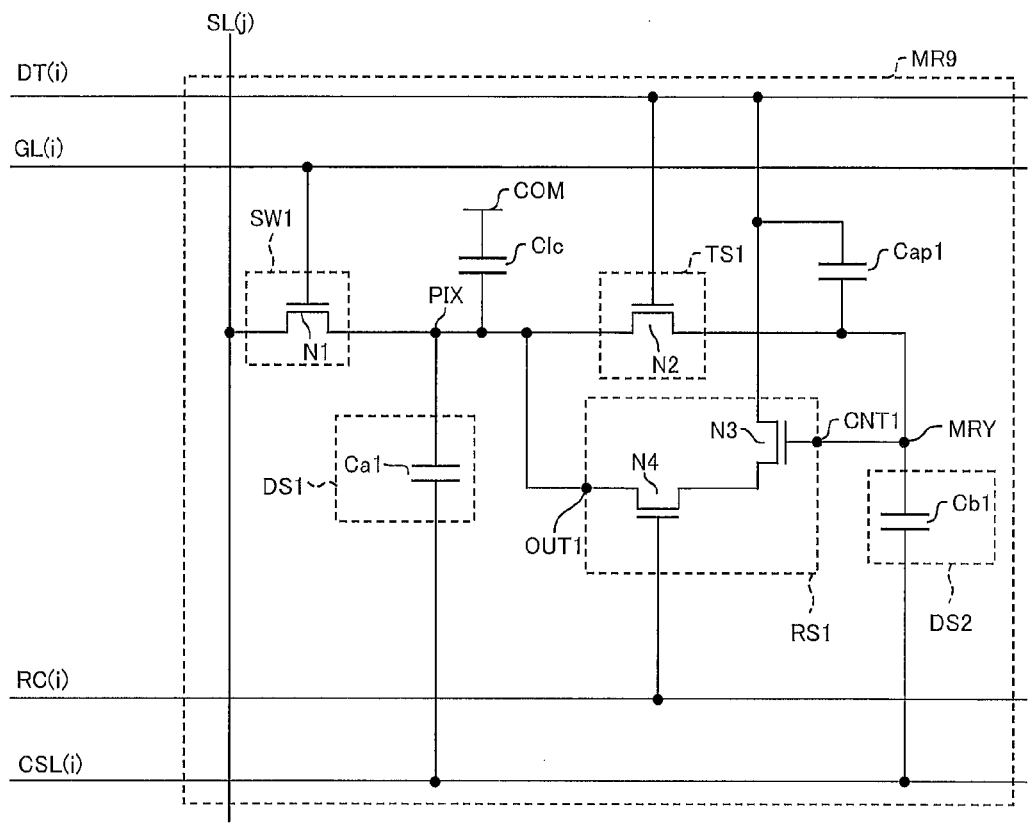
FIG. 15 is a circuit diagram illustrating an arrangement of a pixel of the liquid crystal display device of FIG. 14.

Next, FIG. 15 illustrates an example of an arrangement of the pixel 40 in the form of a pixel circuit MR9 which is an equivalent circuit.

The pixel circuit MR9 is arranged such that a liquid crystal capacitor Clc is added to the memory circuit MR1 of FIG. 12. Note that the first word line Xi(1), the second word line Xi(2), the third word line Xi(3), and the bit line Yj in FIG. 12 are illustrated as the gate line GL(i), the data transfer control line DT(i), the refresh output control line RC(i), and the source line SL(j), respectively.

The liquid crystal capacitor Clc is a capacitor which includes a liquid crystal layer disposed between a node PIX and a common electrode COM. That is, the node PIX is connected to a pixel electrode. The capacitor Ca1 functions also as an auxiliary capacitor (retention capacitor) of the pixel 40. The transistor N1 which constitutes the switching circuit SW1 functions also as a selection element of the pixel 40. The common electrode COM is provided on a common electrode substrate facing a matrix substrate on which the circuit of FIG. 14 is formed. Note, however, that the common electrode COM may be provided on the matrix substrate.

All of the above-mentioned memory circuits can be used as a memory circuit provided in the pixel circuit MR9.

During the multi-gradation display mode, in the pixel circuit MR9, a data signal with the larger number of electric potential levels than binary levels is supplied to the pixel 40. Thus, display is carried out in a state in which the refresh control section RS1 does not carry out the first operation in which the refresh control section RS1 is in the active state. During the multi-gradation display mode, the electric potential of the data transfer control line DT(i) may be fixed to Low so that only the capacitor Ca1 functions as an auxiliary capacitor or the electric potential of the data transfer control line DT(i) may be fixed to High so that the capacitor Ca1 and the capacitor Cb1 function as an auxiliary capacitor. Further, the electric potential of the refresh output control line RC(i) is fixed to Low so that the transistor N4 maintains an OFF state or the electric potential of the data transfer control line DT(i) is set high so that the transistor N3 turns off. This prevents the electric potential of the data transfer control line DT(i) from affecting a display gradation of the liquid crystal capacitor Clc which display gradation is determined by an electric charge accumulated in the first data retaining section DS1. Consequently, it is possible to achieve display performance identical to that of a liquid crystal display device having no memory function.

Figure 16:
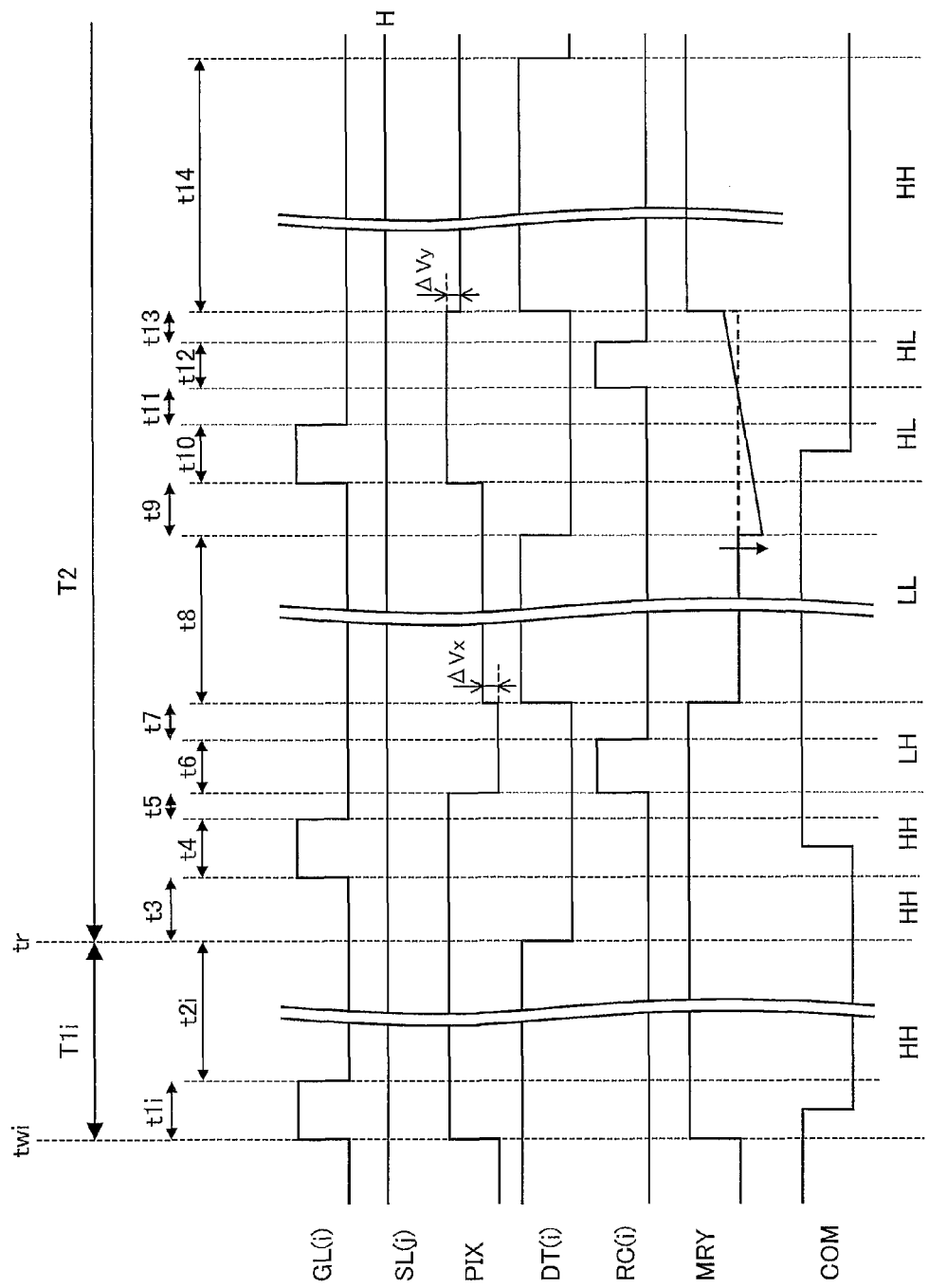
FIG. 16 is a timing chart illustrating an operation of a pixel circuit of FIG. 15.

FIG. 16 illustrates operation of the pixel circuit MR9 during the memory circuit operation mode. In the memory circuit operation mode of FIG. 16, an electric potential waveform of the common electrode COM is added to the electric potential waveforms of FIG. 13. That is, the memory circuit operation mode is executed by using the writing operation into the memory cell 8 in the memory device 1.

The operation of the pixel circuit MR9 in FIG. 16 can be classified into the following operation steps.

(1) Step A (The Period t1*i* Through the Period t2*i* (The Writing Period T1*i*))

In the step A, a state is achieved in which (i) a binary logic level corresponding to a data signal is being supplied from the driving signal generating circuit/video signal generating circuit 34 and the demultiplexer 35 to the source line SL(j) and (ii) the refresh output control section RS1 is carrying out the second operation. In the state, the switching circuit SW1 is made conductive. This allows the binary logic level to be written into the pixel 40. Then, in a state in which (i) the binary logic level is being written into the memory cell 8 and (ii) the refresh output control section RS1 is carrying out the second operation, the data transfer section TS1 carries out the transfer operation.

(2) Step B (Each of the Period t3 Through the Period t4 and the Period t9 Through the Period t10)

In the step B following the step A, a state is achieved in which (i) the refresh output control section RS1 is carrying out the second operation and (ii) the data transfer section TS1 is carrying out the non-transfer operation. In the state, the switching circuit SW1 is made conductive. Thus, a binary logic level which is same as a level equivalent to the control information which causes the refresh output control section RS1 to be in an active state is supplied to the first data retaining section DS1 via the source line SL(j).

(3) Step C (Each of the Period t5 Through the Period t6 and the Period t11 Through the Period t12)

In the step C following the step B, a state is achieved in which (i) the switching circuit SW1 is being made non-conductive and (ii) the data transfer section TS1 is carrying out the non-transfer operation. In the state, the refresh output control section RS1 carries out the first operation. At the end of the first operation, a state is achieved in which a binary logic level which is reverse to a level equivalent to the control information which causes the refresh output control section RS1 to be in an active state is supplied from the voltage supply VS1 to the input of the refresh output control section RS1.

(4) Step D (Each of the Period t7 Through the Period t8 and the Period t13 Through the Period t14)

In the step D following the step C, a state is achieved in which (i) the switching circuit SW1 is being made non-conductive and (ii) the refresh output control section RS1 is carrying out the second operation. In the state, the data transfer section TS1 carries out the transfer operation.

As for the whole operation during the memory circuit operation mode, the step A is executed first, and subsequently to the step A, the series of operations from the start of the step B to the end of the step D (the period t3 through the period t8) is executed at least once.

The common electrode (counter electrode) COM is driven so that an electric potential of the common electrode (counter electrode) COM is reversed between High and Low every time the transistor N1 turns on. By thus carrying out inversion AC drive of the common electrode of the liquid crystal capacitor so that the electric potential of the common electrode is reversed between the binary levels, bright and dark can be displayed while carrying out AC drive of the liquid crystal capacitor so that a polarity of an applied voltage is alternated between a positive polarity and a negative polarity.

It is, for example, assumed that the binary levels supplied to the common electrode COM are a first electric potential level and a second electric potential level. This makes it possible to easily achieve black display and white display only by the first electric potential level and the second electric potential level in both of a case where a voltage applied to liquid crystals is of a positive polarity and a case where the voltage applied to the liquid crystals is of a negative polarity. For example, assume that the High electric potential of the common electrode COM is equal to the High electric potential of the binary logic levels and that the Low electric potential of the common electrode COM is equal to the Low electric potential of the binary logic levels. In a case where the electric potential of the common electrode COM is Low and where the electric potential of the node PIX is Low, black display of a positive polarity is achieved, whereas in a case where the electric potential of the common electrode COM is Low and where the electric potential of the node PIX is High, white display of a positive polarity is achieved. In a case where the electric potential of the common electrode COM is High and where the electric potential of the node PIX is Low, white display of a negative polarity is achieved, whereas in a case where the electric potential of the common electrode COM is High and where the electric potential of the node PIX is High, black display of a negative polarity is achieved. Accordingly, the liquid crystals are driven so that a direction of the voltage applied to the liquid crystals is reversed every time the electric potential of the node PIX is refreshed, while keeping an almost identical display gradation. This allows AC driving of the liquid crystals in which an effective value of the voltage applied to the liquid crystals is constant regardless of whether the voltage is positive or negative. Moreover, such an arrangement is also possible in which both of the electric potentials (binary levels) of the common electrode COM are larger than a minimum value of a data signal electric potential and smaller than a maximum value of the data signal electric potential.

Further, it is, for example, assumed that the binary level supplied to the common electrode COM is reversed only in a period in which the switching circuit SW1 is conductive as shown in FIG. 16. Since the binary level supplied to the common electrode COM is reversed only in a period in which the pixel electrode is connected to the source line SL(j) via the switching circuit SW1, the common electrode electric potential is reversed in a state in which the pixel electrode electric potential is fixed to an electric potential of the source line SL(j). This prevents the pixel electrode electric potential that is being retained, especially the pixel electrode electric potential in a refresh period from changing, for example, due to the reversal of the common electrode electric potential in a floating state of the node PIX.

As described above, according to the present liquid crystal display device, the display device can have both of the function of the multi-gradation display mode (second display mode) and the function of the memory circuit operation mode (first display mode). During the memory circuit operation mode, in which an image, such as a still image, which hardly changes with time is displayed, circuits such as an amplifier for displaying a multi-gradation image in a video signal generating circuit and data supply operation can be stopped. This allows low power consumption. In addition, during the memory circuit operation mode, an electric potential can be refreshed within the pixel 40. This makes it unnecessary to rewrite data of the pixel 40 while charging/discharging the source line SL(j) again, thereby allowing a reduction in power consumption. Furthermore, a data polarity can be reversed within the pixel 40. This makes it unnecessary to, at the time of polarity reversal, overwrite the data with display data whose polarity has been reversed while charging/discharging the source line SL(j). This allows a reduction in power consumption.

The pixel circuit MR9 serving as a memory circuit does not have a factor which greatly increases power consumption such as a through current of an inverter for carrying out a refresh operation. This makes it possible to greatly reduce power consumption of the memory circuit operation mode itself, as compared with a conventional art.

A display device can be configured to include the memory device 1 so that the memory circuit MR1 is disposed within a driving circuit such as a CS driver of the display device. In such a case, for example, a binary logic level of retained data is directly used as an output from a memory cell. Use of the memory circuit MR1 of FIG. 12, in which all the transistors are N-channel TFTs, allows the memory cell to be formed in a driving circuit that is monolithically built into a display panel made of amorphous silicon.

Note that the memory circuit MR1 may be arranged such that all the transistors constituting the memory circuit are P-channel TFTs (field-effect transistors).

Next, the following describes a specific example of an arrangement of a pixel 40 in a display panel (liquid crystal panel) including the pixel circuit MR9.

Figure 17:
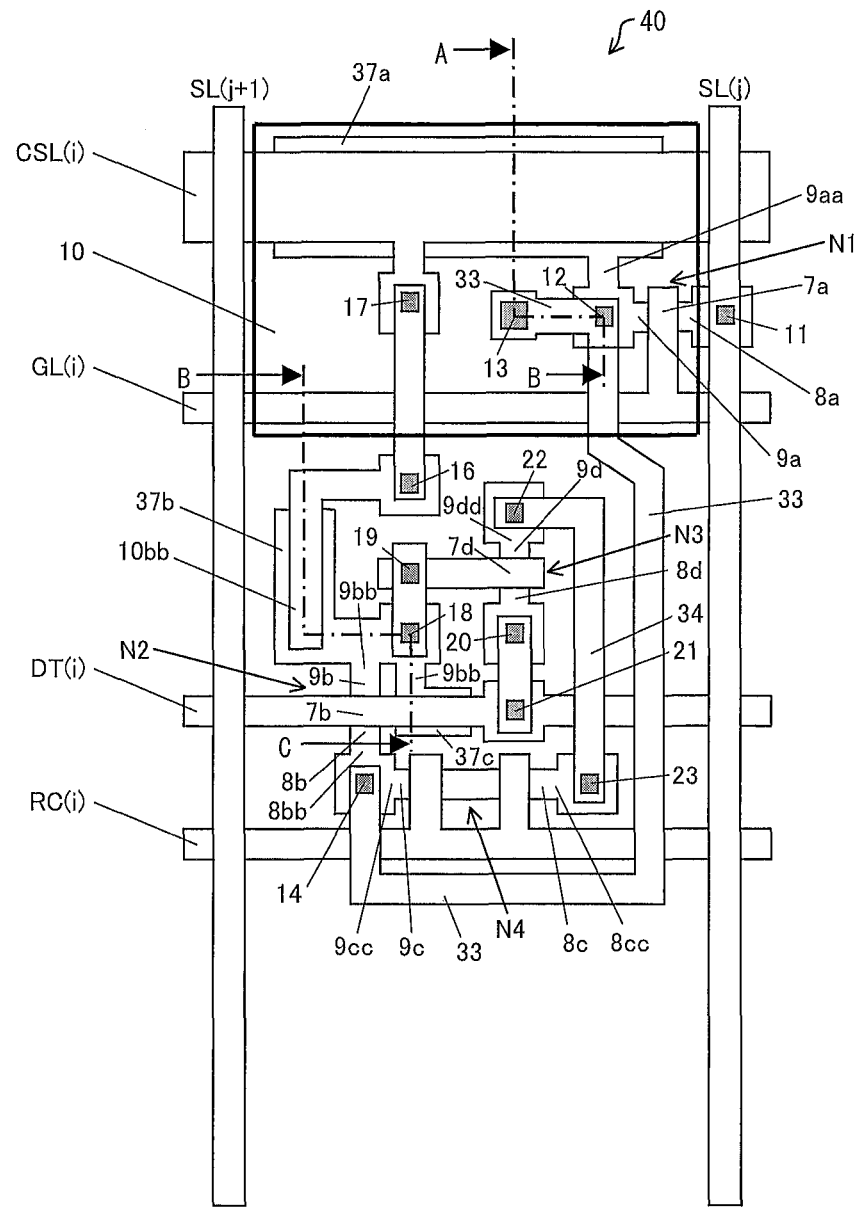
FIG. 17 is a plan view of a pixel of a liquid crystal panel according to Example 1 which is provided in the liquid crystal display device of FIG. 14.

FIG. 17 is a plan view illustrating a pixel of the present liquid crystal panel. In the liquid crystal panel of FIG. 17, a source line SL(j) is provided in a column direction so as to extend along the pixel 40, and a CS line CSL(i), a gate line GL(i), a data transfer control line DT(i), and a refresh output control line RC(i) are provided in a row direction so as to cross the pixel 40. A pixel electrode 10 having a rectangular shape is provided so as to overlap the CS line CSL(i) and the gate line GL(i).

In the pixel 40, a gate electrode 7a is provided on the gate line GL(i), and a source electrode 8a and a drain electrode 9a of a transistor N1 (first transistor) are provided corresponding to the gate electrode 7a. The source electrode 8a is connected to the source line SL(j) via a contact hole 11. The drain electrode 9a is connected to a draw-out wire 9aa. The draw-out wire 9aa is connected to a relay wire 33 via a contact hole 12. The relay wire 33 is connected to the pixel electrode 10 via a contact hole 13. The draw-out wire 9aa is connected to a capacitive electrode 37a (first capacitive electrode). The capacitive electrode 37a overlaps the CS line CSL(i) via a gate insulating film. This forms a retention capacitor Ca1 (first capacitor) (see FIG. 15).

The relay wire 33 further extends in the column direction, and is connected to a source electrode 8b of a transistor N2 (second transistor) and to a drain electrode 9c of a transistor N4 (fourth transistor) via a contact hole 14. A gate electrode 7b of the transistor N2 is connected to the data transfer control line DT(i). A drain electrode 9b of the transistor N2 is connected to a draw-out wire 9bb. The draw-out wire 9bb is connected to a capacitive electrode 37b (second capacitive electrode). The capacitive electrode 37b overlaps a CS extension 10bb (retention capacitor wire extension) via the gate insulating film. The CS extension 10bb is connected to the CS line CSL(i) via contact holes 16 and 17. This forms a retention capacitor Cb1 (second capacitor) (see FIG. 15).

The draw-out wire 9bb that is connected to the drain electrode 9b of the transistor N2 is further connected to a gate electrode 7d of a transistor N3 (third transistor) via contact holes 18 and 19. A source electrode 8d of the transistor N3 is connected to the data transfer control line DT(i) via contact holes 20 and 21. A drain electrode 9d of the transistor N3 is connected to a relay wire 34 via a contact hole 22. The relay wire 34 is connected to a source electrode 8c of the transistor N4 via a contact hole 23. A gate electrode of the transistor N4 is connected to the refresh output control line RC(i).

The draw-out wire 9bb that is connected to the drain electrode 9b of the transistor N2 is further connected to a capacitive electrode 37c (third capacitive electrode). The capacitive electrode 37c overlaps the data transfer control line DT(i) via the gate insulating film. This forms a retention capacitor Cap1 (third capacitor) (see FIG. 15).

Figure 18:
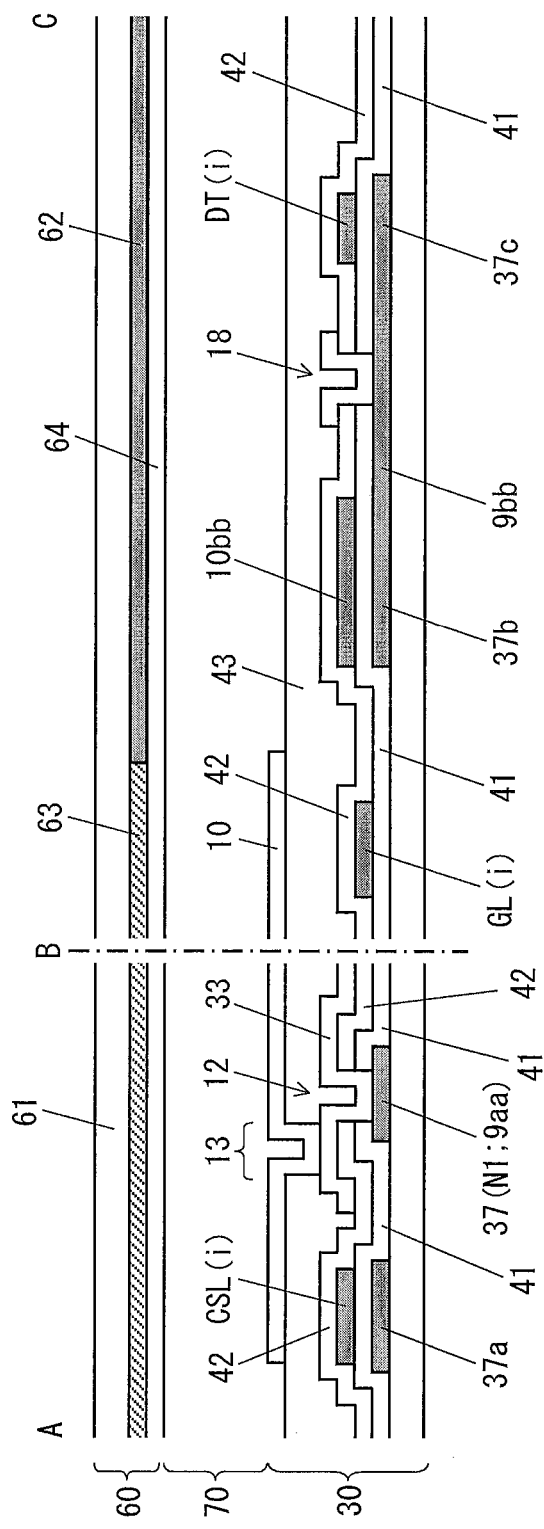
FIG. 18 is a cross-sectional view taken along the line A-B-C of FIG. 17.

FIG. 18 is a cross-sectional view taken along the line A-B-C of FIG. 17. As illustrated in FIG. 18, the present liquid crystal panel includes an active matrix substrate 30, a color filter substrate 60 (counter substrate) facing the active matrix substrate 30, and a liquid crystal layer 70 sandwiched between the two substrates 30 and 60.

In the active matrix substrate 30, a semiconductor layer 37 (an i layer and an n+ layer), the source electrodes 8a, 8b, 8c, and 8d (see FIG. 17) that are in contact with the n+ layer, the drain electrodes 9a, 9b, 9c, and 9d (see FIG. 17), the draw-out wires 9aa, 9bb, 9cc, and 9dd (see FIG. 17) that are drawn out from the drain electrodes 9a, 9b, 9c, and 9d, respectively, and the capacitive electrodes 37a, 37b, and 37c are formed on a glass substrate 31, and an inorganic gate insulating film 41 is provided on these members so as to cover these members. On the inorganic gate insulating film 41, the CS line CSL(i), the gate line GL(i), the CS extension 10bb, the data transfer control line DT(i), and the refresh output control line RC(i) (see FIG. 17) are provided, and an inorganic interlayer insulating film 42 is provided on these members so as to cover these members. On the inorganic interlayer insulating film 42, the relay wires 33 and 34 (see FIG. 17) are provided, and an organic interlayer insulating film 43 is provided on these members so as to cover these members. On the organic interlayer insulating film 43, the pixel electrode 10 is provided, and an alignment film (not shown) is provided on the pixel electrode 10 so as to cover the pixel electrode 10.

The organic interlayer insulating film 43 is hollowed out at the contact hole 13, thereby allowing connection between the pixel electrode 10 and the relay wire 33. Further, the inorganic gate insulating film 41 and the inorganic interlayer insulating film 42 are hollowed out at the contact hole 12, thereby allowing connection between the relay wire 33 and the draw-out wire 9aa drawn out from the drain electrode 9a (see FIG. 17) of the transistor N 1. The capacitive electrode 37a connected to the draw-out wire 9aa overlaps the CS line CSL(i) via the inorganic gate insulating film 41. This forms a retention capacitor Ca1 (see FIG. 15).

The inorganic gate insulating film 41 and the inorganic interlayer insulating film 42 are hollowed out at the contact hole 18, thereby allowing connection between the relay wire 33 and the draw-out wire 8bb drawn out from the source electrode 8b (see FIG. 17) of the transistor N2. The capacitive electrode 37b that is connected to the draw-out wire 9bb drawn out from the drain electrode 9b (see FIG. 17) of the transistor N2 overlaps the CS extension 10bb via the inorganic gate insulating film 41. The CS extension 10bb is connected to the CS line CSL(i) via the contact holes 16 and 17. This forms a retention capacitor Cb1 (see FIG. 15) between the capacitive electrode 37b and the CS extension 10bb. The capacitive electrode 37c connected to the draw-out wire 9bb overlaps the data transfer control line DT(i) via the inorganic gate insulating film 41. This forms a capacitor Cap1 (see FIG. 15) between the capacitive electrode 37c and the data transfer control line DT(i).

Meanwhile, in the color filter substrate 60, a black matrix 62 and a colored layer 63 are provided on a glass substrate 61, and on these members, a common electrode (com) 64 is provided. Further, an alignment film (not shown) is provided on the common electrode (com) 64 so as to cover the common electrode (com) 64.

Example 2

Figure 19:
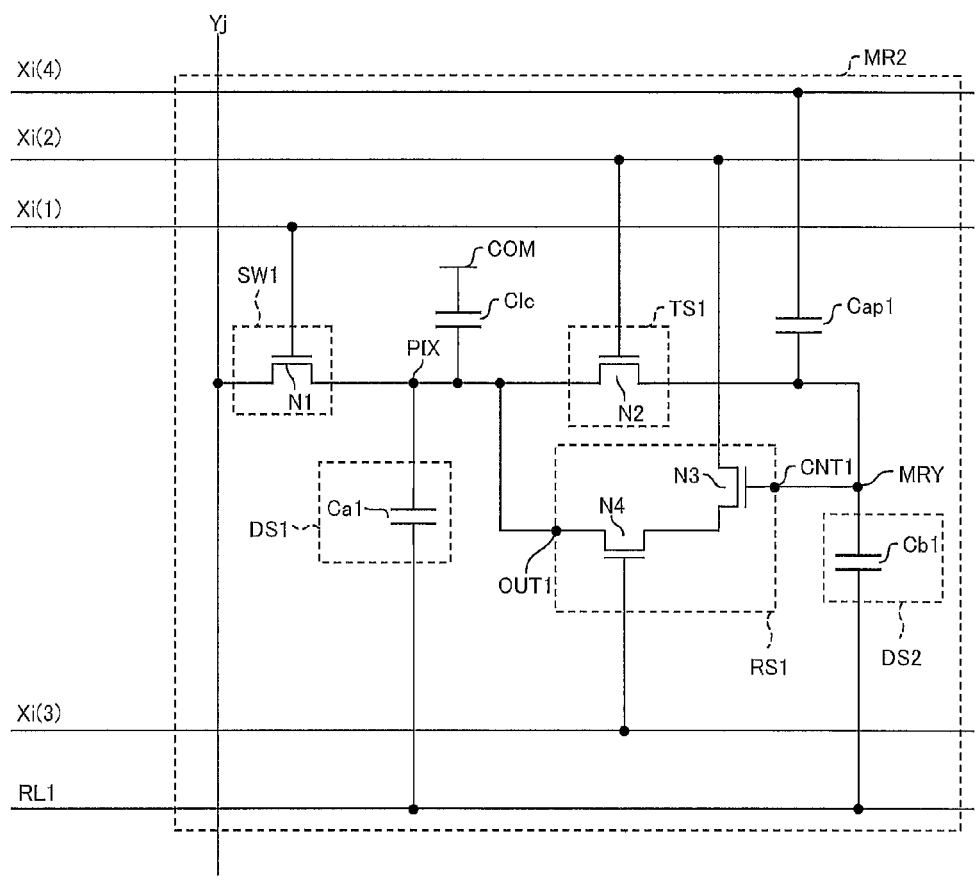
FIG. 19, which shows the embodiment of the present invention, is a circuit diagram illustrating an arrangement of a memory circuit of Example 2.
Figure 20:
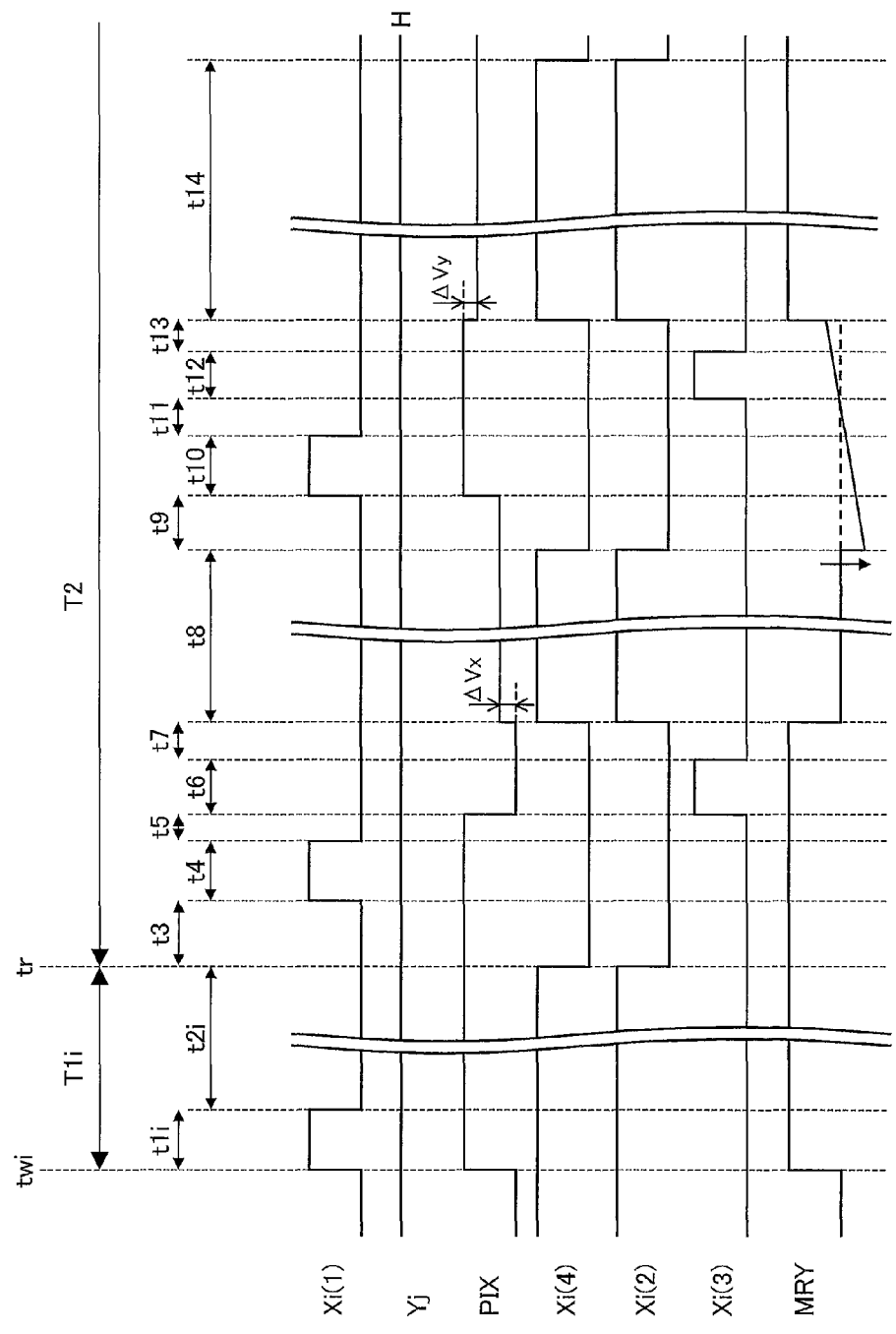
FIG. 20 is a timing chart illustrating a writing operation of the memory circuit of FIG. 19.
Figure 21:
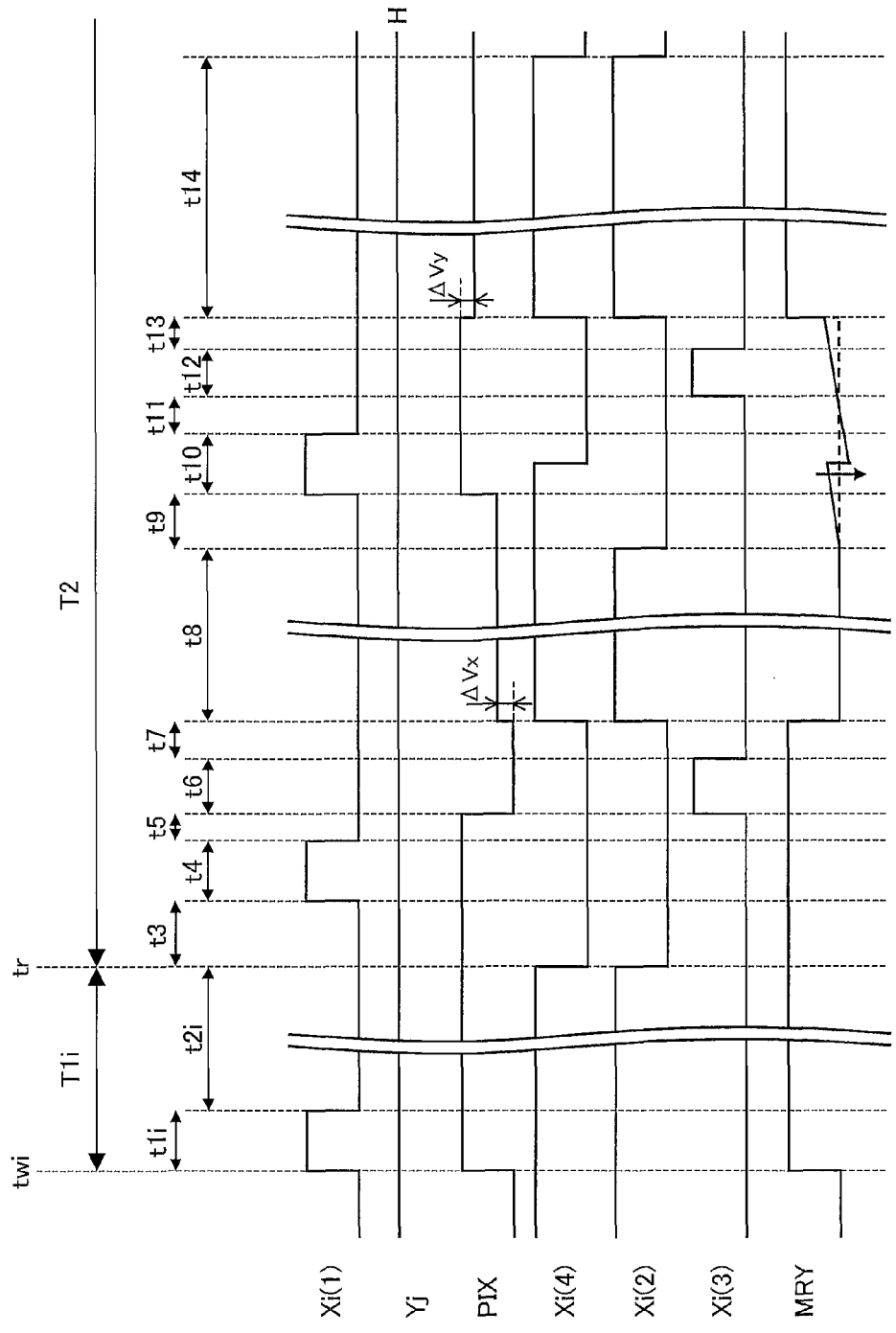
FIG. 21 is a timing chart illustrating another writing operation of the memory circuit of FIG. 19.

A memory circuit MR2 of Example 2 is arranged such that a fourth word line Xi(4) (sixth signal line) is added to the memory circuit MR1 of Example 1 and a capacitor Cap1 is provided between the node MRY (second connection point) and the fourth word line Xi(4). FIG. 19 is a circuit diagram of the memory circuit MR2 including the capacitor Cap1, and FIG. 20 is a timing chart illustrating operation of the memory circuit MR2. As illustrated in FIG. 20, when an electric potential of the fourth word line Xi(4) is changed from High to Low, an electric potential change occurs due to a feed-through voltage generated due to the capacitor Cap1. This reduces the electric potential of the node MRY. Since the degree of the reduction of the electric potential varies depending on a size of the capacitor Cap1, the capacitor Cap1 is set so that the electric potential of the node MRY does not reach an electric potential which causes the transistor N3 to turn on in a period (the period t12) in which the electric potential of the third word line Xi(3) is High, as in Example 1.

In a case where the electric potential of the node MRY is reduced due to the capacitor Cap1 thus set, the electric potential of the node MRY is not increased to such an extent as to turn the transistor N3 on, in the period t12 in which the electric potential of the third word line Xi(3) becomes High and the transistor N4 turns on. Accordingly, the transistor N3 maintains an OFF state. Since the node PIX is not conductive with the second word line Xi(2) via the transistor N3, the node PIX can maintain a High electric potential. Accordingly, in the period t14 in which the electric potential of the second word line Xi(2) becomes High and the transistor N2 turns on, proper movement of an electric charge occurs between the capacitor Ca1 and the capacitor Cb1. Consequently, both of the electric potential of the node PIX and the electric potential of the node MRY become High. It is therefore possible to prevent an operation error in the memory circuit MR2.

According to the arrangement of the present Example 2, it is possible to obtain not only an effect of preventing an operation error in the memory circuit MR2, but also an effect of being capable of adjusting an output timing of a signal to be supplied to the fourth word line Xi(4) independently of a signal to be supplied to the second word line Xi(2) since the signal line (fourth word line Xi(4)) for forming the capacitor Cap1 is provided independently of the second word line Xi(2). It is therefore possible to adjust a signal amplitude voltage while taking power consumption into consideration. Further, in a case where the electric potential of the node MRY can be retained by the capacitor Cap1, it is possible to eliminate the retention capacitor Cb1.

In FIG. 20, the electric potential of the fourth word line Xi(4) changes at same timings as the electric potential of the second word line Xi(2). However, the electric potential of the fourth word line Xi(4) may change from High to Low in the periods t9 through t11 (the period t10 in FIG. 21), for example. That is, it is only necessary that the electric potential of the fourth word line Xi(4) change from High to Low before the period t12 in which the electric potential of the third word line Xi(3) becomes High and the transistor N4 turns on, so as to reduce the electric potential of the node MRY to an electric potential which does not cause the transistor N3 to turn on.

Next, the following describes a liquid crystal display device of the present Example 2. The present liquid crystal display device is identical to the liquid crystal display device 9 of Example 1 except for that a capacitor line CapL(i) corresponding to the fourth word line Xi(4) is added. Accordingly, the following describes a specific example of an arrangement of a pixel 41 for forming a capacitor Cap1.

Figure 22:
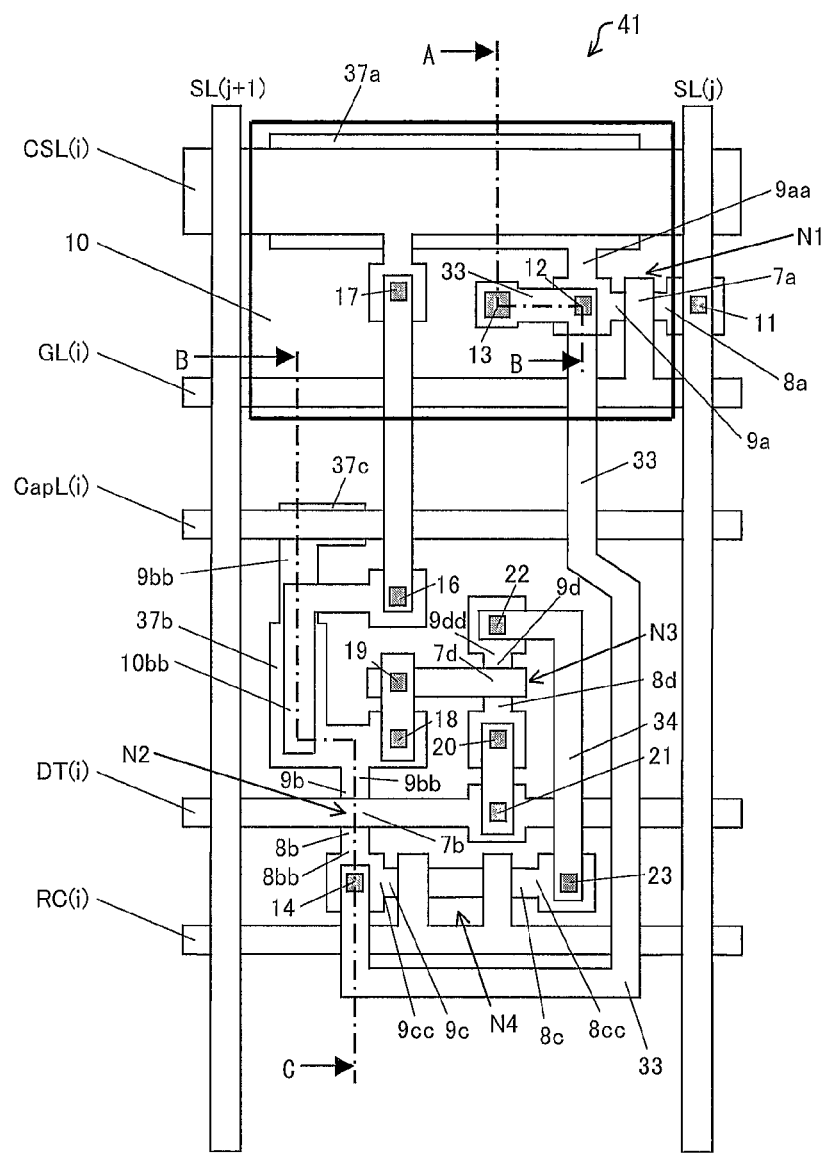
FIG. 22 is a plan view of a pixel of a liquid crystal panel according to Example 2.
Figure 26:
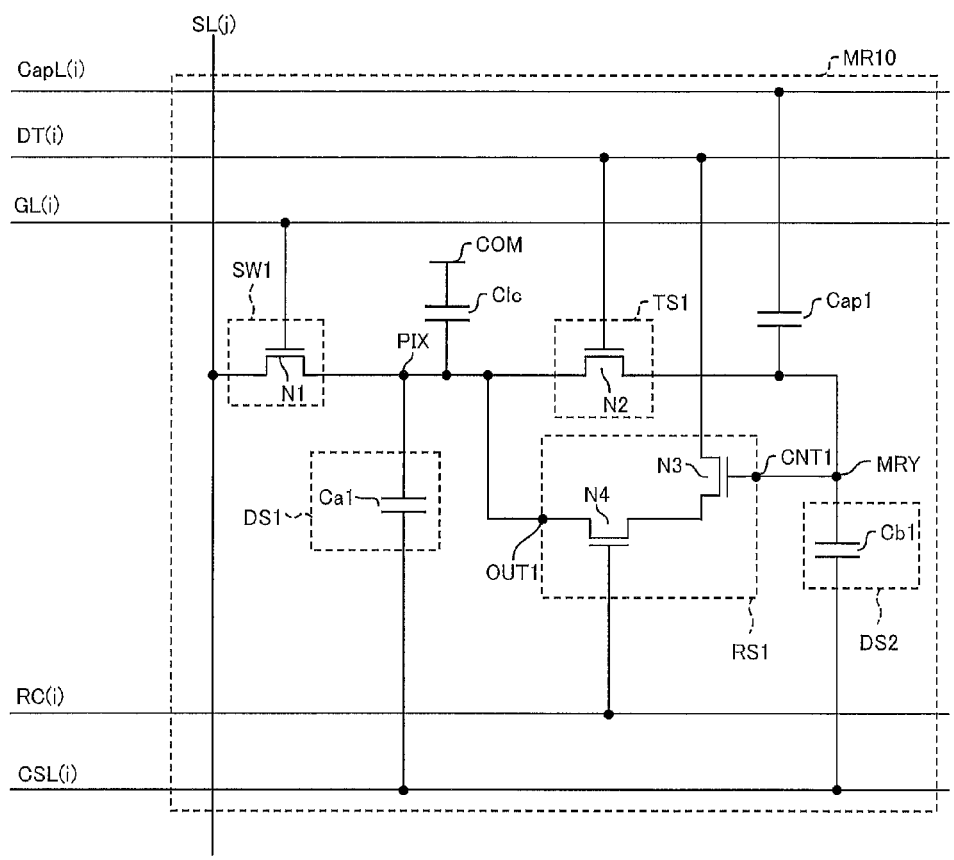
FIG. 26 is a circuit diagram illustrating an arrangement of a pixel of a liquid crystal panel shown in FIG. 22.

FIG. 22 is a plan view of a pixel of the present liquid crystal panel, and FIG. 26 is a circuit diagram of a pixel circuit MR10 provided in the pixel. The pixel circuit MR10 corresponds to the memory circuit MR2. In the liquid crystal panel of FIG. 22, a source line SL(j) is provided in a column direction so as to extend along the pixel 41, and a CS line CSL(i), a gate line GL(i), a data transfer control line DT(i), a capacitor line CapL(i), and a refresh output control line RC(i) are provided in a row direction so as to cross the pixel 40. A pixel electrode 10 having a rectangular shape is provided so as to overlap the CS line CSL(i) and the gate line GL(i).

In the pixel 41, a gate electrode 7a is provided on the gate line GL(i), and a source electrode 8a and a drain electrode 9a of a transistor N1 (first transistor) are provided corresponding to the gate electrode 7a. The source electrode 8a is connected to the source line SL(j) via a contact hole 11. The drain electrode 9a is connected to a draw-out wire 9aa. The draw-out wire 9aa is connected to a relay wire 33 via a contact hole 12. The relay wire 33 is connected to the pixel electrode 10 via a contact hole 13. The draw-out wire 9aa is connected to a capacitive electrode 37a. The capacitive electrode 37a overlaps the CS line CSL(i) via a gate insulating film. This forms a retention capacitor Ca1 (first capacitor) (see FIG. 26).

The relay wire 33 further extends in the column direction, and is connected to a source electrode 8b of a transistor N2 (second transistor) and to a drain electrode 9c of a transistor N4 (fourth transistor) via a contact hole 14. A gate electrode 7b of the transistor N2 is connected to the data transfer control line DT(i). A drain electrode 9b of the transistor N2 is connected to a draw-out wire 9bb. The draw-out wire 9bb is connected to a capacitive electrode 37b. The capacitive electrode 37b overlaps a CS extension 10bb via the gate insulating film. The CS extension 10bb is connected to the CS line CSL(i) via contact holes 16 and 17. This forms a retention capacitor Cb1 (second capacitor) (see FIG. 26). The draw-out wire 9bb that is connected to the capacitive electrode 37b is connected to a capacitive electrode 37c. The capacitive electrode 37c overlaps the capacitor line CapL(i) via the gate insulating film. This forms a capacitor Cap1 (third capacitor) (see FIG. 26).

The draw-out wire 9bb that is connected to the drain electrode 9b of the transistor N2 is further connected to a gate electrode 7d of a transistor N3 (third transistor) via contact holes 18 and 19. A source electrode 8d of the transistor N3 is connected to the data transfer control line DT(i) via contact holes 20 and 21. A drain electrode 9d of the transistor N3 is connected to a relay wire 34 via a contact hole 22. The relay wire 34 is connected to a source electrode 8c of the transistor N4 via a contact hole 23. A gate electrode of the transistor N4 is connected to the refresh output control line RC(i).

Figure 23:
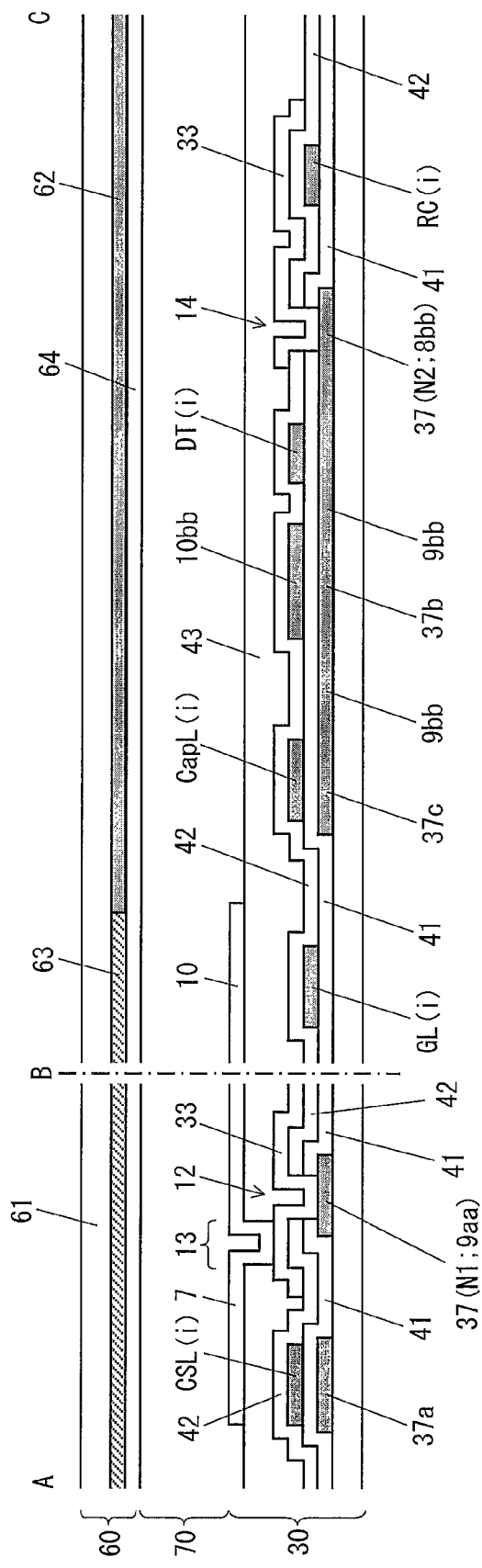
FIG. 23 is a cross-sectional view taken along the line A-B-C of FIG. 22.

FIG. 23 is a cross-sectional view taken along the line A-B-C of FIG. 22. As illustrated in FIG. 23, the present liquid crystal panel includes an active matrix substrate 30, a color filter substrate 60 (counter substrate) facing the active matrix substrate 30, and a liquid crystal layer 70 sandwiched between the two substrates 30 and 60.

In the active matrix substrate 30, a semiconductor layer 37 (an i layer and an n+ layer), the source electrodes 8a, 8b, 8c, and 8d (see FIG. 22) that are in contact with the n+ layer, the drain electrodes 9a, 9b, 9c, and 9d (see FIG. 22), the draw-out wires 9aa, 9bb, 9cc, and 9dd (see FIG. 22) that are drawn out from the drain electrodes 9a, 9b, 9c, and 9d, respectively, and the capacitive electrodes 37a, 37b, and 37c are provided on a glass substrate 31, and an inorganic gate insulating film 41 is provided on these members so as to cover these members. On the inorganic gate insulating film 41, the CS line CSL(i), the gate line GL(i), the capacitor line CapL(i), the CS extension 10bb, the data transfer control line DT(i), and the refresh output control line RC(i) (see FIG. 22) are provided, and an inorganic interlayer insulating film 42 is provided on these members so as to cover these members. On the inorganic interlayer insulating film 42, the relay wires 33 and 34 (see FIG. 22) are provided, and an organic interlayer insulating film 43 is provided on these members so as to cover these members. On the organic interlayer insulating film 43, the pixel electrode 10 is provided, and an alignment film (not shown) is provided on the pixel electrode 10 so as to cover the pixel electrode 10.

The organic interlayer insulating film 43 is hollowed out at the contact hole 13, thereby allowing connection between the pixel electrode 10 and the relay wire 33. Further, the inorganic gate insulating film 41 and the inorganic interlayer insulating film 42 are hollowed out at the contact hole 12, thereby allowing connection between the relay wire 33 and the draw-out wire 9aa drawn out from the drain electrode 9a (see FIG. 22) of the transistor N1. The capacitive electrode 37a connected to the draw-out wire 9aa overlaps the CS line CSL(i) via the inorganic gate insulating film 41. This forms a retention capacitor Ca1 (see FIG. 26).

The inorganic gate insulating film 41 and the inorganic interlayer insulating film 42 are hollowed out at the contact hole 14, thereby allowing connection between the relay wire 33 and the draw-out wire 8bb drawn out from the source electrode 8b (see FIG. 22) of the transistor N2. The capacitive electrode 37b that is connected to the draw-out wire 9bb drawn out from the drain electrode 9b (see FIG. 22) of the transistor N2 overlaps the CS extension 10bb via the inorganic gate insulating film 41. The CS extension 10bb is connected to the CS line CSL(i) via the contact holes 16 and 17. This forms a retention capacitor Cb1 (see FIG. 26) between the capacitive electrode 37b and the CS extension 10bb. The capacitive electrode 37c connected to the draw-out wire 9bb overlaps the capacitor line Cap1(i) via the inorganic gate insulating film 41. This forms a capacitor Cap1 (see FIG. 26) between the capacitive electrode 37c and the capacitor line Cap1(i).

Meanwhile, in the color filter substrate 60, a black matrix 62 and a colored layer 63 are provided on a glass substrate 61, and a common electrode (com) 64 is provided on these members. Further, an alignment film (not shown) is provided on the common electrode (com) 64 so as to cover the common electrode (com) 64.

A memory device of the present invention can be also expressed as follows.

Specifically, a memory device of the present invention includes: a memory array in which memory cells are provided in a matrix pattern; a row driver which drives each row of the memory array; a column driver which drives each column of the memory array; a first signal line (switch control line SC1) which is provided for the each row and is connected to memory cells in an identical row; a second signal line (data transfer control line DT1) and a third signal line (refresh output control line RC1) each of which is connected to the memory cells in the identical row; and a fourth signal line (data input line IN) which is provided for the each column and is connected to memory cells in an identical column, the fourth signal line being driven by the column driver so that each of a first electric potential level and a second electric potential level each indicating a binary logic level is supplied to the fourth signal line, the memory cells of the memory array each including: a switching circuit; a first retaining section (first data retaining section DS1); a transfer section (data transfer section TS1); a second retaining section (second data retaining section DS2); and a first control section (refresh output control section), the switching circuit being driven by the row driver via the first signal line, so as to selectively turn on or off the fourth signal line and the first retaining section, the first retaining section retaining the binary logic level to be supplied thereto, the transfer section being driven via the second signal line, so as to selectively carry out (i) a transfer operation in which the binary logic level retained in the first retaining section is transferred to the second retaining section while being retained in the first retaining section and (ii) a non-transfer operation in which no transfer operation is carried out, the second retaining section retaining the binary logic level to be supplied thereto, the first control section being driven via the third signal line, so as to be selectively controlled to be in a state in which the first control section carries out a first operation or a second operation, the first operation being an operation which is carried out by the first control section in (i) an active state in which the first control section receives an input thereto and supplies the input as an output thereof to the first retaining section or (ii) a non-active state in which the first control section stops carrying out an output, the active or non-active state having been selected in accordance with control information indicative of which of the first electric potential level and the second electric potential level is retained in the second retaining section as the binary logic level, the second operation being an operation in which the first control section stops carrying out the output regardless of the control information, and the first control section including a voltage supply which supplies a set electric potential to an input of the first control section.

According to the arrangement, for example, in a case where data is desired to be written to a memory cell, the binary logic level which corresponds to the data to be written and is the first electric potential level or the second electric potential level is supplied from the column driver to the fourth signal line. Then, in a case where the binary logic level is supplied from the fourth signal line via the switching circuit to the first retaining section and then retained in the first retaining section, the binary logic level retained in the first retaining section can also be retained in the second retaining section by the transfer operation carried out by the transfer section. The first control section may be in the active state (i) when the first electric potential is retained in the second retaining section or (ii) when the second electric potential level is retained in the second retaining section. In either case, assume that the electric potential of the voltage supply is set to supply a level which is reverse to an active level of the first control section when a period in which the first control section carries out the first operation is finished. In a case where, in a state in which the transfer section has carried out the non-transfer operation, the first control section carries out the first operation in which the first control section is in the active state, the first retaining section is in a state in which the first retaining section retains a level which is reverse to the binary logic level having been retained therein until then, and the second retaining section is in a state in which the second retaining section retains the binary logic level having been retained therein until then. In contrast, in a case where, in a state in which the transfer section has carried out the non-transfer operation, the first control section carries out the second operation in which the first control section is in the non-active state, both the first retaining section and the second retaining section are in a state in which the first retaining section and the second retaining section retain the respective binary logic levels having been retained therein until then.

Note here that, in a case where the active level of the first control section is supplied from the column driver to the fourth signal line, the binary logic level retained in the first retaining section is overwritten with the active level via the switching circuit, and thereafter the transfer section carries out the transfer operation, both the first retaining section and the second retaining section are in a state in which the first retaining section and the second retaining section retain a level which is reverse to the binary logic level obtained during writing. According to this, refresh can be carried out in a memory cell. The refresh can be repeated by repeating similar operation to the operation described above. According to the refresh, the binary logic level to be retained is reversed every time the refresh is carried out with respect to identical written data supplied from the column driver.

As described earlier, according to the arrangement, in a case where one and the other of the first electric potential level and the second electric potential level are supplied from the fourth signal line and the voltage supply, respectively to each of the memory cells by no use of an inverter after binary logic data has been written to the first retaining section, a binary logic level corresponding to the binary logic data having been written to a memory cell can be refreshed while being subjected to a level reversal. Since a binary logic level which has been refreshed and is retained in the first retaining section and a binary logic level which has been refreshed and is retained in the second retaining section are equal to each other, the first retaining section and the second retaining section do not change in electric potential even if the transfer section carries out the transfer operation. This allows both the first retaining section and the second retaining section to retain the binary logic levels thus refreshed for a long time while the transfer section is in a state in which the transfer section carries out the transfer operation. In this case, since the first retaining section and the second retaining section are connected via the transfer section, occurrence of an off-leakage current in a transfer element of the transfer section is irrelevant to retention of the binary logic levels. The binary logic levels, which are retained in a mass by a large electric capacitance represented by a sum of the first retaining section and the second retaining section, are less likely to change in electric potential even by an influence of a noise from outside.

Accordingly, even if the off-leakage current occurs in the transfer element used in the transfer section, an electric potential of a retaining node which retains the binary logic level of the second retaining section is less likely to change since the electric potential is retained for a long time together with an electric potential of a retaining node of the first retaining section. According to a conventional memory cell, the binary logic levels which have been refreshed and are different from each other are retained for a long time in a state in which the first retaining section and the second retaining section are electrically separated from each other by the transfer element of the transfer section. Therefore, the off-leakage current of the transfer element has a great influence on the electric potential of the second retaining section.

Further, even if the electric potential of the retaining node of the second retaining section changes, a time for the change is not long enough for the control information for the first control section carrying out the first operation to change between the active level and the non-active level.

In a case where it is assumed that an inverter exists in the first control section, there exist two complementary levels of a High level and a Low level as active levels at each of which the inverter operates. Therefore, a range is narrow in which the electric potential of the second retaining section can exist as a level at which the inverter stably maintains an identical operation. For example, assume that the electric potential of the second retaining section is at the Low level. While the inverter is being operated so that a p-channel transistor turns on and an n-channel transistor turns off, it is feared that a slight increase in gate electric potential of the p-channel transistor may cause the n-channel transistor to turn on. However, in a case where the n-channel transistor is designed to have a large threshold voltage so as to avoid such a fear and the inverter is desired to operate so that the p-channel transistor turns off and the n-channel transistor turns on, a range becomes narrow in which the High level functions as the active level. In contrast, according to the invention, the active level of the first control section is one of the first electric potential level and the second electric potential level. Therefore, in a case where a broad range is secured in which the control information for the first control section exists as the non-active level, it is less feared that the non-active level may change to the active level. In contrast, in a case where the active level functions at an early stage of the active state of the first operation of the first control section, an object of the active level to be supplied from the voltage supply section to the first retaining section is easily attained. Therefore, even in a case where the active level finally changes to the non-active level, the change is less likely to cause an operation error in the first control section. Accordingly, even if the electric potential of the retaining node of the second retaining section changes, it is possible to carry out designing with such a large margin as to prevent the operation error in the first control section. For example, assume that the control information for the first control section is supplied to a gate of a transistor. Such designing corresponds to designing such that an increase in threshold voltage of the transistor causes a gate-source voltage to be less likely to exceed the threshold voltage of the transistor even if the electric potential of the second retaining section which electric potential should be at the non-active level changes.

Further, in a case where the electric potential of the retaining node of the second retaining section changes but the first control section carries out the second operation, no operation error occurs.

Accordingly, it is possible to yield an effect of providing a memory device such that, even if an off-leakage current occurs in a transfer element used in a transfer section which transfers binary logic data between two retaining sections, a circuit which carries out a refresh operation in accordance with a binary logic level retained in one of the two retaining sections can suitably carry out its original operation with no increase in consumption current and no operation error.

In addition to the above arrangement, the memory device of the present invention includes a third retaining section connected between the input of the first control section and the second signal line.

This allows the node PIX to be maintained at a High electric potential as illustrated in FIG. 20. Consequently, an operation error in the memory device can be prevented.

In order to attain the above object, a memory device of the present invention which carries out a refresh operation in a data retention period following writing of a data signal electric potential, includes:

first through fourth transistors;
a first signal line for turning the first transistor on/off;
a second signal line for turning the second transistor on/off;
a third signal line for turning the fourth transistor on/off;
a fourth signal line for supplying the data signal electric potential; and
a fifth signal line for forming a capacitor in which the data signal electric potential is retained,
the first transistor having (i) a control terminal which is connected to the first signal line and (ii) a first conduction terminal which is connected to the fourth signal line,
the second transistor having (i) a control terminal which is connected to the second signal line and (ii) a first conduction terminal which is connected to a second conduction terminal of the first transistor at a first connection point, the third transistor having (i) a control terminal which is connected to a second conduction terminal of the second transistor at a second connection point and (ii) a first conduction terminal which is connected to the second signal line, the fourth transistor having (i) a control terminal which is connected to the third signal line, (ii) a first conduction terminal which is connected to a second conduction terminal of the third transistor, and (iii) a second conduction terminal which is connected to the first connection point, a first capacitor being formed between the first connection point and the fifth signal line, a second capacitor being formed between the second connection point and the fifth signal line, and a third capacitor being formed between the first conduction terminal of the third transistor and the second connection point.

According to the arrangement, in the data retention period, a constant electric potential which turns the third transistor on is supplied to the fourth signal line, and the refresh operation is properly carried out by making the third signal line active after making the first signal line active once while the second signal line is being kept non-active. This eliminates the need for an inverter (FIG. 24) for carrying out a refresh operation, thereby greatly reducing power consumption as compared with a conventional art.

According to the arrangement, a third capacitor is formed between the first conduction terminal of the third transistor and the second connection point. This can stabilize electric potentials of the first connection point and the second connection point, thereby making it possible to properly carry out a refresh operation of a memory device. This is described later in detail (see FIG. 13).

The memory device may be arranged such that in a writing period in which the data signal electric potential is written, the second signal line is kept active, and the first signal line is selected while supplying the data signal electric potential to the fourth signal line.

The memory device may be arranged such that, in the data retention period, a constant electric potential which turns the third transistor on is supplied to the fourth signal line.

The memory device may be arranged such that, in the data retention period, the refresh operation is carried out by making the third signal line active after making the first signal line active once while the second signal line is being kept non-active.

The memory device may be arranged such that an electric potential of the second connection point is reduced by an electric potential change caused by the third capacitor when the second signal line is changed from an active state to a non-active state.

In order to attain the above object, a memory device of the present invention which carries out a refresh operation in a data retention period following writing of a data signal electric potential, includes:
first through fourth transistors;
a first signal line for turning the first transistor on/off;
a second signal line for turning the second transistor on/off;
a third signal line for turning the fourth transistor on/off;
a fourth signal line for supplying the data signal electric potential;
a fifth signal line for forming a capacitor in which the data signal electric potential is retained; and
a sixth signal line,
the first transistor having (i) a control terminal which is connected to the first signal line and (ii) a first conduction terminal which is connected to the fourth signal line,
the second transistor having (i) a control terminal which is connected to the second signal line and (ii) a first conduction terminal which is connected to a second conduction terminal of the first transistor at a first connection point, the third transistor having (i) a control terminal which is connected to a second conduction terminal of the second transistor at a second connection point and (ii) a first conduction terminal which is connected to the second signal line, the fourth transistor having (i) a control terminal which is connected to the third signal line, (ii) a first conduction terminal which is connected to a second conduction terminal of the third transistor, and (iii) a second conduction terminal which is connected to the first connection point, a first capacitor being formed between the first connection point and the fifth signal line, a second capacitor being formed between the second connection point and the fifth signal line, and a third capacitor being formed between the second connection point and the sixth signal line.

According to the arrangement, in the data retention period, a constant electric potential which turns the third transistor on is supplied to the fourth signal line, and the refresh operation is properly carried out by making the third signal line active after making the first signal line active once while the second signal line is being kept non-active. This eliminates the need for an inverter (FIG. 24) for carrying out a refresh operation, thereby greatly reducing power consumption as compared with a conventional art.

According to the arrangement, a third capacitor is formed between the second connection point and the sixth signal line. This can stabilize electric potentials of the first connection point and the second connection point, thereby making it possible to properly carry out a refresh operation of a memory device. This is described later in detail (see FIG. 20).

The memory device may be arranged such that in a writing period in which the data signal electric potential is written, the second signal line is kept active, and the first signal line is selected while supplying the data signal electric potential to the fourth signal line, and in the data retention period, a constant electric potential which turns the third transistor on is supplied to the fourth signal line, the refresh operation is carried out by making the third signal line active after making the first signal line active once while the second signal line is being kept non-active, and the sixth signal line is changed from an active state to a non-active state after the second signal line is made non-active and before the third signal line is made active.

In order to attain the above object, a liquid crystal display device of the present invention includes:
any of the memory devices;
a pixel electrode; and
a counter electrode,
the pixel electrode being connected to the first connection point,
the first signal line functioning also as a scanning signal line, and
the fourth signal line functioning also as a data signal line.

In order to attain the above object, a liquid crystal display device of the present invention is a memory-type liquid crystal display device which carries out a refresh operation in a data retention period following writing of a data signal electric potential, including:
data signal lines;
scanning signal lines;
retention capacitor wires;
data transfer lines;
refresh lines;
pixel electrodes;
a counter electrode;
first transistors;

second transistors;
third transistors;
fourth transistors;
first capacitors;
second capacitors; and
third capacitors,
wherein each pixel electrode is associated with the first transistors, the second transistors, the third transistors, the fourth transistors, the first capacitors, the second capacitors, and the third capacitors in such a manner that (i) a first transistor associated with the pixel electrode has a control terminal which is connected to a scanning signal line associated with the pixel electrode, (ii) a second transistor associated with the pixel electrode has a control terminal which is connected to a data transfer line associated with the pixel electrode, (iii) a third transistor associated with the pixel electrode has a control terminal which is connected to the pixel electrode via the second transistor, (iv) a fourth transistor associated with the pixel electrode has a control terminal which is connected to a refresh line associated with the pixel electrode, (v) a first capacitor associated with the pixel electrode is connected to the pixel electrode, (vi) a second capacitor associated with the pixel electrode is connected to the pixel electrode via the second transistor, (vii) a third capacitor associated with the pixel electrode is formed between (a) a conduction terminal of the third transistor which conduction terminal is connected to the data transfer line and (b) the control terminal of the third transistor, and (viii) the pixel electrode is connected to a data signal line associated with the pixel electrode via the first transistor and is connected to the data transfer line via the fourth transistor and the third transistor.

The liquid crystal display device may be arranged such that in a writing period in which the data signal electric potential is written, the data transfer lines are kept active, and the scanning signal lines are sequentially selected while supplying the data signal electric potential to the data signal lines.

The liquid crystal display device may be arranged such that, in the data retention period, a constant electric potential which turns the third transistors on is supplied to the data signal lines.

The liquid crystal display device may be arranged such that, in the data retention period, the refresh operation is carried out by concurrently making the refresh lines active after concurrently making the scanning signal lines active once while the data transfer lines are being kept non-active.

The liquid crystal display device may be arranged such that electric potentials of connection points between (i) conduction terminals of the second transistors and (ii) control terminals of the third transistors are reduced by an electric potential change caused by the third capacitors when the data transfer lines are changed from an active state to a non-active state.

The liquid crystal display device may be arranged such that an electric potential of the counter electrode is switched between binary levels every time the refresh operation is carried out.

The liquid crystal display device may be arranged such that both of the binary levels are larger than a minimum value of the data signal electric potential and smaller than a maximum value of the data signal electric potential.

The liquid crystal display device may be arranged to further include:
first capacitive electrodes connected to the respective pixel electrodes;
second capacitive electrodes connected to the respective pixel electrodes;
third capacitive electrodes connected to the respective pixel electrodes; and
retention capacitor wire extensions connected to the respective retention capacitor wires,
the first capacitive electrodes overlapping the respective retention capacitor wires via an insulating film so that the first capacitors are formed,
the second capacitive electrodes overlapping the respective retention capacitor wire extensions via the insulating film so that the second capacitors are formed, and
the third capacitive electrodes overlapping the respective data transfer lines via the insulating film so that the third capacitors are formed.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is suitably applicable to a display of a mobile phone, and the like.

REFERENCE SIGNS LIST

1: Memory device
2: Memory array
6: Word line control circuit (row driver)
7: Writing/reading circuit (column driver)
8: Memory cell
9: Liquid crystal display device (display device)
10: Pixel electrode
40: Pixel (memory cell)
37a: Capacitive electrode (first capacitive electrode)
37b: Capacitive electrode (second capacitive electrode)
37c: Capacitive electrode (third capacitive electrode)
10bb: CS extension (retention capacitor wire extension)
SC1: Switch control line (first signal line)
DT1, DT(i): Data transfer control line (data transfer line, second signal line)
RC1, RC(i): Refresh output control line (refresh line, third signal line)
IN1: Data input line (fourth signal line)
RL1: Reference electric potential wire (fifth signal line)
Xi(1) ($1 \leq i \leq n$): First word line (first signal line)
Xi(2) ($1 \leq i \leq n$): Second word line (second signal line)
Xi(3) ($1 \leq i \leq n$): Third word line (third signal line)
Xi(4) ($1 \leq i \leq n$): Sixth word line (sixth signal line)
Yj ($1 \leq j \leq m$): Bit line (fourth signal line)
SW1: Switch circuit
DS1: First data retaining section
DS2: Second data retaining section
TS1: Data transfer section
RS1: Refresh output control section
VS1: Voltage supply
N1-N4: Transistor (N-channel field-effect transistor)
P1: Transistor (P-channel field-effect transistor, fifth transistor)
N1: Transistor (first transistor)
N2: Transistor (second transistor)
N3: Transistor (third transistor)
N4: Transistor (fourth transistor)
Ca1: Capacitor (first capacitor)
Cb1: Capacitor (second capacitor)
Cap1: Capacitor (third capacitor)

PIX: Node (first connection point)
MRY: Node (second connection point)
GL(i) (1≤i≤n): Gate line (scanning signal line)
SL(j) (1≤j≤m): Source line (data signal line)
CSL(j) (1≤j≤m): CS line (auxiliary capacitor wire)
MR1, MR2: Memory circuit
MR9, MR10: Pixel circuit

The invention claimed is:

1. A memory-type liquid crystal display device which carries out a refresh operation in a data retention period following writing of a data signal electric potential, comprising:
    data signal lines;
    scanning signal lines;
    retention capacitor wires;
    data transfer lines;
    refresh lines;
    pixel electrodes;
    a counter electrode;
    first transistors;
    second transistors;
    third transistors;
    fourth transistors;
    first capacitors;
    second capacitors; and
    third capacitors,
    wherein each pixel electrode is associated with the first transistors, the second transistors, the third transistors, the fourth transistors, the first capacitors, the second capacitors, and the third capacitors in such a manner that (i) a first transistor associated with the pixel electrode has a control terminal which is connected to a scanning signal line associated with the pixel electrode, (ii) a second transistor associated with the pixel electrode has a control terminal which is connected to a data transfer line associated with the pixel electrode, (iii) a third transistor associated with the pixel electrode has a control terminal which is connected to the pixel electrode via the second transistor, (iv) a fourth transistor associated with the pixel electrode has a control terminal which is connected to a refresh line associated with the pixel electrode, (v) a first capacitor associated with the pixel electrode is connected to the pixel electrode, (vi) a second capacitor associated with the pixel electrode is connected to the pixel electrode via the second transistor, (vii) a third capacitor associated with the pixel electrode is formed between (a) a conduction terminal of the third transistor which conduction terminal is connected to the data transfer line and (b) the control terminal of the third transistor, and (viii) the pixel electrode is connected to a data signal line associated with the pixel electrode via the first transistor and is connected to the data transfer line via the fourth transistor and the third transistor,
    wherein in a writing period in which the data signal electric potential is written, the data transfer lines are kept active,
    wherein the scanning signal lines are sequentially selected while supplying the data signal electric potential to the data signal lines, and
    in the data retention period, a constant electric potential which turns the third transistors on is supplied to the data signal lines.

2. The liquid crystal display device according to claim 1, wherein, in the data retention period, the refresh operation is carried out by concurrently making the refresh lines active after concurrently making the scanning signal lines active once while the data transfer lines are being kept non-active.

3. The liquid crystal display device according to claim 2, wherein electric potentials of connection points between (i) conduction terminals of the second transistors and (ii) control terminals of the third transistors are reduced by an electric potential change caused by the third capacitors when the data transfer lines are changed from an active state to a non-active state.

4. The liquid crystal display device according to claim 3, wherein an electric potential of the counter electrode is switched between binary levels every time the refresh operation is carried out.

5. The liquid crystal display device according to claim 4, wherein both of the binary levels are larger than a minimum value of the data signal electric potential and smaller than a maximum value of the data signal electric potential.

6. A memory-type liquid crystal display device which carries out a refresh operation in a data retention period following writing of a data signal electric potential, comprising:
    data signal lines;
    scanning signal lines;
    retention capacitor wires;
    data transfer lines;
    refresh lines;
    pixel electrodes;
    a counter electrode;
    first transistors;
    second transistors;
    third transistors;
    fourth transistors;
    first capacitors;
    second capacitors; and
    third capacitors,
    wherein each pixel electrode is associated with the first transistors, the second transistors, the third transistors, the fourth transistors, the first capacitors, the second capacitors, and the third capacitors in such a manner that (i) a first transistor associated with the pixel electrode has a control terminal which is connected to a scanning signal line associated with the pixel electrode, (ii) a second transistor associated with the pixel electrode has a control terminal which is connected to a data transfer line associated with the pixel electrode, (iii) a third transistor associated with the pixel electrode has a control terminal which is connected to the pixel electrode via the second transistor, (iv) a fourth transistor associated with the pixel electrode has a control terminal which is connected to a refresh line associated with the pixel electrode, (v) a first capacitor associated with the pixel electrode is connected to the pixel electrode, (vi) a second capacitor associated with the pixel electrode is connected to the pixel electrode via second transistor, (vii) a third capacitor associated with the pixel electrode is formed between (a) a conduction terminal of the third transistor which conduction terminal is connected to the data transfer line and (b) the control terminal of the third transistor, and the pixel electrode is connected to a data signal line associated with the pixel electrode via the first transistor and is connected to the data transfer line via the fourth transistor and the third transistor, and
    wherein the liquid crystal display device further includes,
        first capacitive electrodes connected to the respective pixel electrodes;
        second capacitive electrodes connected to the respective pixel electrodes;
        third capacitive electrodes connected to the respective pixel electrodes; and
        retention capacitor wire extensions connected to the respective retention capacitor wires, the first capacitive electrodes overlapping the respective retention capacitor wires via an insulating film so that the first capacitors are formed, the second capacitive electrodes overlapping the respective retention capacitor wire extensions via the insulating film so that the second capacitors are formed, and the third capacitive electrodes overlapping the respective data transfer lines via the insulating film so that the third capacitors are formed.

\* \* \* \* \*